(12) United States Patent
Fukuda et al.

(10) Patent No.: US 7,402,449 B2
(45) Date of Patent: Jul. 22, 2008

(54) INTEGRATED MICRO ELECTRO-MECHANICAL SYSTEM AND MANUFACTURING METHOD THEREOF

(75) Inventors: Hiroshi Fukuda, Tokyo (JP); Tsukasa Fujimori, Kokubunji (JP); Natsuki Yokoyama, Mitaka (JP); Yuko Hanaoka, Kodaira (JP); Takafumi Matsumura, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/208,740

(22) Filed: Aug. 23, 2005

(65) Prior Publication Data

US 2006/0205106 A1    Sep. 14, 2006

(30) Foreign Application Priority Data

Feb. 25, 2005   (JP)   ............................. 2005-050541
Aug. 4, 2005    (JP)   ............................. 2005-226233

(51) Int. Cl.
*H01L 21/00*    (2006.01)
(52) U.S. Cl. ............................. 438/53; 438/51; 438/52; 438/50; 257/415; 257/416
(58) Field of Classification Search ................ 438/50, 438/51, 52, 53, 618, 619, 622; 257/415, 257/416, 599, 600
See application file for complete search history.

(56) References Cited

U.S. PATENT DOCUMENTS 5,596,219 A  *  1/1997  Hierold ...................... 257/467

| | | |
|---|---|---|
| 5,611,940 A | 3/1997 | Zettler |
| 5,834,332 A | 11/1998 | Hierold et al. |
| 6,531,331 B1 | 3/2003 | Bennett et al. |
| 6,621,134 B1 | 9/2003 | Zurn |

(Continued)

FOREIGN PATENT DOCUMENTS

WO   WO 2004/075221 A2   2/2004
WO   WO 2005/061376 A1   12/2004

OTHER PUBLICATIONS

Masayoshi Esashi, "New Trend in Silicon MEMS", J. Applied Physics, vol. 73 (9) 2004, pp. 1158-1165 in Japanese, with English Abstract (1 page).

(Continued)

*Primary Examiner*—David Vu
*Assistant Examiner*—Thinh T Nguyen
(74) *Attorney, Agent, or Firm*—Reed Smith LLP; Stanley P. Fisher, Esq.; Juan Carlos A. Marquez, Esq.

(57) ABSTRACT

In the manufacturing technology of an integrated MEMS in which a semiconductor integrated circuit (CMOS or the like) and a micro machine are monolithically integrated on a semiconductor substrate, a technology capable of manufacturing the integrated MEMS without using a special process different from the normal manufacturing technology of a semiconductor integrated circuit is provided. A MEMS structure is formed together with an integrated circuit by using the CMOS integrated circuit process. For example, when forming an acceleration sensor, a structure composed of a movable mass, an elastic beam and a fixed beam is formed by using the CMOS interconnect technology. Thereafter, an interlayer dielectric and the like are etched by using the CMOS process to form a cavity. Then, fine holes used in the etching are sealed with a dielectric.

10 Claims, 60 Drawing Sheets

U.S. PATENT DOCUMENTS 6,635,506 B2 * 10/2003 Volant et al. .................. 438/52
6,667,245 B2 12/2003 Chow et al.
2004/0145056 A1 7/2004 Gabriel et al.

OTHER PUBLICATIONS

Masayoshi Esashi, "New Trend in Silicon MEMS", J. Applied Physics, vol. 73 (19) 2004, pp. 1158-1165 in Japanese.

Fujimori, T. et al., "Fully CMOS Compatible on-LSI Capacitive Pressure Sensor Fabricated Using Standard Back-End-Of-Line Processes", Transducers '05, The 13th International Conference on Solid-State Sensors, Actuators and Microsystems, Seoul, Korea, Jun. 5-9, 2005, pp. 37-40.

Extended European Search Report for 05255278.3-2003 dated Jan. 25, 2008.

* cited by examiner

ACTUATION AXIS (x)
DETECTION AXIS (y)

ACTUATION AXIS (x)
DETECTION AXIS (z)
ROTATION AXIS (y)

INTEGRATED MICRO ELECTRO-MECHANICAL SYSTEM AND MANUFACTURING METHOD THEREOF

CROSS-REFERENCE TO RELATED APPLICATION

The present application claims priority from Japanese Patent Application JP 2005-050541 filed on Feb. 25, 2005 and Japanese Patent Application JP 2005-226233 filed on Aug. 4, 2005, the contents of which are hereby incorporated by reference into this application.

TECHNICAL FIELD OF THE INVENTION

The present invention relates to micro electro-mechanical systems (MEMS) and a manufacturing method thereof. More particularly, the present invention relates to a technology effectively applied to an integrated micro electro-mechanical system in which a semiconductor integrated circuit and the MEMS are integrated.

BACKGROUND OF THE INVENTION

By using the micro-fabrication technology which has realized the improvement in performance and increase in integration density of the semiconductor integrated circuit, the micro electro-mechanical system (hereinafter, referred to as MEMS) technology for forming a mechanical sensor such as a pressure sensor and a acceleration sensor, a miniatured switch, miniature mechanical parts such as a resonator or an oscillator, and a mechanical system has been developed. The MEMS is broadly classified into a bulk MEMS which is formed by processing a silicon substrate itself and a surface MEMS which is formed by repeatedly depositing and patterning thin films on a surface of a silicon substrate. The manufacturing process of the surface MEMS is close to the manufacturing process of semiconductor integrated circuits. The MEMS technologies described above are discussed in pp. 1158 to 1165 of volume 73 (issue 9) of "Applied Physics" (Japan Society of Applied Physics (JSAP), September, 2004).

The U.S. Pat. No. 6,635,506 discloses the technology for precisely forming a shape of a cavity by using a sacrificial layer when forming the cavity used for the MEMS.

The U.S. Pat. No. 6,667,245 discloses an example in which a switch is formed as the MEMS. Also, it mentions that it is possible to form the switch at low cost by using the standard technology for forming a multilayer interconnect of an integrated circuit to form the switch.

The US Patent Application Publication No. 2004/0145056 describes that the MEMS is formed by using a metal layer and a sacrificial layer formed by the standard manufacturing technology of CMOSFET (Complementary Metal Oxide Semiconductor Field Effect Transistor, referred to as CMOS, hereinafter).

The U.S. Pat. No. 5,596,219 discloses the technology for monolithically forming an integrated circuit and a sensor (actuator). This sensor is formed on a sensor layer made of polysilicon by using the surface micro-machine technology.

SUMMARY OF THE INVENTION

For example, in the application of MEMS to a sensor, the mechanical deformation of a structure due to the external force or the like is converted into the electrical signal as the piezoresistance change and the capacitance change and then outputted. Further, in general, the above-mentioned output is signal-processed by a semiconductor integrated circuit (LSI: Large Scale Integration, LSI includes CMOS.). Also, in the application of MEMS to an oscillator, the input and output of the oscillators are connected to the RF-IC (Radio-Frequency integrated circuits). As described above, the MEMS is used in combination with the LSI in many cases. In addition, since the operation of the MEMS is not limited to the mechanical operation, the conversion of the different physical values (electrical signal and mechanical deformation in many cases) is required in most of the applications thereof. This conversion mechanism is called a transducer.

As described above, when the MEMS is used in combination with the signal processing LSI, since each of them is formed on the separate chips, the miniaturization of the entire system is difficult. Since both the MEMS and the LSI are usually formed on a silicon substrate, the direction toward the monolithic integration of them on the same substrate is natural, and it has already been applied in some products.

For example, an acceleration sensor or a vibration gyroscope using a mass composed of a poly-crystalline silicon film with a thickness of about 2 to 4 μm is integrated with an analog circuit such as a capacitance-voltage converter or an operation amplifier circuit. A sensor mechanical part (arranged on a silicon substrate with a gap) and an analog circuit part are arranged in the different (adjacent) regions on the substrate plane. The sensor mechanical part is entirely covered and sealed with a cover.

Also, a digital mirror device, in which movable metal films each having a reflection surface are arranged in a matrix form, and the directions of each film are electro-statically controlled to turn on/off the light, thereby realizing a display device, has been produced. The upper part of the device is sealed with a transparent plate which transmits light.

Furthermore, a technology for forming a RF-MEMS (switch, filter) on a LSI by the so-called copper-damascene interconnect process has been reported. In this technology, both the movable part and the cavity part are formed by the damascene process. In addition, the sealing method after forming the movable part is also described. Further, the method of forming a MEMS mechanical part and a transducer (signal unit) by using the multilayer interconnect of a LSI has been reported.

All of the cases described above belong to the category of the surface MEMS. However, the technology for integrating the bulk MEMS with a LSI has been also reported. In the bulk MEMS, since the silicon wafer itself becomes a movable part, the bonding with other wafer (substrate) is required for the sealing and the packaging.

The first problem to be solved is that the special cavity formation process and the special sealing process are necessary in the conventional MEMS. More specifically, in the manufacture of the MEMS, a special technology is required in addition to the normal manufacturing technology of CMOS. In particular, in the case of an oscillator, the vacuum sealing is necessary to obtain the large vibration value Q, and the air tightness is important for maintaining the properties for a long time. This is true of the case of the integrated MEMS in which the LSI is mounted together with a MEMS. Also in the example in which the multilayer interconnect is used to form the mechanical part, except for the cases of special application, it is preferable to seal the entire thereof. In this case, it is necessary to bond the substrate on which the MEMS is formed and another substrate to be a lid. Also, in the example in which the cavity is fabricated through the damascene process, a special process such as the process of embedding a sacrificial layer into an interlayer dielectric is required. As described above, the special technology in addition to the normal CMOS manufacturing technology is required in the conventional MEMS manufacturing process.

The second problem is that a film much thicker than a film used in the standard LSI is necessary in order to form a mass with a sufficient mass required in an acceleration sensor and a gyroscope. This is particularly difficult in the case of the integrated MEMS in which a LSI is mounted together with a MEMS for the following reasons. First, it is difficult to form a thick film with a controlled mechanical stress in the standard LSI process. Even if possible, it is difficult to combine it with the fine CMOS process from the viewpoint of the temperature condition of the thermal treatment. Also, in the case where the SOI (Silicon on Insulator) is used, a special process such as the deep trench etching is necessary, and thus, the process is complicated and the cost is increased.

The third problem is that the manufacturing process of the integrated MEMS in which a LSI is mounted together with a MEMS is complicated, and the chip area is increased.

An object of the present invention is to provide a technology capable of manufacturing an integrated MEMS without using a special process different from the normal manufacturing technology of a semiconductor integrated circuit, in the manufacturing technology of an integrated MEMS in which a semiconductor integrated circuit (CMOS and others) and a micro machine are monolithically integrated on a semiconductor substrate.

Also, another object of the present invention is to provide a technology capable of easily manufacturing a mass with a sufficient mass required in an acceleration sensor and a gyroscope at low cost, in the manufacturing technology of an integrated MEMS including an acceleration sensor or a gyroscope.

Also, still another object of the present invention is to provide a technology capable of simplifying a manufacturing process of an integrated MEMS to reduce the manufacturing cost of a product.

Further, still another object of the present invention is to provide a technology capable of miniaturizing an integrated MEMS.

The above and other objects and novel characteristics of the present invention will be apparent from the description of this specification and the accompanying drawings.

The typical ones of the inventions disclosed in this application will be briefly described as follows.

An integrated micro electromechanical system according to the present invention is the integrated micro electro-mechanical system, in which a micro machine formed by using a manufacturing technology of a semiconductor integrated circuit and a semiconductor integrated circuit are formed on a semiconductor substrate, and the micro machine comprises: (a) a sealed cavity formed by removing a part of an interlayer dielectric formed between the interconnects; and (b) a mechanical structure formed in the cavity, wherein the cavity is formed by using a technology for forming an interconnect of a MOSFET and is sealed by using the technology for forming an interconnect of a MOSFET.

Also, a manufacturing method of an integrated micro electromechanical system according to the present invention is the manufacturing method of an integrated micro electromechanical system, in which a micro machine formed by using a manufacturing technology of a semiconductor integrated circuit and a semiconductor integrated circuit are formed on a semiconductor substrate, and the method comprises the steps of: (a) forming a mechanical structure which is a part of the micro machine; (b) forming a layer covering the mechanical structure; (c) forming a cavity in which the mechanical structure is placed; and (d) sealing the cavity, wherein the step (a), the step (b), the step (c) and the step (d) are performed by using a technology for forming an interconnect of a MOSFET.

The first primary characteristic of the present invention is that a cavity for placing a mechanical structure of a MEMS (micro machine) is formed by using a standard CMOS manufacturing process or a standard interconnect process which is a part of the CMOS manufacturing process (without using a special sealing process). More specifically, first, a movable part also functioning as an electrode which is a part of the mechanical structure of a MEMS is formed in an interlayer dielectric by using the CMOS process (multilayer interconnect process). Then, after forming a (metal) thin film layer with micro holes therein, the interlayer dielectric around the movable part also functioning as an electrode is etched and removed through the micro holes, and then, the micro holes are finally sealed.

At this time, the structure of the micro machine is placed in the cavity formed by removing a part of the interlayer dielectric formed in the multilayer interconnects below the thin film layer. As the thin film layer, a material with the sufficiently low etching rate to the etching of the interlayer dielectric (for example, upper interconnect layer) is used.

After the finish of the etching of the interlayer dielectric, the micro holes for etching formed in the thin film layer are sealed by depositing a thin film (CVD dielectric or the like) having relatively isotropic deposition characteristics on the thin film layer. The thin film formation and the etching to remove the interlayer dielectric are performed within the range of the normal CMOS process. The movable part also functioning as an electrode formed in the cavity is formed so as to contain any one of a metal film, a silicon-germanium film, a silicon nitride film, a silicon oxide film, a single crystal silicon film, a polysilicon film, an amorphous silicon film and a polyimide film.

In addition, the second primary characteristic of the present invention is that, by forming one integral mechanical structure (including a mass and a movable part considered as a mechanically integral structure) using a plurality of LSI layers or interconnect layers, a movable mass with a sufficient mass required in an acceleration sensor and a gyroscope can be formed through the standard interconnect process of the CMOS process. The movable part of the mechanical structure is preferably formed in a cavity and is fixed to an interlayer dielectric surrounding the cavity by a (elastically) deformable LSI material or metal interconnects. The mechanical structure is designed so that the mechanical characteristics thereof are determined based on the dimensions of the structure itself and do not depend on the shape of the cavity. More specifically, the mechanical structure is provided with (1) a fixed part which is fixed to an interlayer dielectric surrounding a cavity and has an enough size substantially considered to be elastically undeformed, (2) a movable part and (3) an elastically deformable part which connects the fixed part and the movable part. By doing so, the dimensional accuracy of the cavity does not influence the mechanical characteristics of the MEMS. Therefore, the high dimensional accuracy of the cavity is not required in comparison to the case where the mechanical characteristics of the structure depend on the shape of the cavity. Usually, the dimensional accuracy of the structure is defined with the accuracy of the interconnect pattern of a LSI. Since this dimensional accuracy is generally much higher than the process accuracy of the bulk MEMS in the conventional technology, the highly accurate mechanical characteristics can be assured.

Since the structure is formed by using the interconnect layers, the structure itself has not only the mechanical function as a mass but also the electrical function as an electrode and an interconnect. The actuation and the sensing are performed by the electrostatic force and capacitance between the electrically independent electrode fixed to an interlayer dielectric and a movable part also functioning as an electrode. By using the movable part of the integral structure as a mass, for example, an acceleration sensor and a vibration gyroscope (angle rate sensor) are realized. The mechanical connection between the movable part and the surrounding interlayer dielectric (fixed part and elastically deformable part, for example, beam) and the electrical connection (interconnect, actuator capacitor and detecting capacitor) can be made through separate layers constituting the LSI. By sandwiching the movable part between the multilayer interconnects to restrict the movable range of the movable part, it becomes possible to improve the reliability.

Also, the present invention is characterized in that a MEMS such as a vibration sensor, an acceleration sensor, a gyroscope, a switch and an oscillator is integrated with a LSI, and the mechanical structure of the MEMS is formed from the same layer as the interconnect layer of a LSI (including pad). Alternatively, it is characterized in that a MEMS is stacked and formed on (an area overlapping with) the interconnect of a LSI.

The effect obtained by the representative one of the inventions disclosed in this application will be briefly described as follows.

Since a LSI (including CMOS) and a MEMS can be monolithically integrated through the standard CMOS process (LSI process), it is possible to achieve the miniaturization and the cost reduction of the integrated MEMS.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof and the like are to be mentioned, the substantially approximate and similar shapes and the like are included therein unless otherwise stated or except the case where it can be conceived that they are apparently excluded in principle. This condition is also applicable to the numerical value and the range described above.

In addition, components having the same function are denoted by the same reference symbols throughout the drawings for describing the embodiments, and the repetitive description thereof is omitted. Note that hatching is used in some cases even in a plan view so as to make the drawings easy to see.

Hereinafter, embodiments of the present invention will be described in detail with reference to the accompanying drawings.

In the embodiments described below, after fabricating transistors of a LSI on a silicon (Si) substrate, simultaneously with forming a multilayer interconnect on the transistors, a MEMS is formed in the interlayer dielectric formed between the multilayer interconnect on the same silicon substrate, and then, a cavity is formed and sealed. Alternatively, after forming a MEMS on a silicon substrate, a LSI is fabricated on the same silicon substrate, and then, a cavity is formed and sealed.

First Embodiment

In the first embodiment, the case where a single axis acceleration (or vibration) sensor is formed as the MEMS will be described.

Figure 1:
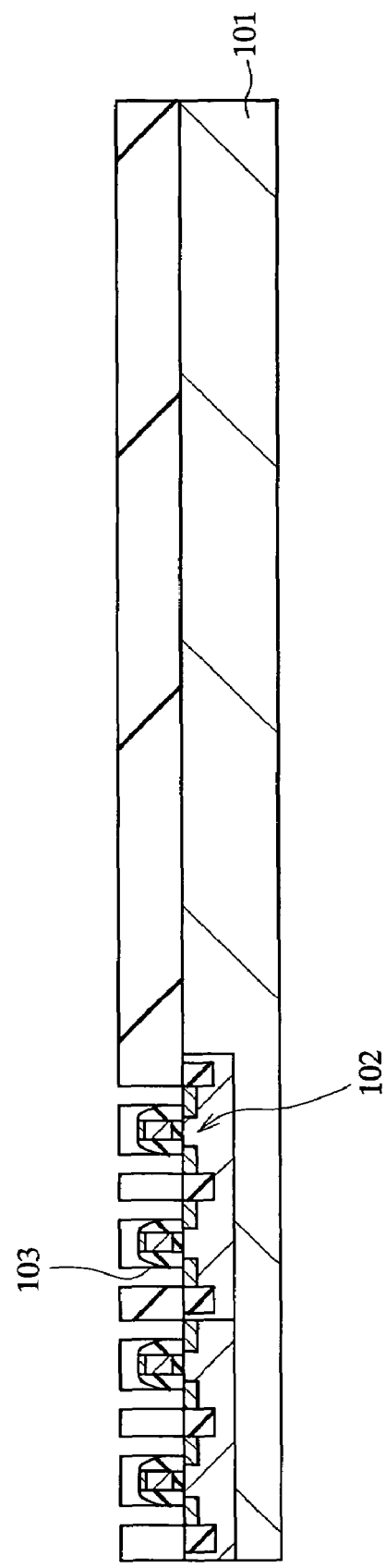
FIG. 1 is a schematic diagram showing the manufacturing process of an acceleration sensor according to the first embodiment of the present invention.
Figure 2:
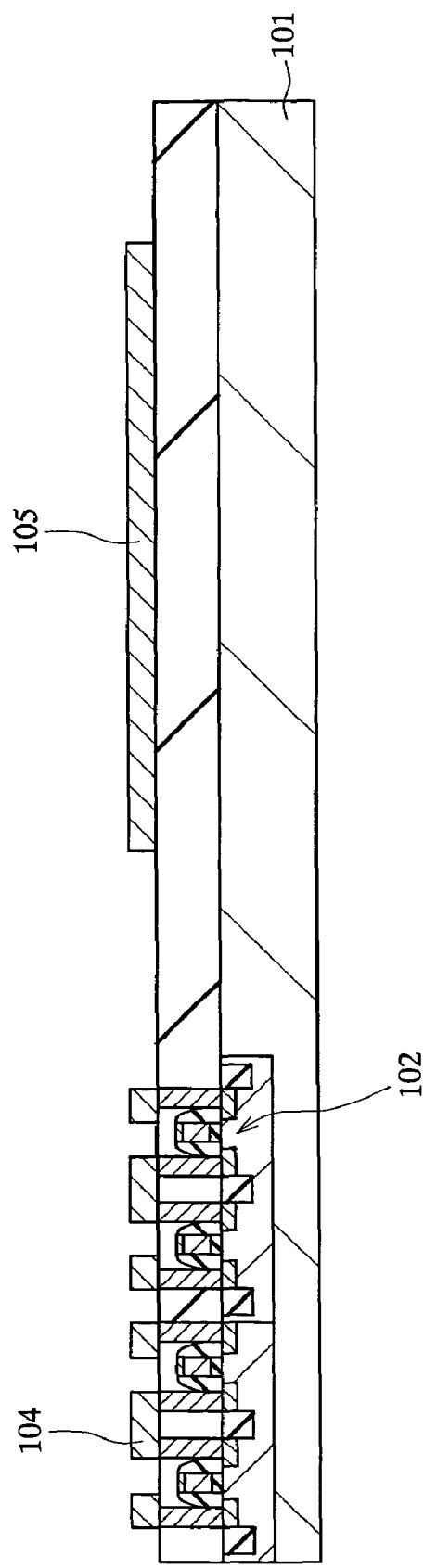
FIG. 2 is a schematic diagram showing the manufacturing process of the acceleration sensor subsequent to FIG. 1.

FIG. 1 to FIG. 8 are schematic diagrams (cross-sectional views) showing the manufacturing process of the integrated MEMS according to the first embodiment. First, in accordance with the normal manufacturing process of a CMOS integrated circuit, transistors 102 for signal processing of the single axis acceleration sensor and contact holes 103 are formed on a silicon substrate (semiconductor substrate) 101 (FIG. 1). Next, by using the manufacturing process of the CMOS integrated circuit, a first layer interconnect (M1 layer) 104 of the signal processing transistors 102 and an etching stopper film 105 used in the etching for forming a cavity (process described later) are formed (FIG. 2).

Figure 3:
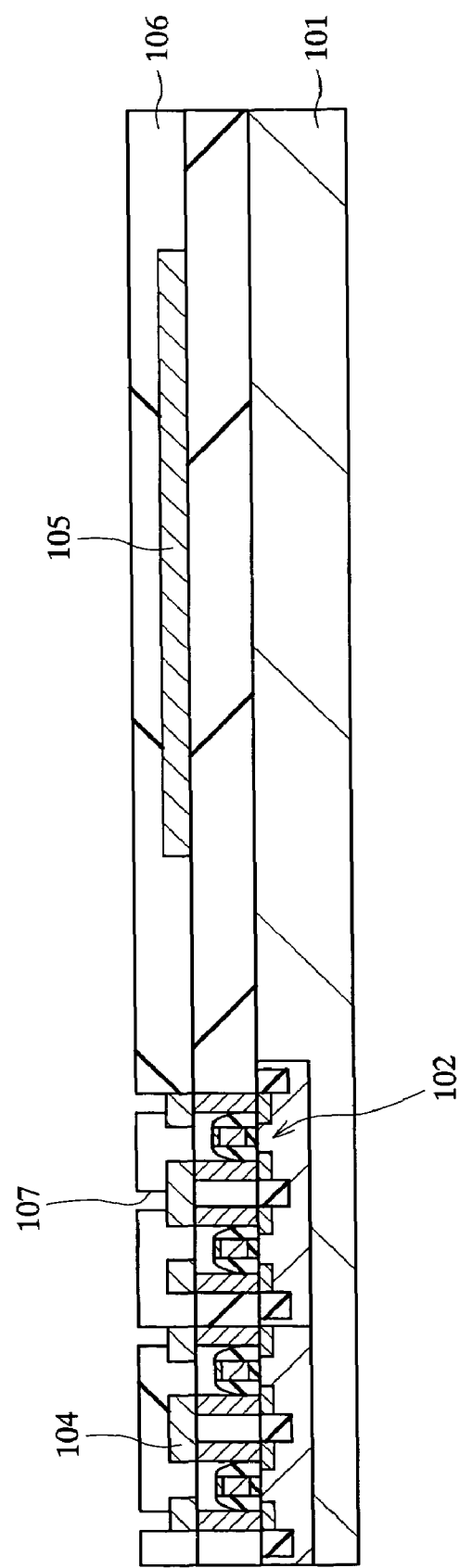
FIG. 3 is a schematic diagram showing the manufacturing process of the acceleration sensor subsequent to FIG. 2.
Figure 4:
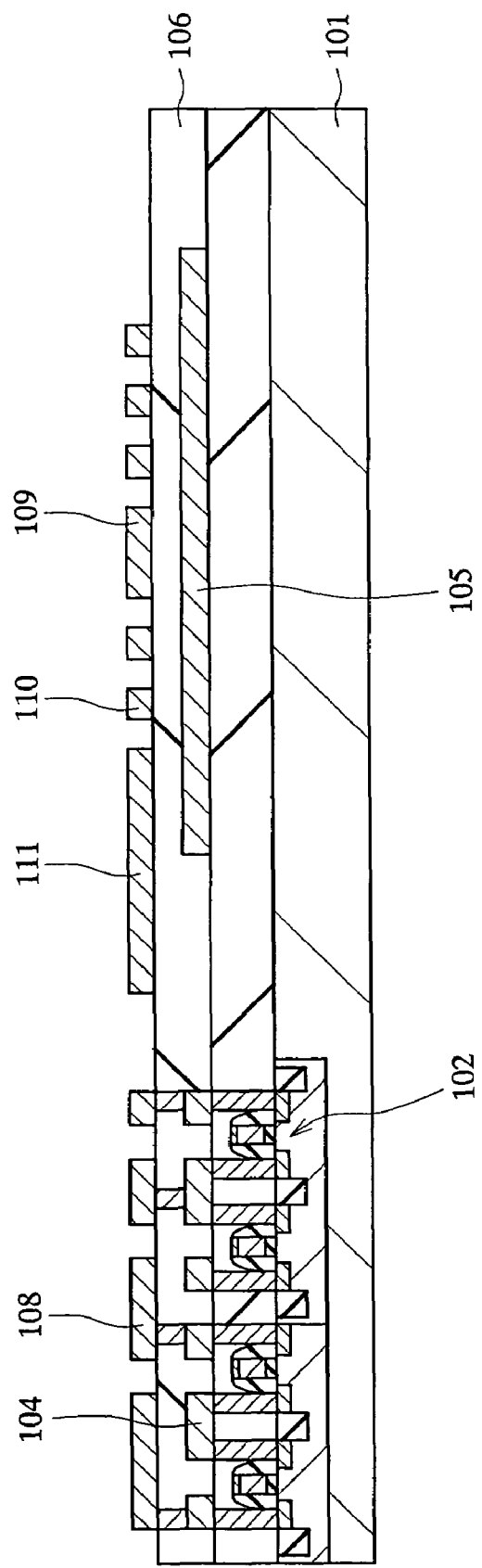
FIG. 4 is a schematic diagram showing the manufacturing process of the acceleration sensor subsequent to FIG. 3.

Next, through the normal process for manufacturing a CMOS integrated circuit, a multilayer interconnect comprised of a second layer interconnect (M2 layer) and a third layer interconnect (M3 layer) (second layer interconnect and third layer interconnect are not shown.) is formed, and the surface thereof is planarized by the normal chemical mechanical polishing (CMP). Next, after forming an interlayer dielectric 106, via holes 107 are formed in the interlayer dielectric 106 (FIG. 3). Then, according to need, a fourth layer interconnect (M4 layer) 108 is formed on the interlayer dielectric 106, and a movable mass (movable part) 109 of the single axis acceleration sensor, an elastic beam also functioning as interconnect (elastically deformable part) 110 and a fixed beam (fixed part) 111 are formed on the interlayer dielectric 106 (FIG. 4). More specifically, the mechanical structure constituting a part of the single axis acceleration sensor (movable mass, elastic beam, fixed beam) is formed. As described above, this structure is formed from the same layer as the interconnect (for example, fourth layer interconnect 108) constituting the semiconductor integrated circuit.

Figure 5:
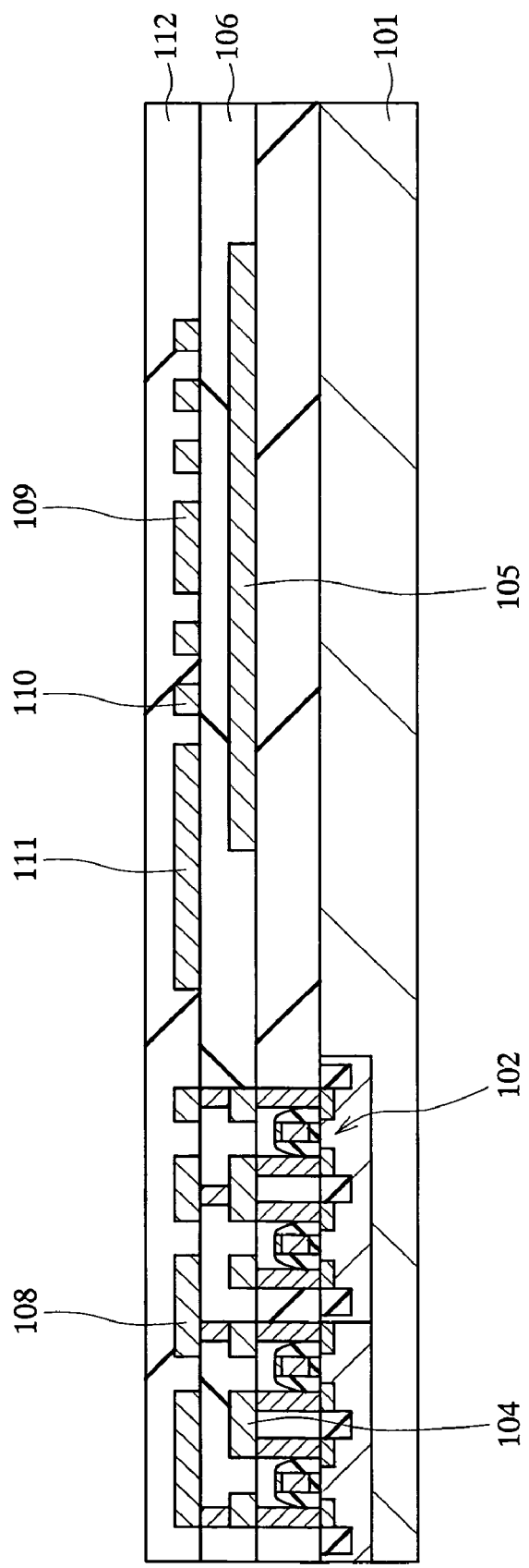
FIG. 5 is a schematic diagram showing the manufacturing process of the acceleration sensor subsequent to FIG. 4.
Figure 6:
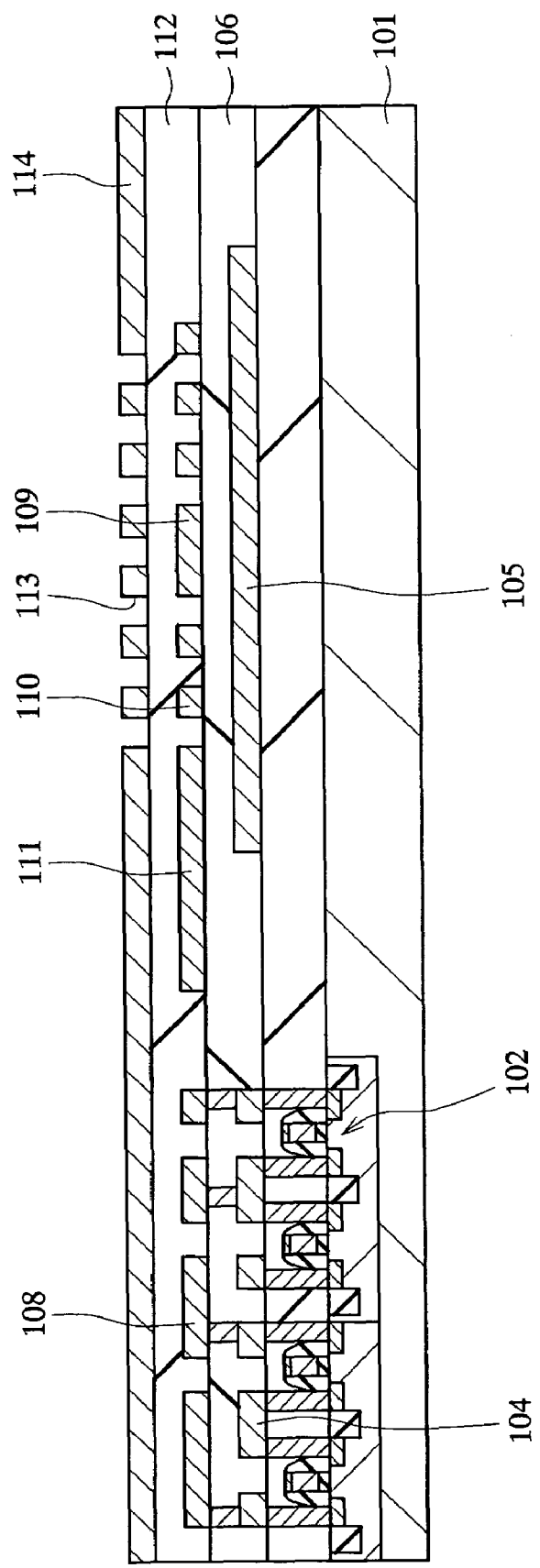
FIG. 6 is a schematic diagram showing the manufacturing process of the acceleration sensor subsequent to FIG. 5.
Figure 7:
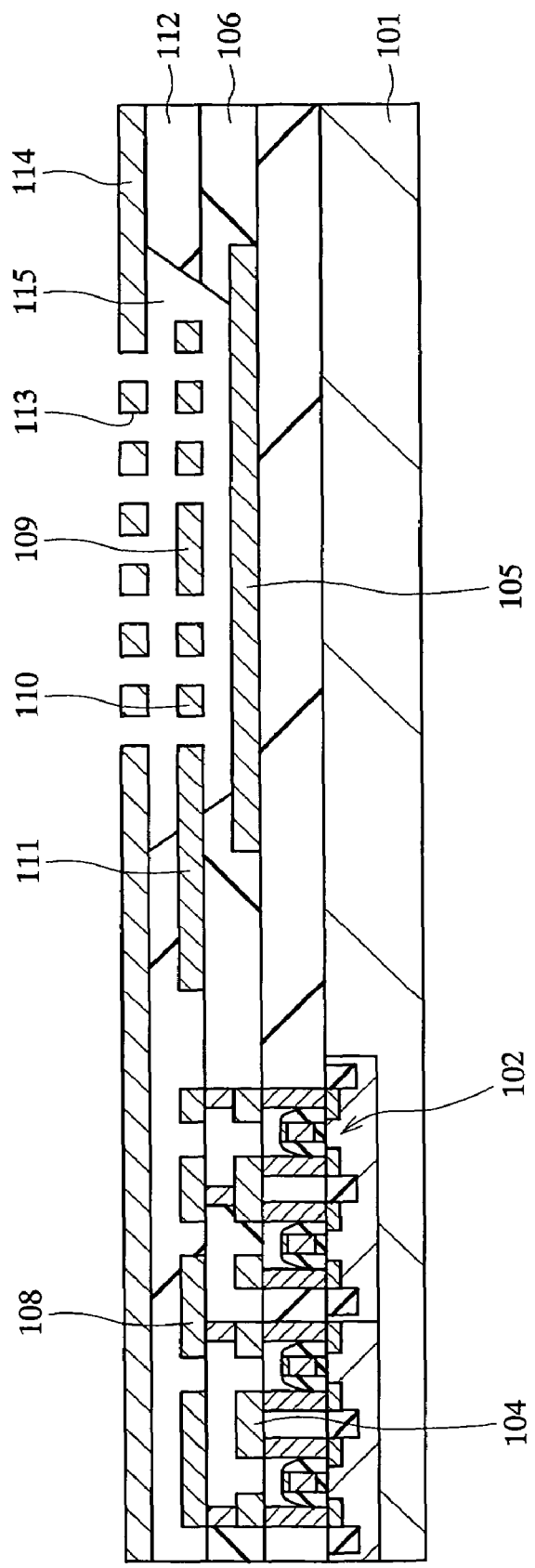
FIG. 7 is a schematic diagram showing the manufacturing process of the acceleration sensor subsequent to FIG. 6.
Figure 8:
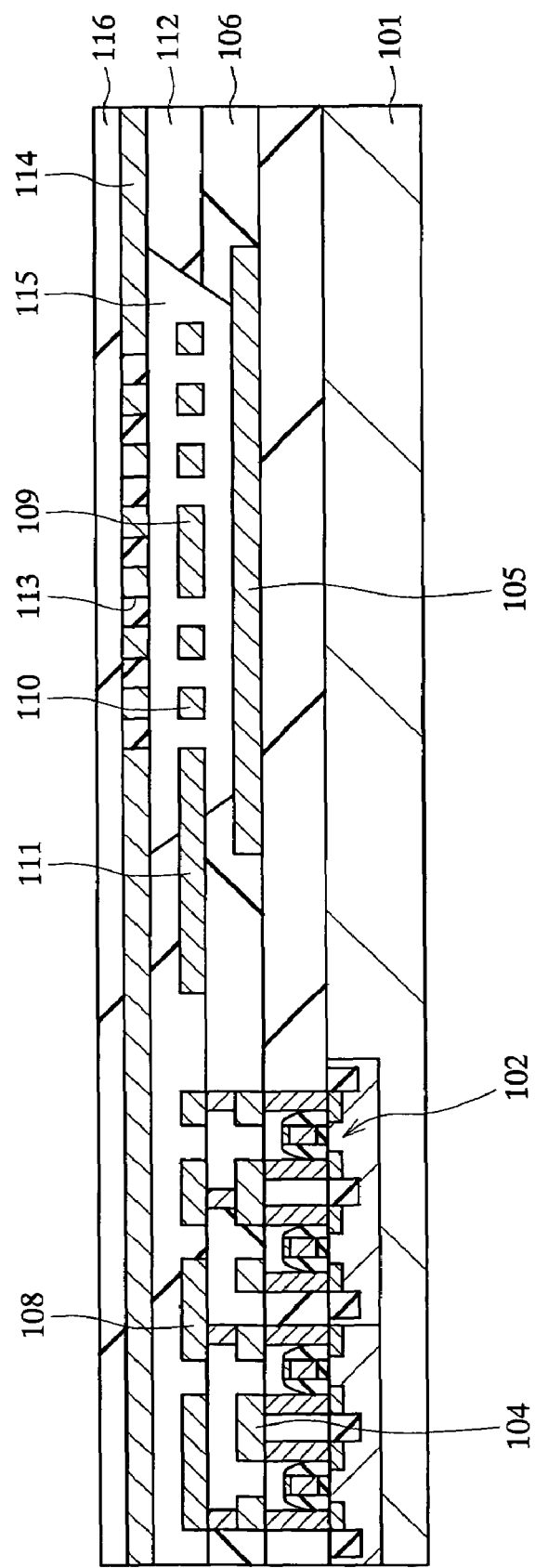
FIG. 8 is a schematic diagram showing the manufacturing process of the acceleration sensor subsequent to FIG. 7.

Further, an interlayer dielectric 112 is formed so as to cover the structure and the interlayer dielectric 112 is planarized according to need by the CMP or the like (FIG. 5). Thereafter, a cavity cover film 114 having fine (tiny) holes 113 for forming a cavity is formed from a fifth layer interconnect (M5 layer) (FIG. 6). Then, the interlayer dielectric 112 and the interlayer dielectric 106 around the movable mass 109 are etched and removed through the fine holes 113 to form a cavity 115 (FIG. 7). At this time, since the etching stopper film 105 is formed, the etching does not reach below the etching stopper 105. Then, the fine holes 113 for forming a cavity are filled up with a dielectric 116 to seal the cavity 115 (FIG. 8).

Note that tungsten (W) is used as a material of the first layer interconnect 104 and the fourth layer interconnect 108, aluminum (Al) is used as a material of the second layer interconnect and the third layer interconnect, and tungsten silicide (WSi) is used as a material of the fifth layer interconnect. The materials are not limited to them, but a stacked film of an aluminum film and a titanium nitride (TiN) film can be used as the first layer interconnect 104 and tungsten can be used as a material of the fifth layer interconnect. The advantage of using the above-described materials for the first layer interconnect 104 and the fifth layer interconnect is that the etching selectivity (in etching rates) between the interlayer dielectric 106 and the interlayer dielectric 112 can be sufficiently ensured in the etching for forming the cavity 115.

Figure 9A:
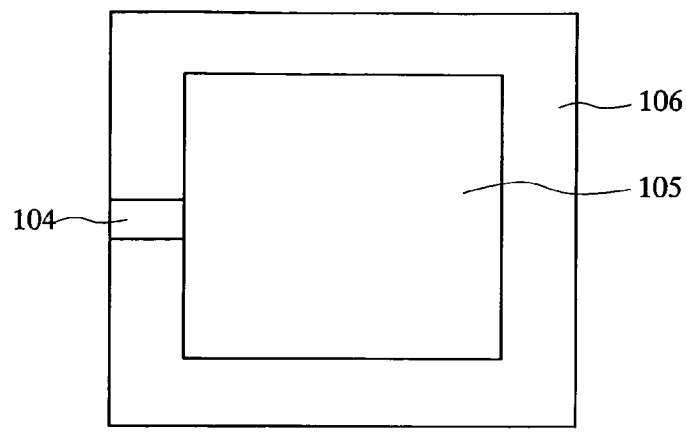
FIG. 9A to FIG. 9C are plan views showing the major layers constituting the acceleration sensor, respectively.
Figure 9B:
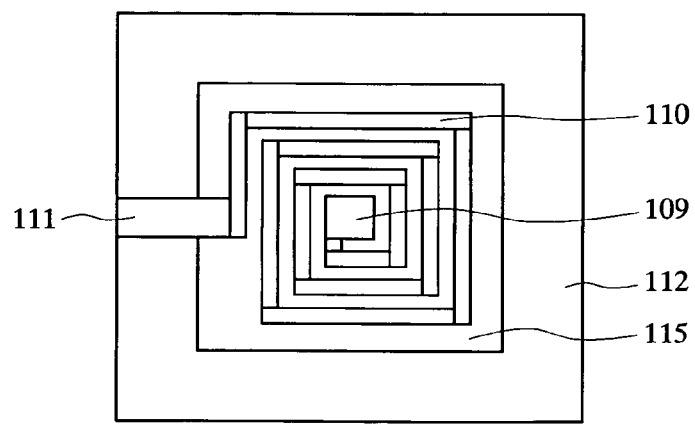
Figure 9C:
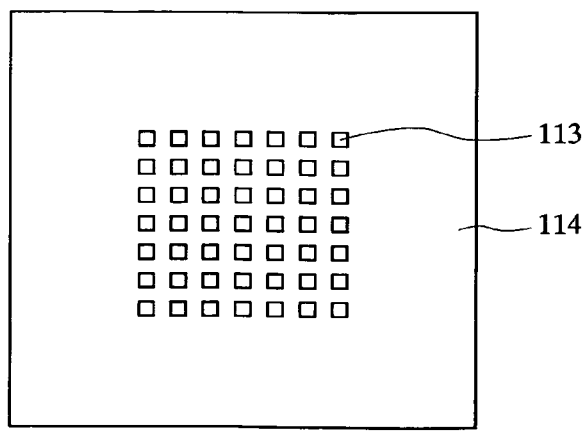

Next, the configuration and operation of the single axis acceleration sensor according to the first embodiment will be described. FIG. 9A to FIG. 9C are schematic diagrams showing the structure pattern in each of the layers constituting the completed single axis acceleration sensor. The plan views of the M1 layer, the M4 layer and the M5 layer are shown in FIGS. 9A, 9B and 9C, respectively. In FIG. 9A, the etching stopper film 105 of the M1 layer functions as a capacitor lower electrode and is connected by the first layer interconnect 104 to an integrated circuit including the signal processing transistors 102 integrated on the same substrate. In FIG. 9B, the movable mass 109 formed in the M4 layer is connected to the fixed beam 111 via the elastic beam 110 formed in a spiral shape. The movable mass 109 functions as a capacitor upper electrode and is electrically connected to the integrated circuit including the signal processing transistors 102 by the elastic beam 110, the fixed beam 111 and the fourth layer interconnect 108. The movable mass 109 formed in the cavity 115 is mechanically fixed to the interlayer dielectric 112 via the elastic beam 110 and the fixed beam 111. In this configuration, the movable mass 109 is moved in the direction vertical to the paper of the drawing by the acceleration in the direction vertical to the paper of the drawing. Therefore, the distance between the capacitor upper electrode composed of the movable mass 109 and the capacitor lower electrode composed of the etching stopper film 105 is changed and the interelectrode capacitance is changed. By detecting this change in capacitance by the integrated circuit including the signal processing transistors 102 (capacitance detecting circuit), the acceleration can be detected as the change in capacitance. More specifically, the single axis acceleration sensor according to the first embodiment can detect the acceleration acting in the direction vertical to the silicon substrate 101 (chip).

As shown in FIG. 9C, the cavity cover film 114 is formed in the M5 layer, and the cavity cover layer 114 has the fine holes 113 used to form the cavity 115. The cavity 115 is formed by the etching through the fine holes 113. After forming the cavity 115, the fine holes 113 are filled up.

As shown in FIG. 9B, the shape of the fixed beam 111 is designed so that a base part thereof is sufficiently thick to prevent the elastic deformation even when the acceleration is applied to the movable mass 109. On the other hand, the elastic beam 110 positioned at the center of the beam is designed so as to have the smaller width in comparison to that of the fixed beam 111 and a sufficient length because of its spiral shape, and the desired elastic deformation occurs when a predetermined acceleration is applied. Therefore, the mechanical characteristics of the single axis acceleration sensor are determined only by the pattern shape and the thickness of the fixed beam 111, the elastic beam 110 and the movable mass 109 in the M4 layer, and do not depend on the dimensions and the shape of the cavity 115. Since the dimensional accuracy of the fixed beam 111, the elastic beam 110 and the movable mass 109 is determined by the dimensional accuracy of the M4 layer (dimensional accuracy for forming the interconnect), it is very accurate. Meanwhile, since the dimensions and the shape of the cavity 115 are determined by the etching of the interlayer dielectrics 106 and 112, the accuracy thereof is not so high. However, it does not influence the mechanical characteristics of the single axis acceleration sensor according to the first embodiment.

More specifically, the single axis acceleration sensor according to the first embodiment is designed so that the mechanical characteristics are determined by the movable mass 109, the elastic beam 110 and the fixed beam 111. Therefore, the cavity 115 can be formed by the etching technology (etching of interlayer dielectric itself) with lower accuracy than that of the normal manufacturing technology of a CMOS integrated circuit, that is, the case where the mechanical characteristics of the MEMS are determined by the shape of the cavity 115.

On the contrary, in the technology of the U.S. Pat. No. 6,635,506, the mechanical characteristics are influenced by the cavity. Therefore, it is necessary to form the cavity with high accuracy. For its achievement, a sacrificial layer made of a material different from that of the interlayer dielectric is formed in the region of an interlayer dielectric for forming a cavity. As a result, the process for forming the cavity is complicated.

Meanwhile, in the first embodiment, it is not necessary to form the cavity 115 with high accuracy. Therefore, the cavity 115 is formed by the etching of the interlayer dielectrics 106 and 112 themselves through the fine holes 113 without using a sacrificial layer. Also, after forming the cavity 115, the fine holes 113 are filled up by the dielectric 116 to seal the cavity 115. The deposition of the dielectric 116 which is included in the normal manufacturing technology of a CMOS integrated circuit is used also in this sealing process. More specifically, the process for forming and sealing the cavity 115 can be simplified in the first embodiment.

As described above, in the first embodiment, since the cavity 115 can be formed and sealed through the standard CMOS process, the special process for forming and sealing the cavity (packaging process particular to MEMS) which is the major cause of the yield decrease and the manufacturing cost increase in the conventional MEMS manufacturing process becomes unnecessary. Therefore, according to the first embodiment, it is possible to improve the yield, reduce the manufacturing (packaging) cost and improve the reliability. In addition, since the structure of the MEMS (single axis acceleration sensor) can be formed simultaneously with the formation of the interconnect of the LSI, the integration with the LSI can be facilitated.

Note that the planar shapes of the movable mass 109, the elastic beam 110 and the fixed beam 111 are not limited to those shown in FIG. 9B. For example, the configuration in which a movable mass located at the center is supported by elastic beams provided at the four corners.

Figure 10:
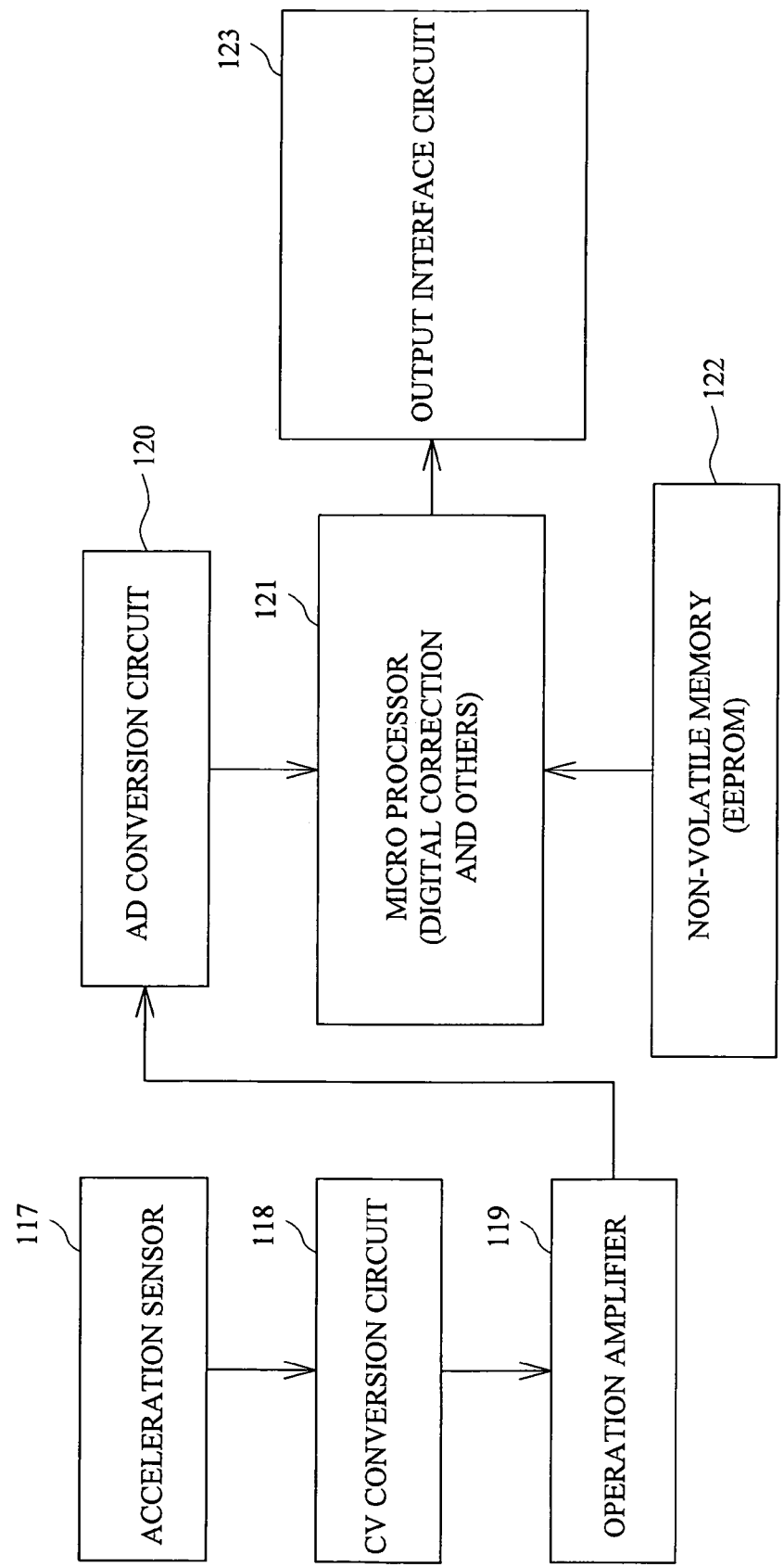
FIG. 10 is a block diagram showing the circuit configuration of the capacitance detecting circuit.

Next, the capacitance detecting circuit will be described. FIG. 10 is a block diagram showing the circuit configuration of an integrated circuit (capacitance detecting circuit) including the signal processing transistors 102.

In FIG. 10, the capacitance detected by an acceleration sensor 117 is converted into voltage by a C-V (capacitance-voltage) conversion circuit 118. Thereafter, the voltage converted by the C-V conversion circuit 118 is amplified by an operation amplifier 119 and then digitized by an A-D conversion circuit 120. Then, various types of correction such as temperature and amplifier characteristics are performed by a micro processor 121 based on the data stored in a non-volatile memory 122, and it is outputted as the acceleration from an output interface circuit 123. Note that the acceleration detecting accuracy can be further improved by simultaneously detecting a suitable fixed reference capacitance or capacitance change between the M5 layer and the movable mass 109 to use it as the difference input of the capacitance detecting circuit.

Next, an application of the single axis acceleration sensor according to the first embodiment will be described. The single axis acceleration sensor according to the first embodiment is mounted together with a pressure sensor for a TPMS (tire pressure monitoring system). The single axis acceleration sensor detects the acceleration based on the displacement of a movable mass due to the centrifugal force from the rotation of the tires and the vibration from the road surface, and determine the operational state of an automobile, that is, whether or not the automobile is running or not. Then, based on the detection result of the single axis acceleration sensor, the frequency of data transmission using RF such as the tire pressure information outputted from the pressure sensor is determined. That is, by providing the single axis acceleration sensor, the frequency of RF transmission of tire pressure information detected by the pressure sensor can be increased when the automobile is running, and the frequency of RF transmission of tire pressure information detected by the pressure sensor can be reduced when the automobile is not running. Consequently, the needless RF transmission can be reduced and the lifetime of battery can be extended.

Figure 11:
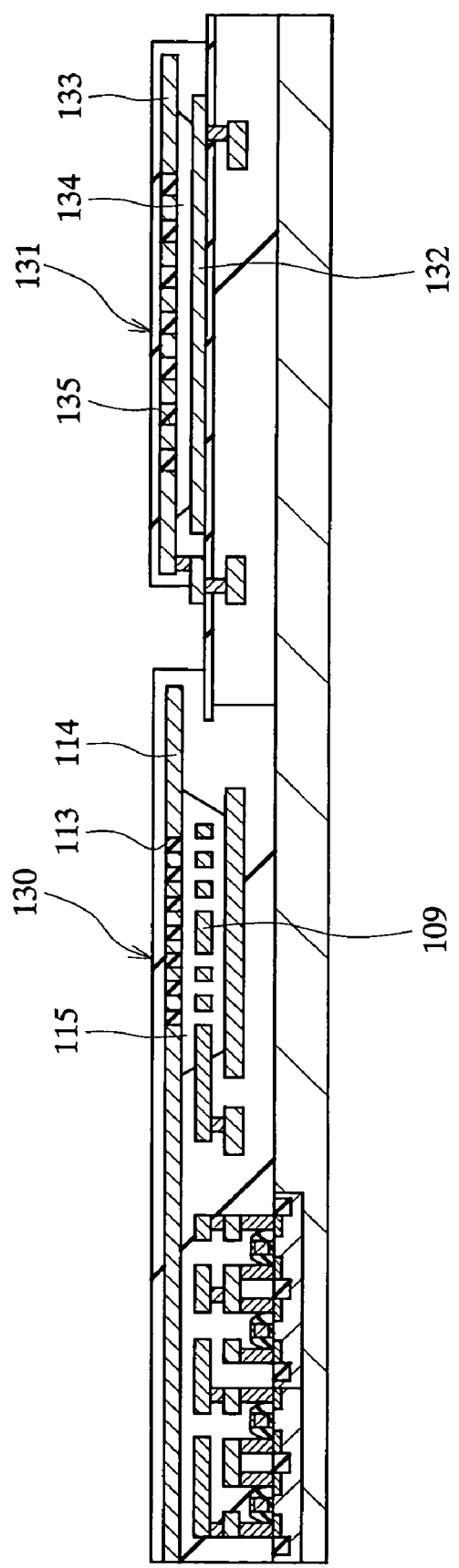
FIG. 11 is a schematic diagram showing the cross-sectional structure when the acceleration sensor and the pressure sensor are simultaneously formed.

The pressure sensor can be formed through the interconnect process similar to the single axis acceleration sensor. FIG. 11 is a cross-sectional view showing the device in which the single axis acceleration sensor 130 according to the first embodiment and the pressure sensor 130 are formed at the same time.

A lower electrode 132 of the pressure sensor 131 is formed from the same layer as the movable mass 109 of the single axis acceleration sensor 130. An upper electrode 133 (also functioning as diaphragm film) of the pressure sensor 131 is formed from the same layer as the cavity cover film 114 (sealing film) of the single axis acceleration sensor 130. The formation of the cavity 134 of the pressure sensor 131 and the formation of the cavity 115 of the single axis acceleration sensor 130 are performed at the same time through fine holes 135 provided in the upper electrode 133 of the pressure sensor 131 and the fine holes 113 provided in the cavity cover film 114 of the single axis acceleration sensor 130. Similarly, the sealing of the upper electrode 133 of the pressure sensor 131 and the sealing of the cavity cover film 114 of the single axis acceleration sensor 130 are also performed at the same time. In this manner, the pressure sensor 131 can be manufactured in parallel through approximately the same process as that of the single axis acceleration sensor 130 according to the first embodiment.

In the pressure sensor 131, the pressing force to the upper electrode 133 shown in FIG. 11 is changed (position of the upper electrode 133 is changed) along with the change in gas pressure around the pressure sensor 131. Therefore, the distance between the upper electrode 133 and the lower electrode 132 is changed and the interelectrode capacitance is changed. Consequently, in the pressure sensor 131, the gas pressure can be detected by detecting this interelectrode capacitance.

Second Embodiment

In this second embodiment, a modification example of the above-described first embodiment will be described. First, in the second embodiment, a 2-axis acceleration sensor which detects the acceleration in two directions within chip (directions orthogonal to each other) will be described. In the acceleration sensor, it is necessary to ensure, a predetermined amount of mass of the movable mass. Therefore, the mechanical structure is formed from a pad layer with a relatively large thickness in the interconnect layers.

Figure 12:
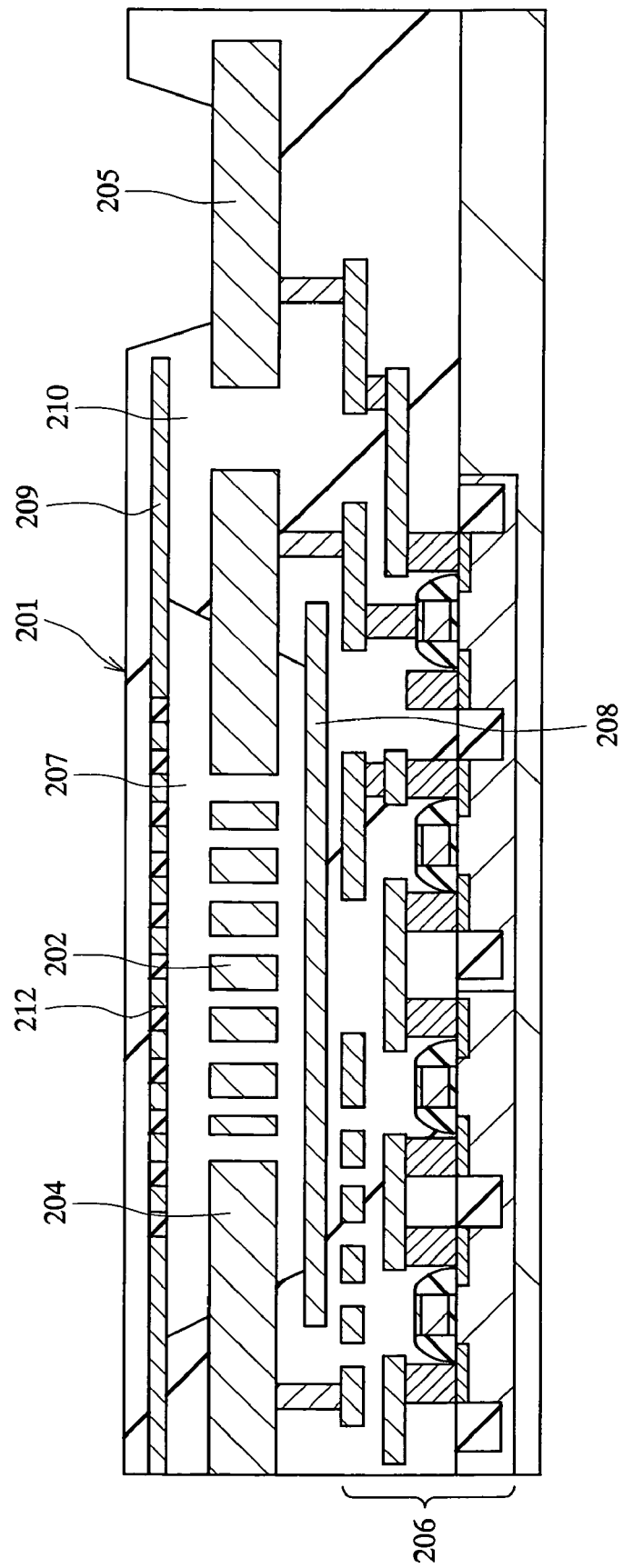
FIG. 12 is a schematic diagram showing the cross-sectional structure of the acceleration sensor according to the second embodiment.
Figure 13A:
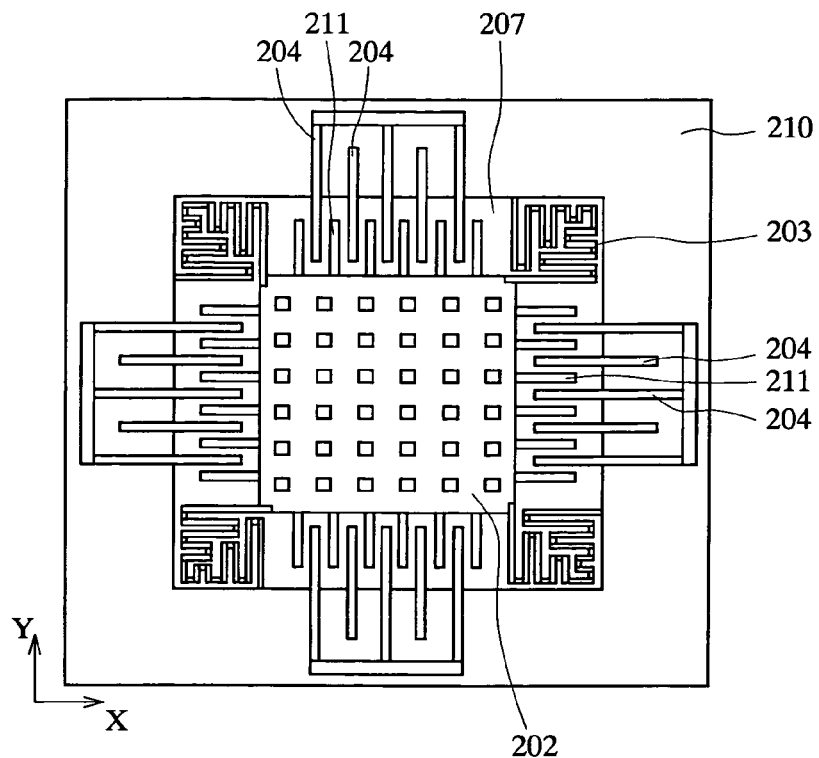
FIG. 13A and FIG. 13B are plan views showing the major layers constituting the acceleration sensor, respectively.
Figure 13B:
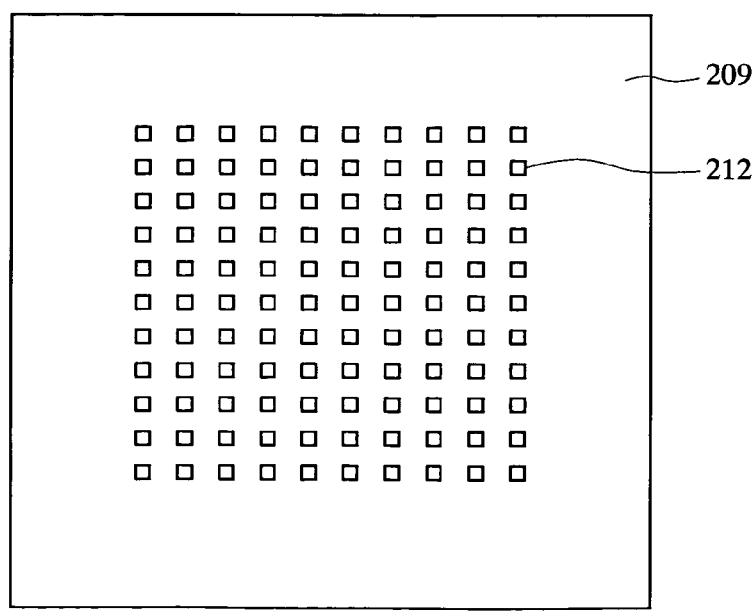

FIG. 12 is a schematic diagram showing the cross-sectional structure of the 2-axis acceleration sensor, and FIG. 13A and FIG. 13B are schematic diagrams showing the configuration of the major layers. In FIG. 12, a movable mass 202, an elastic beam 203 (not shown in FIG. 12) and a fixed capacitor plate (capacitance detecting electrode) 204 of the 2-axis acceleration sensor 201 are formed from the same metal layer as the pad layer 205 of the LSI in which they are monolithically integrated. The 2-axis acceleration sensor 201 is formed on the normal LSI 206 and a cavity 207 thereof is formed around the movable mass 202 and sealed in the same manner as that of the first embodiment. However, when forming the cavity 207, an etching stopper film 208 is formed by using an appropriate interconnect layer just below the cavity forming region. This etching stopper film 208 also functions as an electric shield between the underlying LSI 206 (integrated circuit and multilayer interconnect) and the 2-axis acceleration sensor 201. As described above, since the mechanical structure of the MEMS (2-axis acceleration sensor) can be formed and stacked on the LSI (interconnect part and device region), the miniaturization of a chip can be realized.

In the etching for forming the cavity 207, it is necessary to ensure the sufficient etching selectivity between the interlayer dielectric 210 to be etched and the movable mass 202, the etching stopper film 208 and the cavity cover film 209 for sealing made of a pad layer material. In this case, the pad layer 205 is a stacked film formed by sandwiching an aluminum (Al) film with a thickness of 1500 nm between titanium nitride (TiN) films each having a thickness of 100 nm. By doing so, in the etching for forming the cavity 207, the etching selectivity to the interlayer dielectric 210 can be sufficiently ensured. If necessary, it is also possible to form sidewalls made of a titanium nitride film or a silicon nitride (SiN) film in order to prevent the side etching from the side of the aluminum film.

In order to seal the cavity 207 having an area large enough to include the relatively large movable mass 202, it is necessary to ensure the sufficient strength of the cavity cover film 209. In this case, a tungsten silicide (WSi) film with a thickness of 1 μm is used. In order to prevent the adhesion and destruction of the cavity cover film 209 due to the capillary force of the residual liquid in the cavity 207 in the dry process after the etching, the vapor-phase etching using vaporized HF is used to form the cavity 207.

Next, the operation of the 2-axis acceleration sensor according to the second embodiment will be described. As shown in FIG. 13A, the movable mass 202 in the cavity 207 is fixed to the interlayer dielectric 210 via the elastic beam 203 formed from the same layer. The interlayer dielectric 210 also functions as a fixed beam considered to be elastically undeformed. By forming the elastic beam 203 in a folded shape as shown in FIG. 13A, the elastic beam 203 is elastically deformed by the force applied to the movable mass 202 and the two dimensional position of the movable mass 202 is changed in the cavity 207. The amount of change is detected as the change in capacitance between a movable capacitor plate 211 formed at a part of the movable mass and a fixed capacitor plate 204 fixed to the interlayer dielectric 210 and protruding in the cavity 207. The movable capacitor plate 211 and the fixed capacitor plate 204 for detecting the displacement in the two directions (x and y directions) within a chip are arranged in a comb shape in which they are alternately formed in a lateral direction. A pair of fixed capacitor plates 204 sandwiching the one movable capacitor plate 211 are electrically independent from each other, and the capacitance between the fixed capacitor plate 204 and the movable mass 202 is detected separately. For example, when the movable mass 202 moves in the x direction, the distance between the movable capacitor plate 211 and the fixed capacitor plate 204 arranged above and below is changed. More specifically, in the movable capacitor plate 211 and one pair of fixed capacitor plates 204 arranged above and below, the distance between the movable capacitor plate 211 and one fixed capacitor plate 204 is increased and the distance between the movable capacitor plate 211 and the other fixed capacitor plate 204 is decreased. When the distance is changed, the capacitance is also changed. Therefore, by detecting the change in capacitance, the acceleration in the x direction can be detected. Also, when the movable mass 202 moves in the y direction, the distance between the movable capacitor plate 211 and the fixed capacitor plate 204 arranged side by side is changed. More specifically, in the movable capacitor plate 211 and one pair of fixed capacitor plates 204 arranged side by side, the distance between the movable capacitor plate 211 and one fixed capacitor plate 204 is increased and the distance between the movable capacitor plate 211 and the other fixed capacitor plate 204 is decreased. Therefore, the acceleration in the y direction can be detected.

These fixed capacitor plates 204 and the movable mass 202 (including the movable capacitor plates 211) in the x and y directions are electrically connected independently to the signal processing integrated circuit (LSI) integrated on the same semiconductor substrate. When the movable mass 202 moves by the acceleration in an arbitrary direction of the two axes, the distance between the fixed capacitor plate 204 and the movable capacitor plate 211 is changed and the interelectrode capacitance is changed. By detecting the change in capacitance by the signal processing integrated circuit (capacitance detecting circuit), the acceleration is detected.

The shape of the beam is designed so that the base part thereof is sufficiently thick in the cavity 207 to prevent the elastic deformation even when the acceleration is applied to the mass (fixed part, fixed beam). On the other hand, the center part of the beam is designed so as to have the smaller width in comparison to that of base part and a sufficient length because of its folded shape, and the desired elastic deformation occurs when a predetermined acceleration is applied (elastically deformable part, elastic beam 203). Therefore, the mechanical characteristics are determined only by the planar pattern shape and the thickness of the part of the beam and the movable mass 202 exposed in the cavity 207, and do not depend on the dimensions and the shape of the cavity 207. Since the dimensional accuracy of the fixed beam, the elastic beam 203 and the movable mass 202 is determined by the dimensional accuracy of the patterns of the interconnect layer and the via layer, it is very accurate. Meanwhile, since the dimensions and the shape of the cavity 207 are determined by the etching of the interlayer dielectric 210, the accuracy thereof is not so high. However, it does not influence the mechanical characteristics of the 2-axis acceleration sensor according to the second embodiment.

FIG. 13B shows the cavity cover film 209 formed on the cavity 207, and fine holes 212 used to form the cavity 207 are formed in the cavity cover film 209. The fine holes 212 are sealed with a dielectric when the formation of the cavity 207 is finished.

Figure 14:
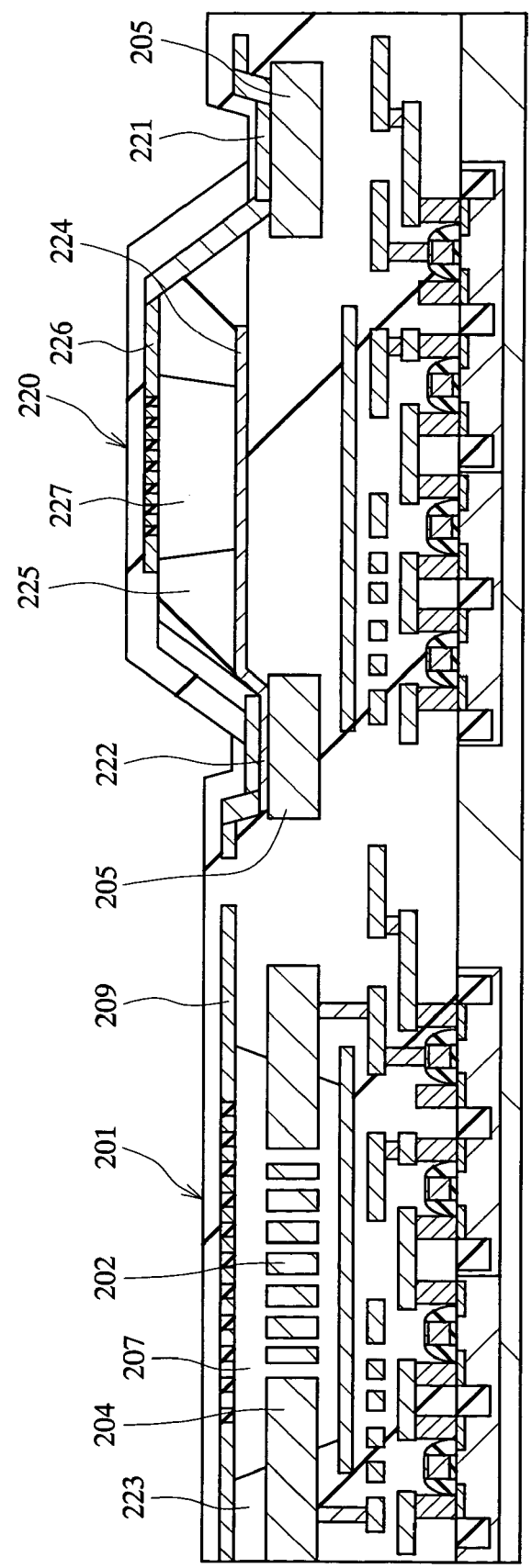
FIG. 14 is a schematic diagram showing the cross-sectional structure when the acceleration sensor and the pressure sensor are simultaneously formed.

Next, an example in which the 2-axis acceleration sensor according to the second embodiment is formed simultaneously with the pressure sensor is shown in FIG. 14. FIG. 14 is a cross-sectional view of a compound sensor in which the 2-axis acceleration sensor 201 according to the second embodiment is formed simultaneously with a pressure sensor 220 similar to that in the first embodiment.

As shown in FIG. 14, the mechanical structure (movable mass 202, fixed capacitor plate 204 and the like) of the 2-axis acceleration sensor 201 is formed from the same layer as that of the pad layer 205, and an interconnect 221 for connecting an upper electrode and an interconnect 222 for connecting a lower electrode of the pressure sensor 220 are formed thereon. Subsequently, after forming an interlayer dielectric 223, an opening for connecting upper electrode and an opening for connecting lower electrode are provided on the pad layer 205.

Next, a lower electrode 224 of the pressure sensor 220 is formed and the lower electrode 224 is connected to the interconnect 222 for connecting a lower electrode. Subsequently, a dielectric (oxide film) pattern 225 for forming a cavity of the pressure sensor 220 is formed. Then, a metal film (for example, tungsten film) to be the upper electrode (diaphragm film) 226 of the pressure sensor 220 and the cavity cover film 209 of the 2-axis acceleration sensor 201 is formed on the entire surface of the semiconductor substrate. Thereafter, after forming fine holes in the metal thin film on the cavity forming region of the pressure sensor 220 and on the cavity forming region of the 2-axis acceleration sensor 201, the interlayer dielectric 223 and the dielectric pattern 225 are etched through the fine holes. By doing so, the cavity 227 of the pressure sensor 220 and the cavity 207 of the 2-axis acceleration sensor 201 are formed. Subsequently, the fine holes formed in the metal thin film are sealed.

Thereafter, the metal thin film is patterned to form the upper electrode 226 of the pressure sensor 220 and the cavity cover film 209 of the 2-axis acceleration sensor 201. Then, a passivation film made of a silicon nitride film is deposited and an opening is formed on the pressure sensor 220 and the predetermined pad (not shown).

As described above, also in this second embodiment, the pressure sensor 220 and the 2-axis acceleration sensor 201 can be formed almost at the same time.

According to the second embodiment, since the movable mass 202 of the 2-axis acceleration sensor 201 can be formed from the interconnect in the same layer as the pad layer (relatively thick layer) 205, the mass of the movable mass 202 can be greatly increased in comparison to the first embodiment. Therefore, it is possible to improve the sensitivity of the 2-axis acceleration sensor 201. Note that, also in the second embodiment, the formation of the mechanical structure and the formation and sealing of the cavity of the 2-axis acceleration sensor can be performed through the normal CMOS process. Therefore, the advantages similar to those of the first embodiment can be realized.

Third Embodiment

In this third embodiment, the MEMS switch mounted together with the LSI will be described. In the third embodiment, the MEMS switch and the integrated circuit are monolithically mounted by using the normal manufacturing technology of a CMOS integrated circuit (interconnect process). Since the MEMS switch is formed on the multilayer interconnect of the integrated circuit, the increase of the chip area can be prevented. The MEMS switches are used to switch the circuit blocks and to switch the input/output RF devices and the antennas in accordance with the RF (Radio Frequency) wireless communication system. By doing so, the connection to low-power-consumption wireless devices and antennas with small loss can be realized.

Figure 15A:
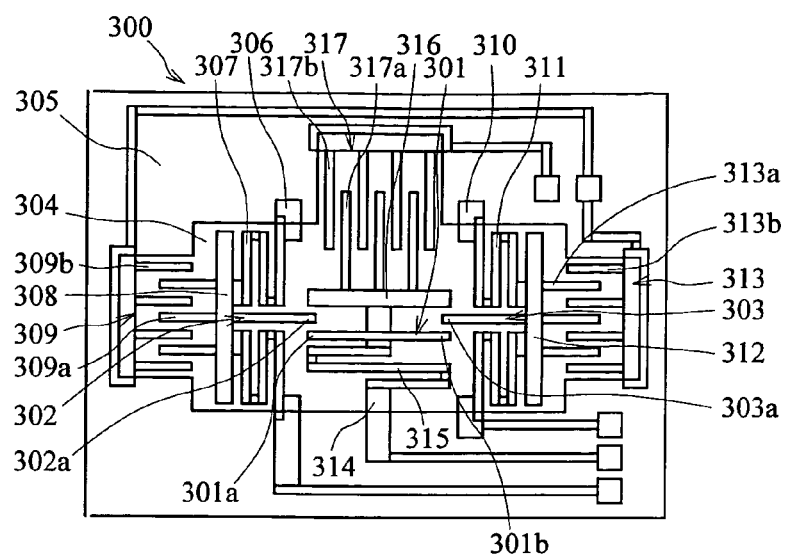
FIG. 15A to FIG. 15C are plan views schematically showing the configuration and the basic operation of the MEMS switch according to the third embodiment.
Figure 15B:
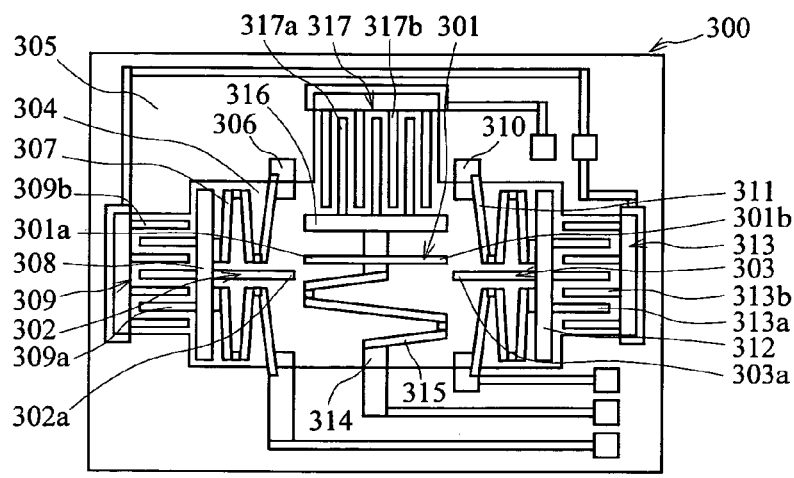
Figure 15C:
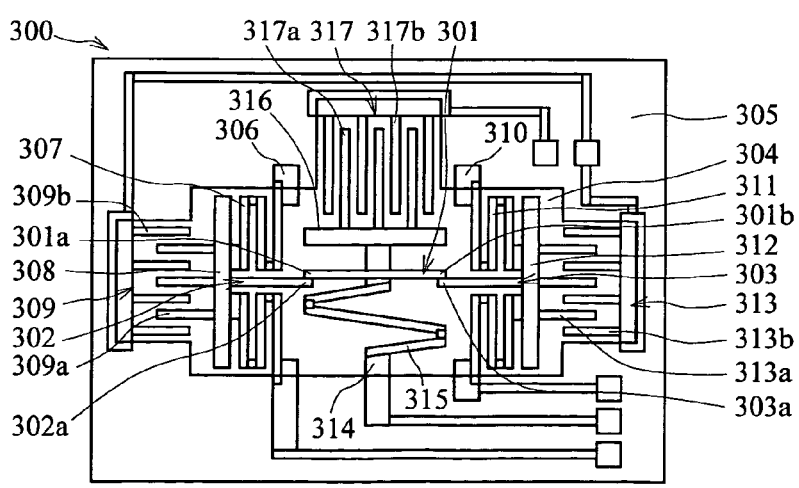

First, the function and basic operation of a MEMS switch 300 according to the third embodiment will be described. FIG. 15A to FIG. 15C are plan views schematically showing the configuration and the basic operation of the MEMS switch 300 according to the third embodiment.

The function of the MEMS switch 300 according to the third embodiment is to connect or disconnect the input to or from the output in response to the control signal. The MEMS switch 300 has three states, that is, a connection state, a disconnection state and a transition state. In the connection state, as shown in FIG. 15C, two contacts 301a and 301b of a central movable part 301 are in contact with a contact 302a of an input line 302 and a contact 303a of an output line 303. Meanwhile, in the disconnection state, as shown in FIG. 15A, the two contacts 301a and 301b of the central movable part 301 are not in contact with the contact 302a of the input line 302 and the contact 303a of the output line 303. In these connection state and disconnection state, the input line 302 and the output line 303 of the MEMS switch 300 are electrically connected to the signal lines of each integrated circuit. Also, the transition state shown in FIG. 15B is the state corresponding to the transition from the connection state to the disconnection state or from the disconnection state to the connection state, in which the input line 302 and the output line 303 of the MEMS switch 300 are electrically disconnected from the signal lines of each integrated circuit and are connected to the signal line from a switch control unit.

Next, the function of each component will be described. The input line 302 is comprised of a fixed part (fixed beam) 306 fixed to an interlayer dielectric 305 formed so as to surround a cavity 304 and a movable part 308 including an elastically deformable spring part 307 and the contact 302a. A part of the movable part 308 constitutes one electrode 309a of a comb-shaped displacement actuator 309. On the other hand, the other electrode 309b of the comb-shaped displacement actuator 309 is fixed to the interlayer dielectric 305.

The configuration of the output line 303 is almost symmetrical to that of the input line 302. More specifically, the output line 303 is comprised of a fixed part (fixed beam) 310 fixed to the interlayer dielectric 305 formed so as to surround the cavity 304 and a movable part 312 including an elastically deformable spring part 311 and the contact 303a. A part of the movable part 312 constitutes one electrode 313a of a comb-shaped displacement actuator 313. On the other hand, the other electrode 313b of the comb-shaped displacement actuator 313 is fixed to the interlayer dielectric 305.

In addition, the central movable part 301 is also comprised of almost the same components, that is, it is comprised of a fixed part (fixed beam) 314 fixed to the interlayer dielectric 305 formed so as to surround the cavity 304 and a movable part 316 including an elastically deformable spring part 315 and the contacts 301a and 301b. More specifically, an interconnect having one end fixed to the interlayer dielectric 305 is electrically and mechanically connected to the movable part 316 including the contacts 301a and 301b via the elastically deformable spring part 315. A part of the movable part 316 constitutes one electrode 317a of a comb-shaped displacement actuator 317. Meanwhile, the other electrode 317b of the comb-shaped displacement actuator 317 is fixed to the interlayer dielectric 305. Note that FIG. 15A to FIG. 15C are schematic diagrams, and the planar configuration of the spring part and the actuator is simplified.

Next, the actual operation of the MEMS switch will be briefly described with using the transition from the disconnection state to the connection state as an example. In the disconnection state shown in FIG. 15A, the three comb-shaped displacement actuators 309, 313 and 317 are not actuated, and no force is applied to any of the three spring parts 307, 311 and 315. Therefore, the input line 302 and the output line 303 are switched from the integrated circuit signal line to the actuator control signal line. Then, the voltage is applied between a pair of electrodes 309a and 309b of the comb-shaped displacement actuator 309 provided in the input line 302. By doing so, the movable part 308 is electrostatically actuated and the contact 302a of the input line 302 is displaced to outside. Similarly, the voltage is applied between a pair of electrodes 313a and 313b of the comb-shaped displacement actuator 313 provided in the output line 303. By doing so, the movable part 312 is electrostatically actuated and the contact 303a of the output line 303 is displaced to outside.

In this state, the central movable part 301 can move in a longitudinal direction with no interference. Further, by applying the voltage between a pair of electrodes 317a and 317b of the comb-shaped displacement actuator 317 provided in the central movable part 301, the central movable part 301 is electrostatically actuated and is displaced upward (FIG. 15B).

Subsequently, the movable part 308 of the input line 302 and the movable part 312 of the output line 303 are returned to the initial positions. Thereafter, when the actuation of the comb-shaped displacement actuator 317 of the central movable part 301 is stopped, the central movable part 301 is fixed to the input line 302 and the output line 303 by the force of the spring part 315. More specifically, the contacts 301a and 301b of the central movable part 301 are connected to the contact 302a of the input line 302 and the contact 303a of the output line 303, respectively (FIG. 15C). Thereafter, by switching the input line 302 and the output line 303 to the integrated circuit signal line, it comes to the connection state.

Next, the manufacturing process of the MEMS switch 300 according to the third embodiment will be briefly described. Similar to the second embodiment, the components of the MEMS switch 300 are formed from only one interconnect layer, and the manufacturing process thereof is almost identical to that of the first and second embodiments. More specifically, the transistors and the multilayer interconnect are formed through the normal CMOS integrated circuit process, and the mechanical structure of the MEMS switch 300 is formed thereon by using the almost identical method shown in the above-described second embodiment. That is, in the third embodiment, instead of forming the structure of the acceleration sensor, the structure of the MEMS switch 300 is formed. Similar to the second embodiment, this structure is formed with using a part of the uppermost layer of the multilayer interconnect. However, it is also possible to form the structure with using an intermediate interconnect layer on the memory region in which the number of interconnects is small.

Also, when forming a cavity around the mechanical structure, a thin film using an interconnect layer is formed as an etching stopper film just below the structure in the cavity forming region. This thin film functions as an electric shield for the transistors and the multilayer interconnects formed below.

In the third embodiment, the electrical conduction must be obtained when the structures formed of the interconnects are connected. Therefore, it is necessary to prevent the adhesion of dielectrics on the surface of the structure. Also, it is also necessary to prevent the so-called sticking in which the metal bodies are not separated after being connected to each other. For its achievement, in addition to the sealing process described in the first embodiment (refer to FIG. 8), the following process shown in FIG. 16A to FIG. 16D must be performed.

Figure 16A:
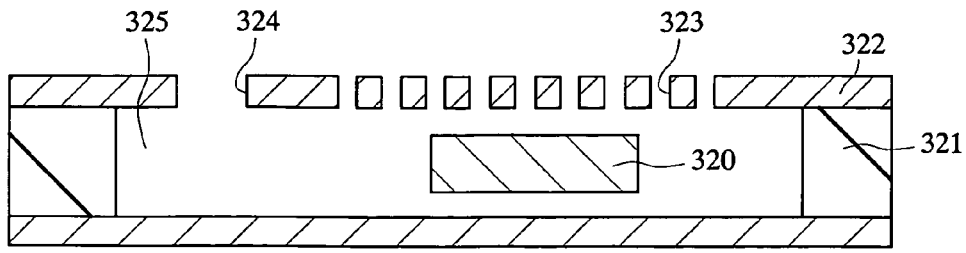
FIG. 16A to FIG. 16D are schematic diagrams showing a part of the manufacturing process of the MEMS switch, respectively.
Figure 16B:
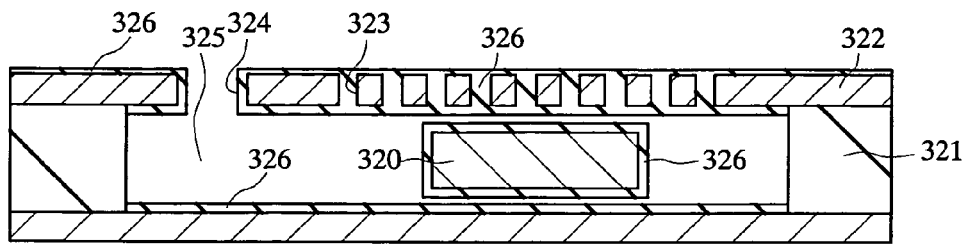
Figure 16C:
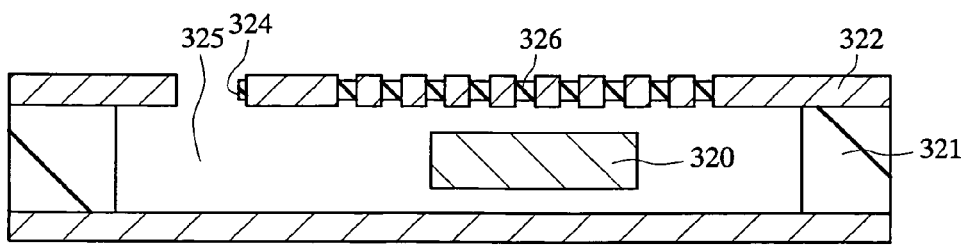
Figure 16D:
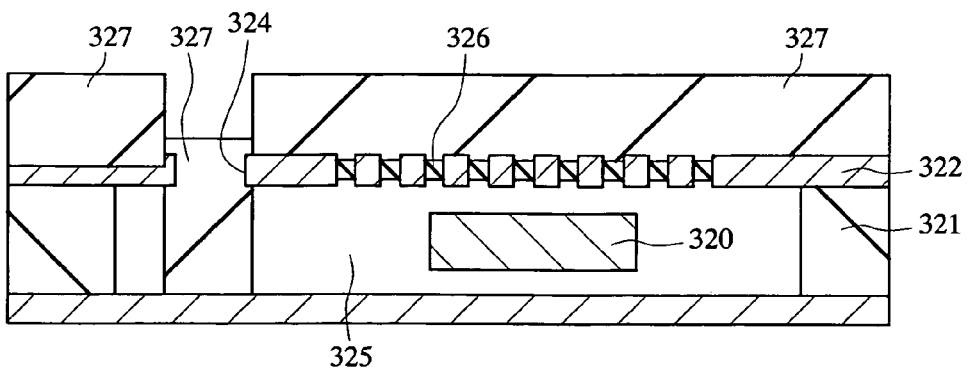
Figure 17A:
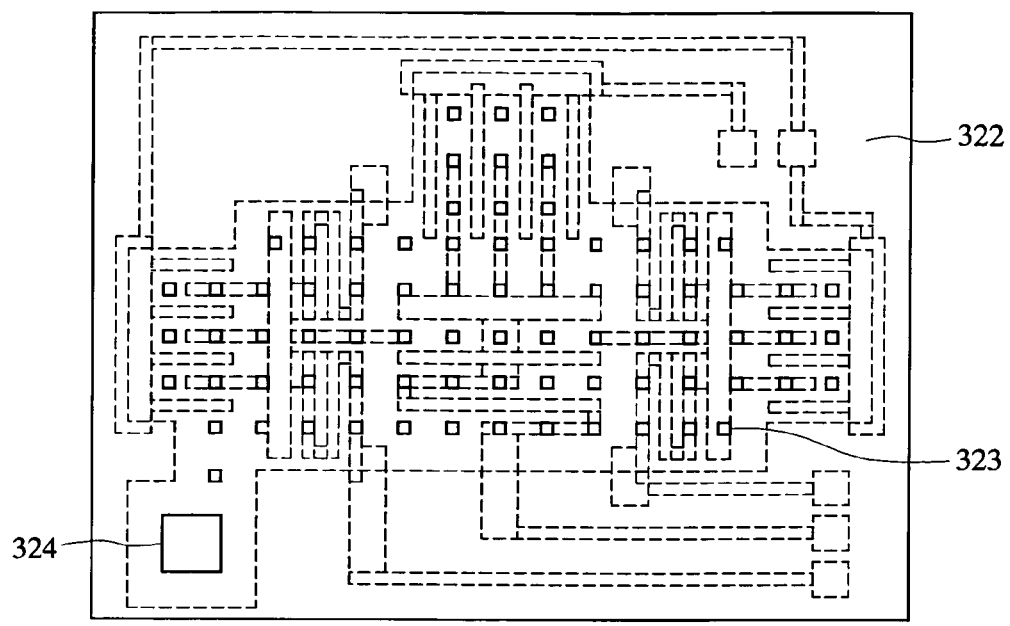
FIG. 17A and FIG. 17B are plan views showing the major layers of the MEMS switch, respectively.
Figure 17B:
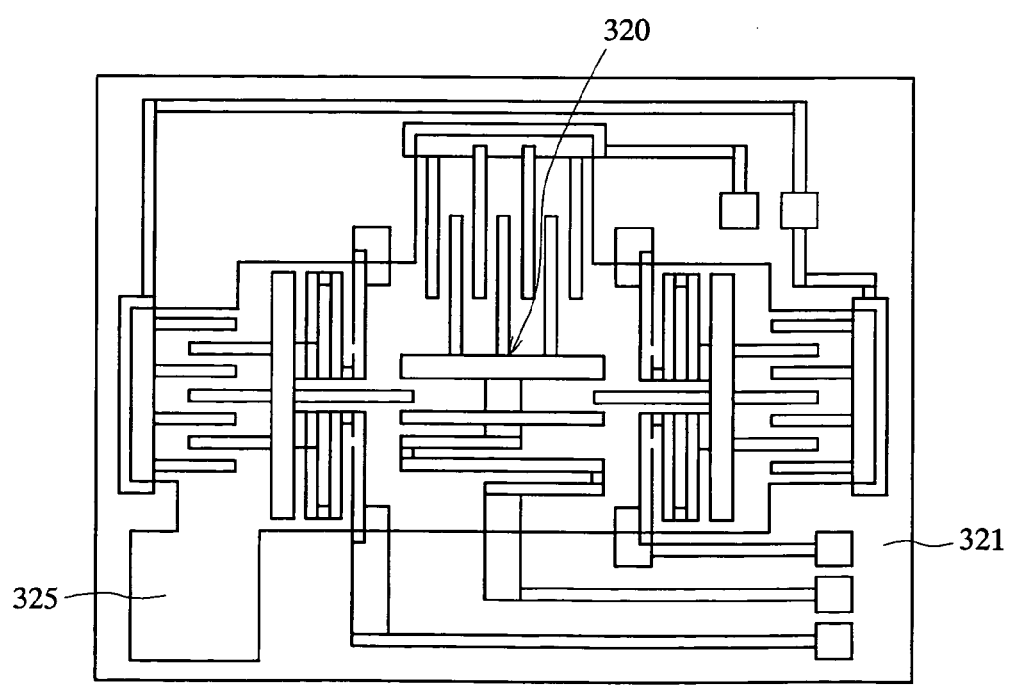

FIG. 16A to FIG. 16D are schematic diagrams showing a part of the manufacturing process of the MEMS switch 300 according to the third embodiment, and FIG. 17A and FIG. 17B are schematic diagrams showing the configuration of the major layers constituting the MEMS switch 300. As shown in FIG. 16A, an interconnect (not shown) and a structure 320 of the MEMS switch are formed by using the predetermined interconnect layer. Then, an interlayer dielectric 321 is deposited on the structure 320, and a thin film made of a similar interconnect material is formed on the interlayer dielectric 321. Thereafter, holes are formed in this thin film to form a cavity cover film 322. The holes include at least two types of holes, that is, fine holes 323 having a relatively small diameter (about 0.2 to 0.3 µm) and a larger hole 324 having a diameter larger than that of the fine hole 323. The plan view of the cavity cover film 322 in which the fine holes 323 and the larger hole 324 are formed is shown in FIG. 17A. As shown in FIG. 17A, the fine holes 323 are arranged on the predetermined cavity forming region and the larger hole 324 is provided at the position below which the structure is not present. Note that the dotted line represents the structure 320 formed below the cavity cover film 322 via the interlayer dielectric 321.

Next, the interlayer dielectric 321 around the structure 320 is etched and removed through the fine holes 323 and the larger hole 324 to form the cavity 325. The plan view showing the layer in which the structure 320 is formed is shown in FIG. 17B. As shown in FIG. 17B, the cavity 325 is formed in the interlayer dielectric 321, and the structure 320 is formed in the cavity 325.

Subsequently, the fine holes 323 are filled up with a dielectric 326 having isotropic deposition characteristics (FIG. 16B). At this time, the dielectric 326 is also adhered to the surface of the structure 320 made of, for example, metal due to the deposition gas getting in the cavity 325 through the fine holes 323. Therefore, when only the fine holes 323 are formed in the cavity cover film 322, the cavity 325 is sealed while the dielectric 326 is adhered to the surface of the structure 320. As a result, the electrical conduction cannot be obtained when connecting the MEMS switch. However, the larger hole 324 is formed in addition to the fine holes 323 in the third embodiment. Since this larger hole 324 is not filled up, the cavity 325 is not sealed yet.

Next, the dielectric 326 adhered to the surface of the structure 320 in the cavity 325 is etched through the larger hole 324, and then, the metal surface after the etching is hydrophobically treated so as to prevent the sticking (FIG. 16C). Thereafter, a dielectric 327 is deposited by the anisotropic CVD under the reduced pressure to close the larger hole 324. In this manner, the cavity 325 is completely sealed (FIG. 16D).

As described above, according to the third embodiment, since it is possible to remove the dielectric 326 formed on the surface of the structure 320 in the sealing process of the cavity 325, the improvement of the reliability of the MEMS switch can be achieved. Note that, also in the third embodiment, the structure of the MEMS switch can be formed and the cavity can be formed and sealed through the CMOS process. Therefore, the advantages similar to those of the first embodiment can be realized.

Fourth Embodiment

In this fourth embodiment, an example in which an integral movable part composed of a plurality of multilayer interconnects is used will be described. As a problem of the acceleration sensor using the surface MEMS, the increase of the mass of the movable mass is relatively difficult. This is because the thickness of the movable mass is determined by the thickness of the interconnect layer. In the fourth embodiment, the method and the structure capable of increasing the mass of the movable mass will be described. In order to increase the mass of the movable mass, an integral structure composed of a plurality of multilayer interconnects is used as a movable part. It is possible to simultaneously form the movable mass and the multilayer interconnects of a LSI.

Figure 24:
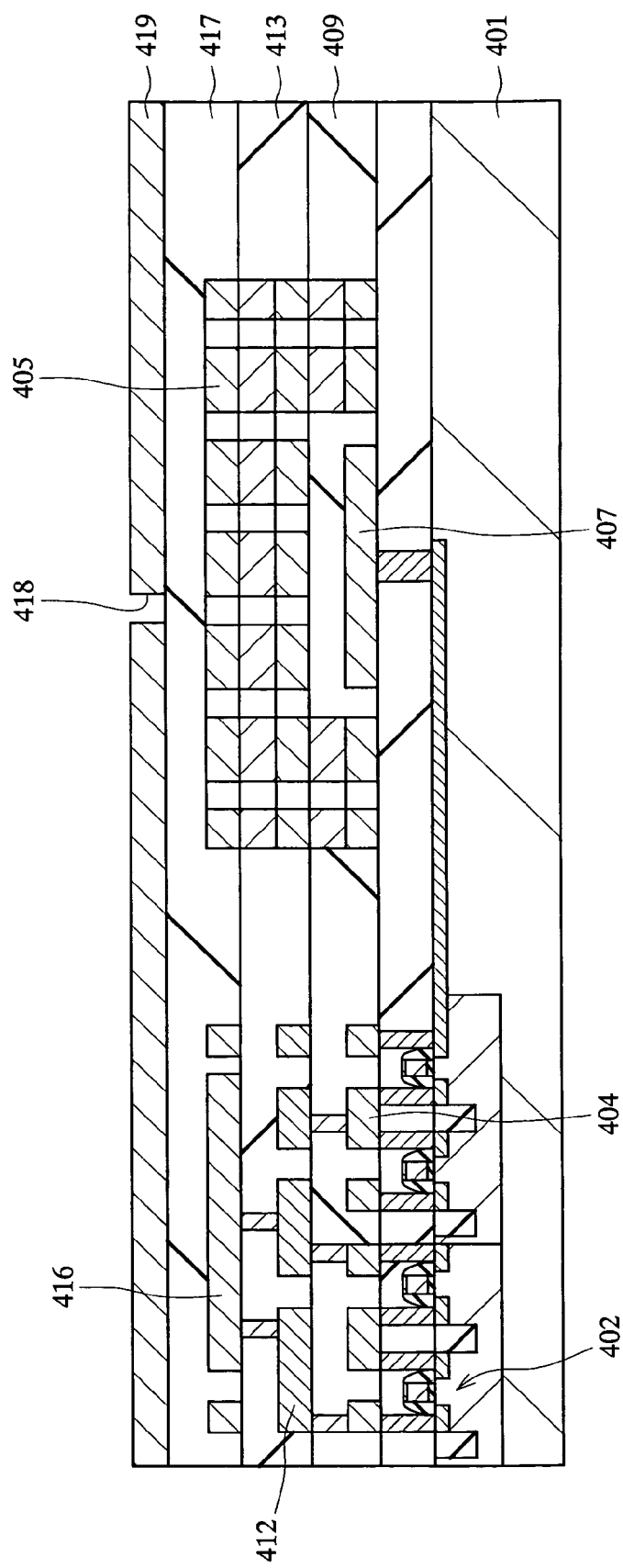
FIG. 24 is a schematic diagram showing the manufacturing process of the acceleration sensor subsequent to FIG. 23.
Figure 25:
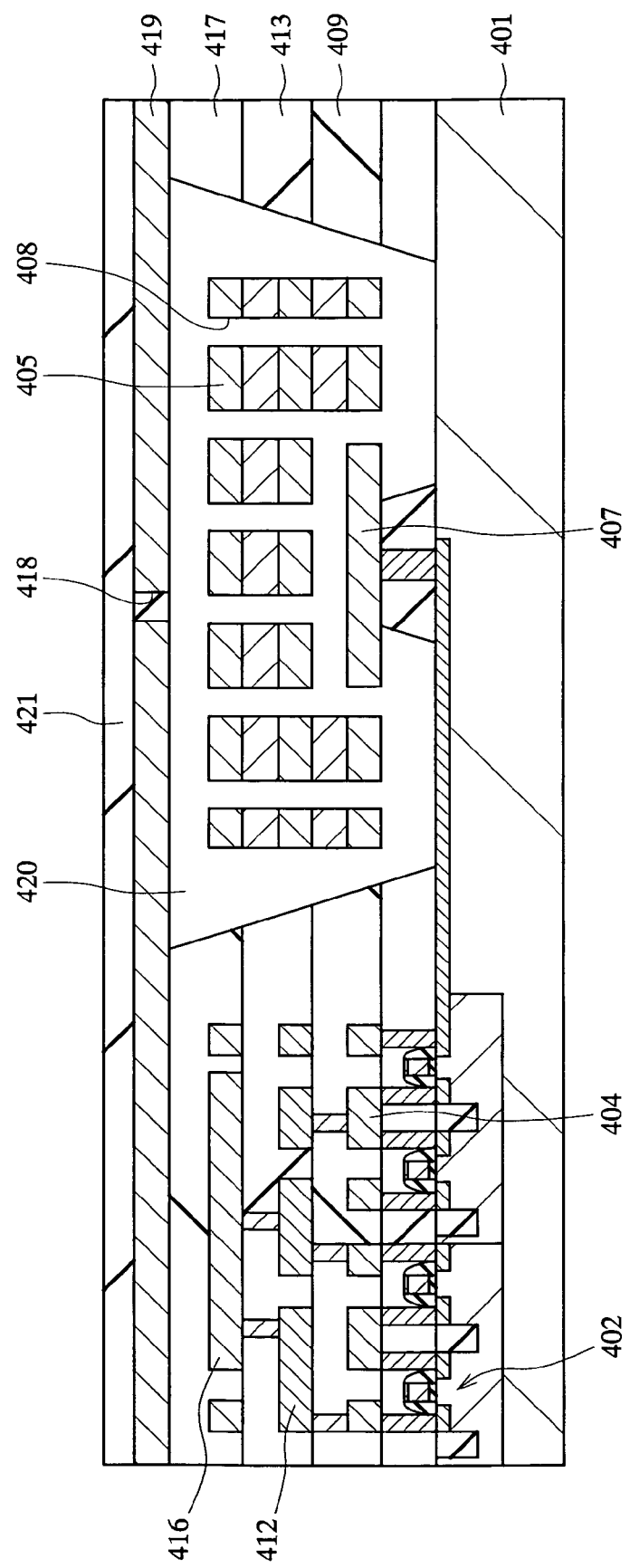
FIG. 25 is a schematic diagram showing the manufacturing process of the acceleration sensor subsequent to FIG. 24.
Figure 26A:
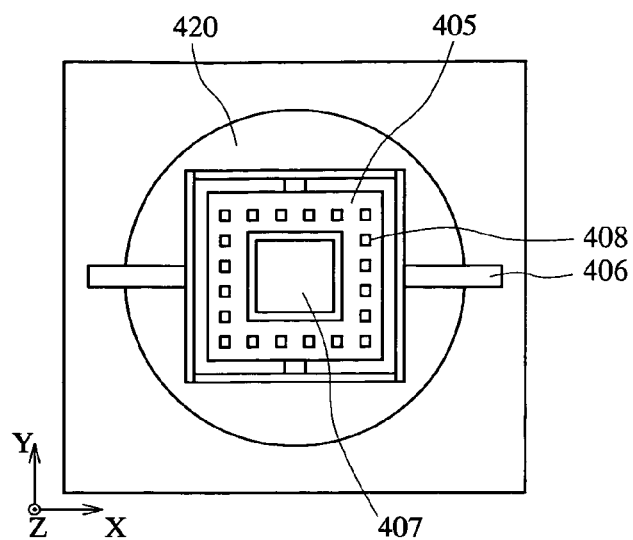
FIG. 26A to FIG. 26C are plan views showing the major layers constituting the acceleration sensor, respectively.
Figure 26B:
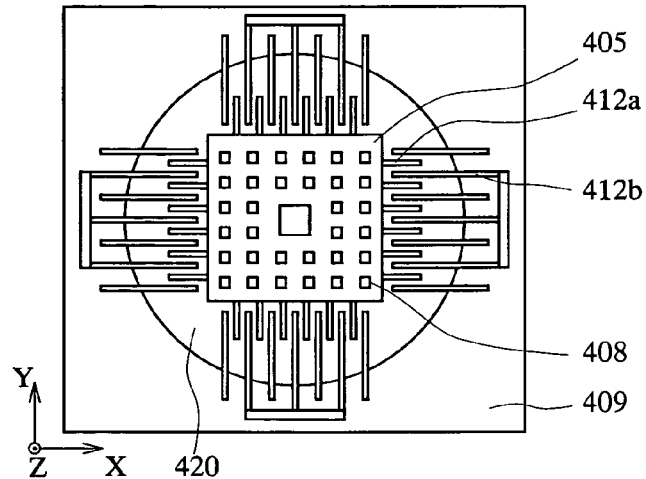
Figure 26C:
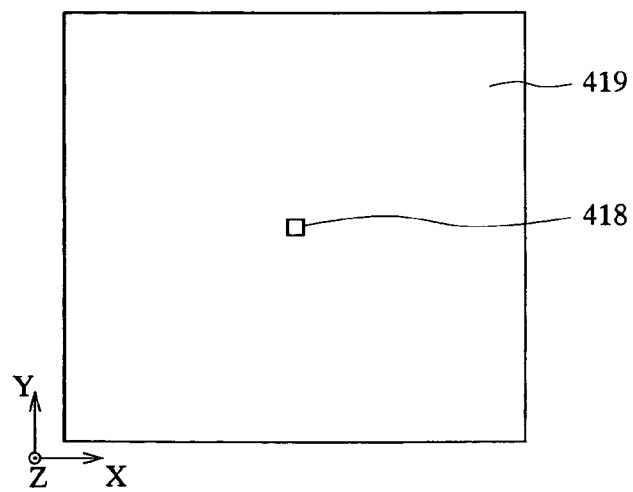

FIG. 18 to FIG. 25 are schematic diagrams for describing the manufacturing process of a 3-axis acceleration sensor according to the fourth embodiment, and FIG. 26A to FIG. 26C are schematic plan views showing the configuration of each layer of the structure constituting the 3-axis acceleration sensor.

Figure 18:
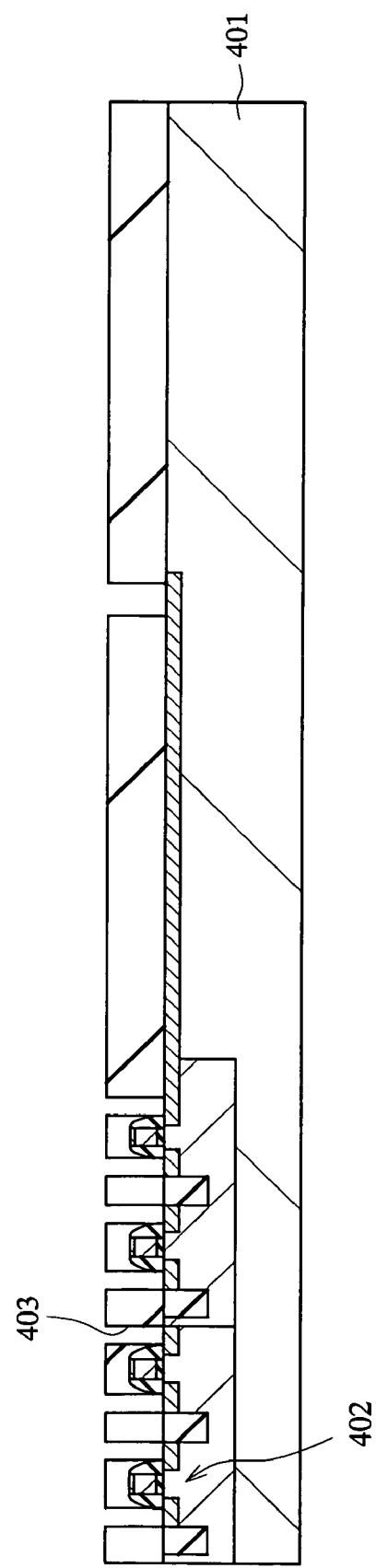
FIG. 18 is a schematic diagram showing the manufacturing process of an acceleration sensor according to the fourth embodiment.
Figure 19:
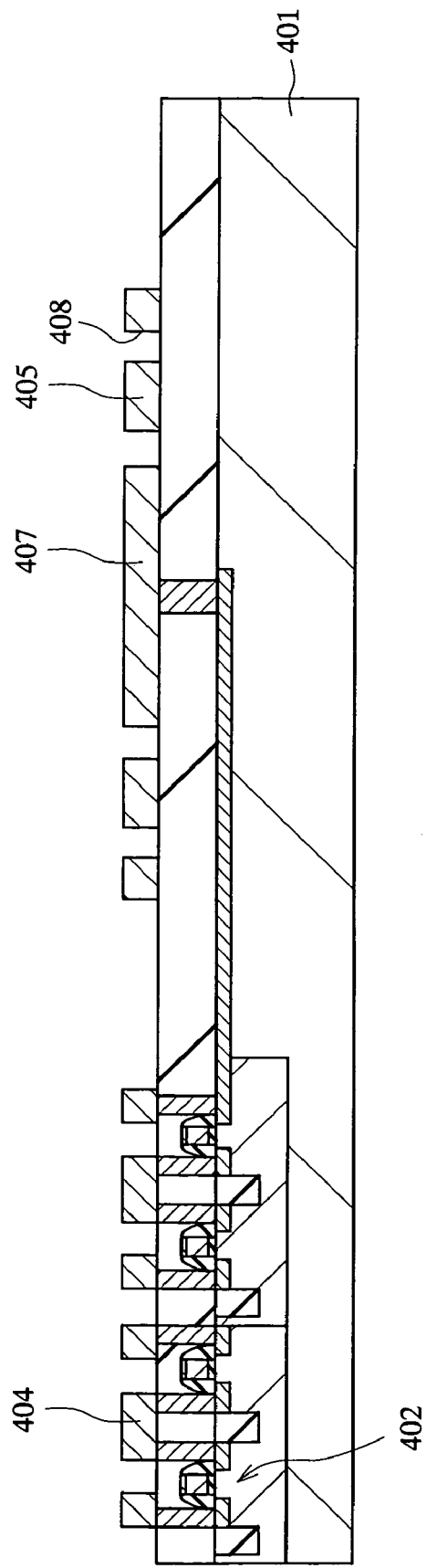
FIG. 19 is a schematic diagram showing the manufacturing process of the acceleration sensor subsequent to FIG. 18.

First, through the normal CMOS integrated circuit process, signal processing transistors 402 and contact holes 403 of the 3-axis acceleration sensor are formed on a silicon substrate 401 (FIG. 18). Next, through the similar CMOS integrated circuit process, a first layer interconnect (M1 layer) 404 of the integrated circuit, a movable mass 405 of the 3-axis acceleration sensor, an elastic beam 406 (not shown) also functioning as an interconnect electrically and mechanically connected to the movable mass 405 and a lower electrode 407 described later are formed from the metal patterns (FIG. 19). A schematic diagram of the M1 layer pattern of the 3-axis acceleration sensor is shown in FIG. 26. In FIG. 26, the movable mass 405 is fixed to a fixed beam (interlayer dielectric) via the elastic beam 406.

Each of the elastic beam 406 and the lower electrode 407 is connected to the predetermined interconnects of the signal processing transistors 402 via the first layer interconnect 404 and the contact holes. Fine holes 408 for removing the interlayer dielectric just below the movable mass 405 in the latter process are formed in the movable mass 405.

Figure 20:
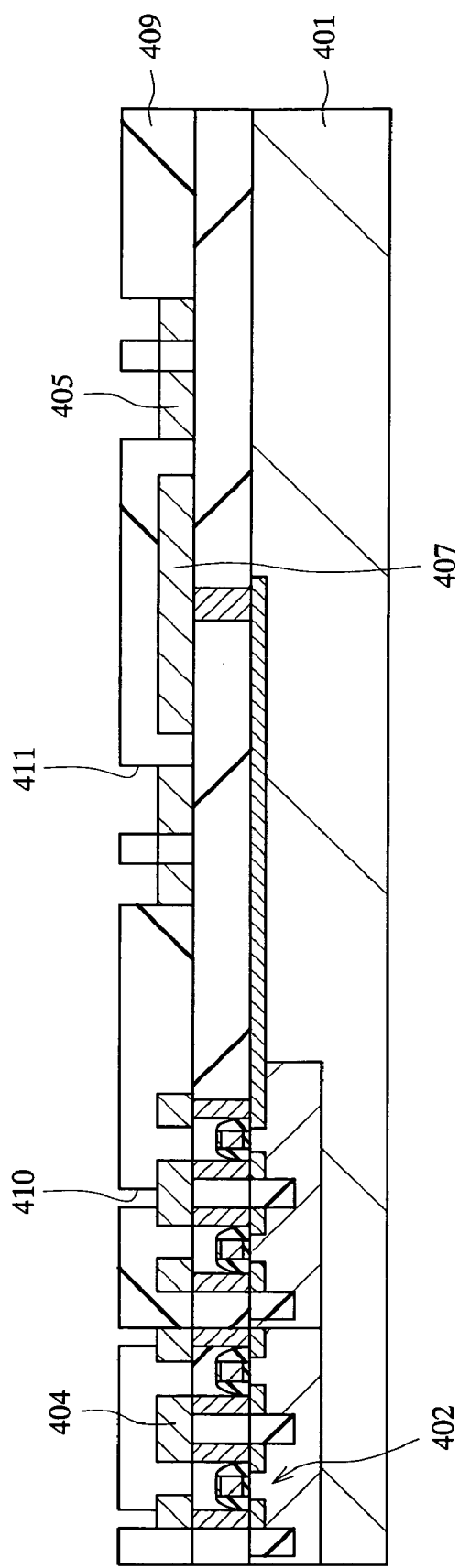
FIG. 20 is a schematic diagram showing the manufacturing process of the acceleration sensor subsequent to FIG. 19.

Thereafter, after an interlayer dielectric 409 is deposited by using the normal CMOS integrated circuit process, first layer via holes 410 of the integrated circuit are formed and openings 411 are formed in the interlayer dielectric 409 at the positions corresponding to the movable mass 405 of the 3-axis acceleration sensor (FIG. 20). Next, the first layer via holes 410 and the openings 411 are filled with metal (for example, tungsten in this case) by using the normal CMOS integrated circuit process, and the surface thereof is planarized by the CMP. In this case, the openings 411 are formed on the patterns of the M1 layer other than the lower electrode 407. Also, in order to prevent the so-called dishing in the CMP, the slit (unremoved pattern of dielectric) is appropriately inserted in the large-area part of the movable mass 405 in addition to the fine hole 408 for etching.

Figure 21:
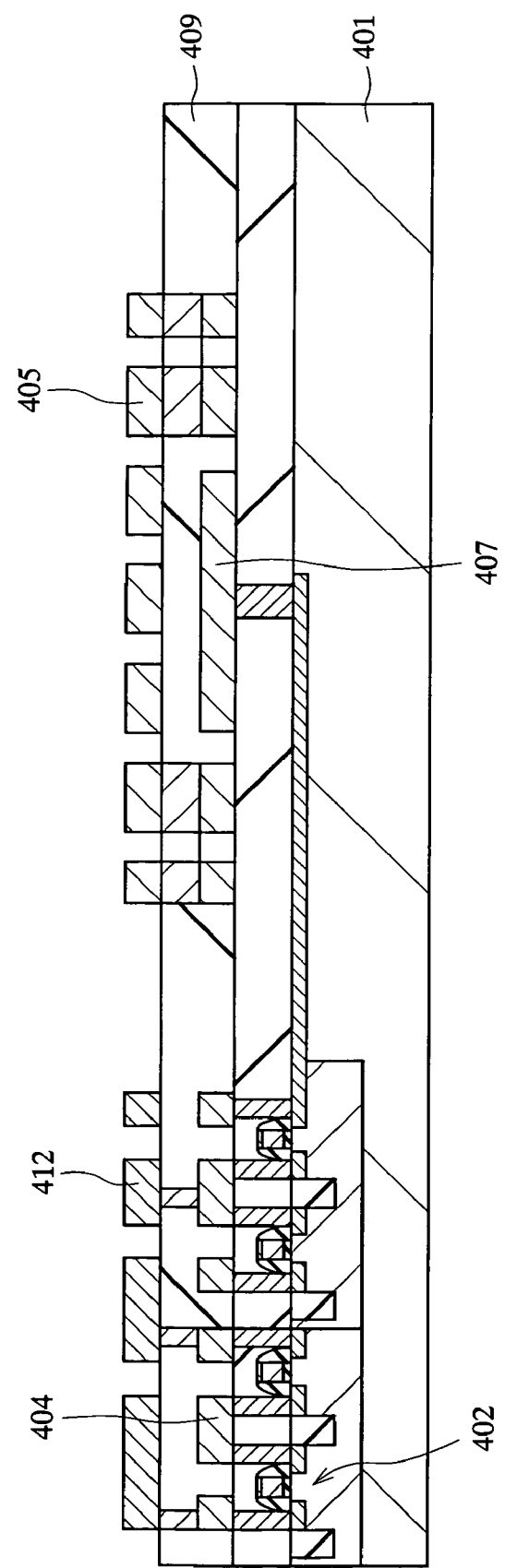
FIG. 21 is a schematic diagram showing the manufacturing process of the acceleration sensor subsequent to FIG. 20.

Next, through the CMOS integrated circuit process, a second layer interconnect (M2 layer) 412 of the integrated circuit is formed and the movable mass 405, a movable capacitor plate and a fixed capacitor plate of the 3-axis acceleration sensor are formed from the metal pattern (FIG. 21). The schematic diagram of the pattern of the M2 layer in a part of the 3-axis acceleration sensor is shown in FIG. 26B. As shown in FIG. 26B, movable capacitor plates 412a are formed on the movable mass 405, and fixed capacitor plates 412b are formed so as to face to the movable capacitor plates 412a. The fixed capacitor plate 412b is fixed to the interlayer dielectric 409.

Figure 22:
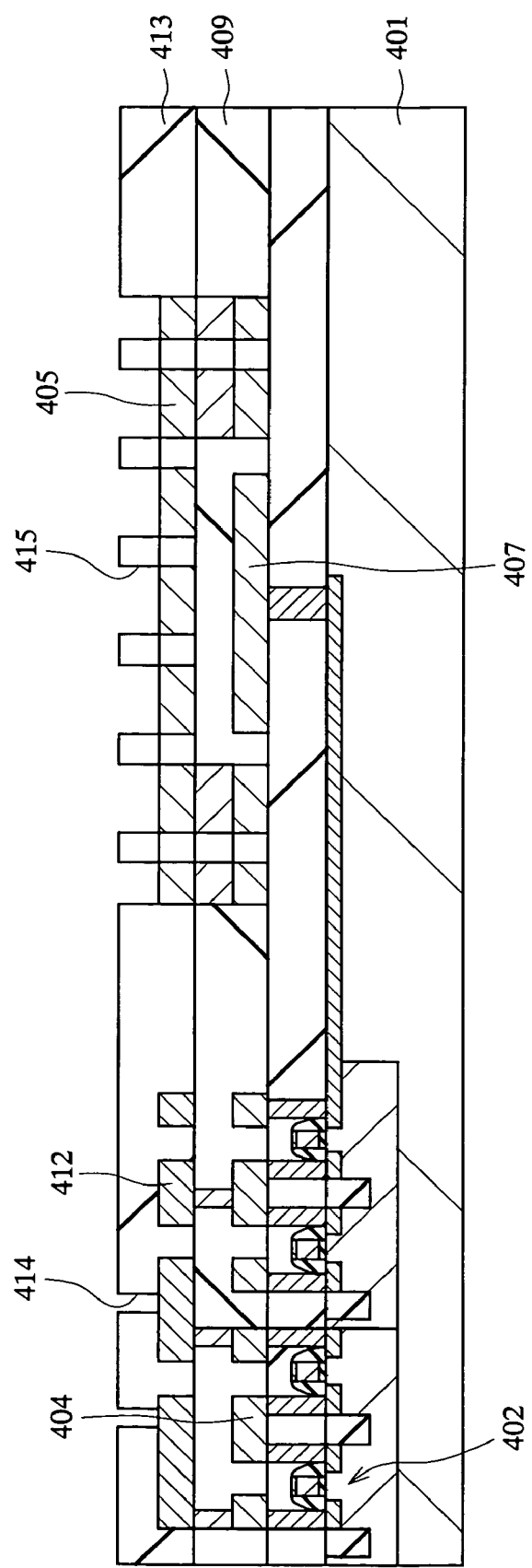
FIG. 22 is a schematic diagram showing the manufacturing process of the acceleration sensor subsequent to FIG. 21.

Thereafter, after an interlayer dielectric 413 is deposited by using the normal CMOS integrated circuit process again, second layer via holes 414 of the integrated circuit are formed and openings 415 are formed in the interlayer dielectric 413 at the positions corresponding to the movable mass 405, the movable capacitor plate 412a and the fixed capacitor plate 412b of the 3-axis acceleration sensor (FIG. 22). Next, the second layer via holes 414 and the openings 415 are filled with metal (for example, tungsten) by using the normal CMOS integrated circuit process, and the surface thereof is planarized by the CMP. In this case, the pattern of the openings 415 is almost the same as that of the M2 layer. However, in order to prevent the so-called dishing in the CMP, the slit (unremoved pattern of dielectric) is appropriately inserted in the large-area part of the movable mass 405.

Figure 23:
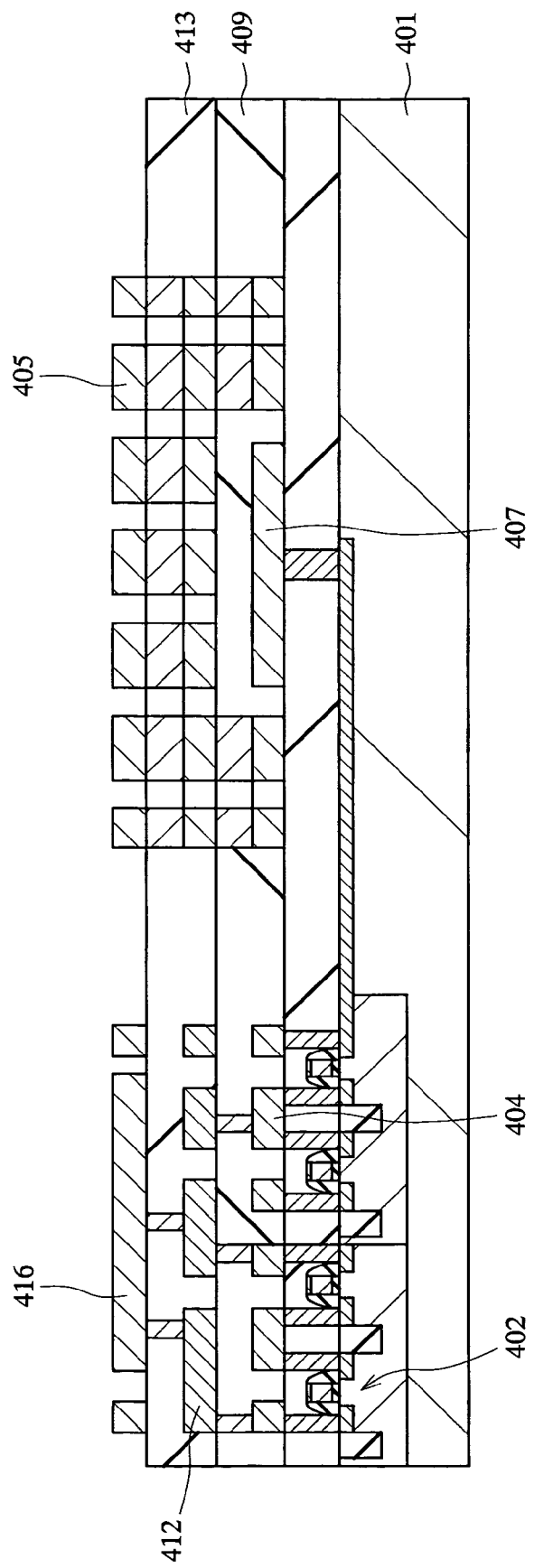
FIG. 23 is a schematic diagram showing the manufacturing process of the acceleration sensor subsequent to FIG. 22.

Next, after a third layer interconnect (M3 layer) 416 of the integrated circuit is formed by using the normal CMOS integrated circuit process again, the movable mass 405, the movable capacitor plate 412a and the fixed capacitor plate 412b similar to those formed in the M2 layer of the 3-axis acceleration sensor are formed from the metal pattern (FIG. 23). The patterns of the second layer via holes 414 and the patterns of the 3-axis acceleration sensor of the M3 layer are similar to those shown in FIG. 26B.

Further, an interlayer dielectric 417 is deposited and the surface thereof is planarized by the CMP or the like according to need. Then, a cavity cover film 419 having a fine hole 418 for forming the cavity at the position corresponding to the center of the movable mass 405 is formed from a fourth layer interconnect (M4 layer) (FIG. 24). A plan view of the cavity cover film 419 of the 3-axis acceleration sensor is shown in FIG. 26C. The fine hole 418 is provided above the center of the movable mass 405, and the movable mass 405 is not present just under the fine hole 418.

Thereafter, the interlayer dielectric around the movable mass 405 is etched and removed through the fine hole 418 to form the cavity 420. The etching in the depth direction is stopped on the silicon substrate 401. Since the etching proceeds isotropically, the cavity 420 has a round shape. Finally, the fine hole 418 is filled with a dielectric 421 to seal the cavity 420 (FIG. 25). Since the dielectric 421 thick enough to have the strength capable of sealing the large cavity 420 is used, the fine hole 418 needs to have a certain size. Also, the relatively thick dielectric 421 for the sealing is formed under the anisotropic deposition condition.

Next, the operation of the 3-axis acceleration sensor according to the fourth embodiment will be described. As shown in FIG. 26A, in the cavity 420, the movable mass 405 is fixed to the interlayer dielectric via the elastic beam 406 formed from the M1 layer. The elastic beam 406 has a square shape as shown in FIG. 26A, and the elastic beam 406 is elastically deformed and the movable mass 405 is three dimensionally displaced in the cavity 420 when a force is applied to the movable mass 405. However, the shape shown in FIG. 26A is a mere example and it can be optimized in various ways, for example, formed into the folded zigzag shape as shown in the second embodiment or the like.

For example, as shown in FIG. 26B, the displacement of the movable mass 405 in the cavity 420 in two directions (x and y directions) in the chip surface is detected as the change in capacitance between the movable capacitor plate 412a formed from the M2 layer, the second layer via hole 414 and the M3 layer in a part of the movable mass 405 and the fixed capacitor plate 412b (formed from the same layer as the movable capacitor plate 412a) fixed to the interlayer dielectric and protruding to the cavity 420. The configuration of the movable capacitor plate 412a and the fixed capacitor plate 412b and the detection principle are the same as those of the second embodiment.

The displacement in the direction vertical to the chip surface (z direction) is detected by detecting the change in capacitance between a lower electrode 407 fixed to the interlayer dielectric of the M1 layer just below a part of the movable mass 405 which is formed from the M2 or more layers and the movable mass 405.

The fixed capacitor plates 412b (lower electrode 407) for each of the x, y and z directions and the movable mass 405 are electrically connected independently to the signal processing integrated circuit on the same silicon substrate 401. When the movable mass 405 moves in arbitrary three directions due to the acceleration, the distance between the movable capacitor plate 412a and the fixed capacitor plate 412b or between the movable mass 405 and the lower electrode 407 is changed and the interelectrode capacitance is changed. By detecting the change in capacitance in the signal processing integrated circuit (capacitance detecting circuit), the acceleration is detected.

The elastic beam 406 is designed so that the base part thereof is sufficiently thick in the cavity to prevent the elastic deformation even when the acceleration is applied to the mass (fixed part). On the other hand, the center part of the beam is designed so as to have the smaller width in comparison to that of the base part and a sufficient length because of its folded shape, and the desired elastic deformation occurs when a predetermined acceleration is applied (elastically deformable part). Therefore, the mechanical characteristics are determined only by the planar pattern shape and the thickness of the elastic beam 406 and the movable mass 405 exposed in the cavity 420, and do not depend on the dimensions and the shape of the cavity 420. Since the dimensional accuracy of the elastic beam 406 and the movable mass 405 is determined by the dimensional accuracy of the patterns of the interconnect layer and the via layer, it is very accurate. Meanwhile, since the dimensions and the shape of the cavity 420 are determined by the etching of the interlayer dielectric, the accuracy thereof is not so high. However, it does not influence the mechanical characteristics of the 3-axis acceleration sensor according to the fourth embodiment. Also, in the fourth embodiment, since the elastic beam 406 and the movable capacitor plate 412a are formed in the different interconnect layers, they can be optimally designed regardless of the restrictions of the planar arrangement.

Also, a protrusion is formed in a part of the M2 layer pattern of the movable mass 405, and this protrusion is placed so as to overlap with a part of the patterns of the M1 layer and the M3 layer protruding from the interlayer dielectric to the cavity 420 (not shown). By doing so, when the movable mass 405 moves largely up and down, the above-described protrusion of the movable mass 405 and the protruding parts of the M1 layer and the M3 layer are collided with each other, and the movable range of the movable mass 405 is limited. Also, since the protrusion and the protruding parts are deformed when they are collided, the impact at the collision is reduced. Therefore, the impact resistance and the reliability can be improved in the fourth embodiment.

Since the movable mass is formed from a plurality of interconnect layers in the fourth embodiment, the mass of the movable mass can be increased and the detection sensitivity of the 3-axis acceleration sensor can be improved.

Figure 27A:
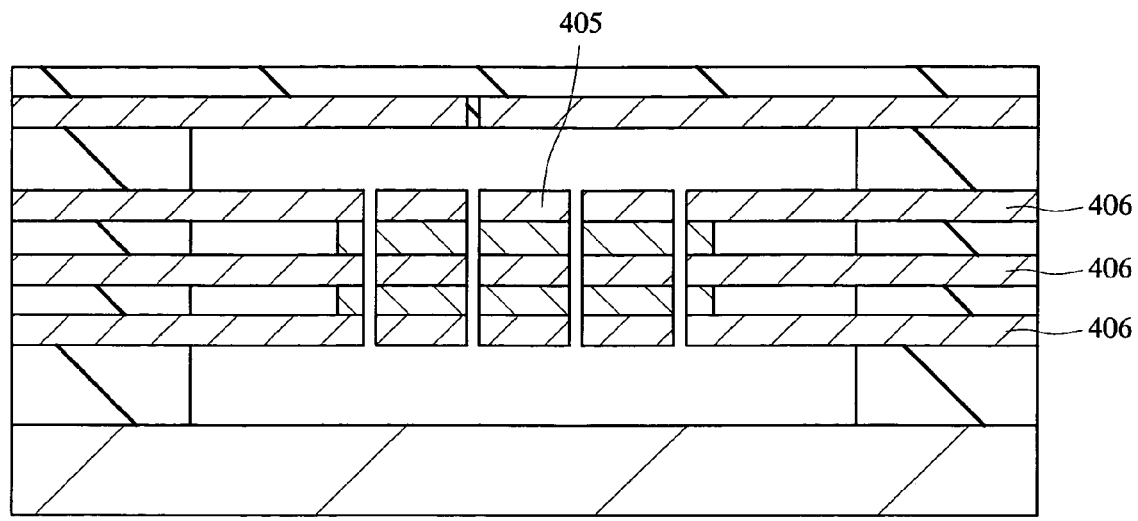
FIG. 27A and FIG. 27B are cross-sectional views showing the acceleration sensor according to the modification examples of the fourth embodiment, respectively.
Figure 27B:
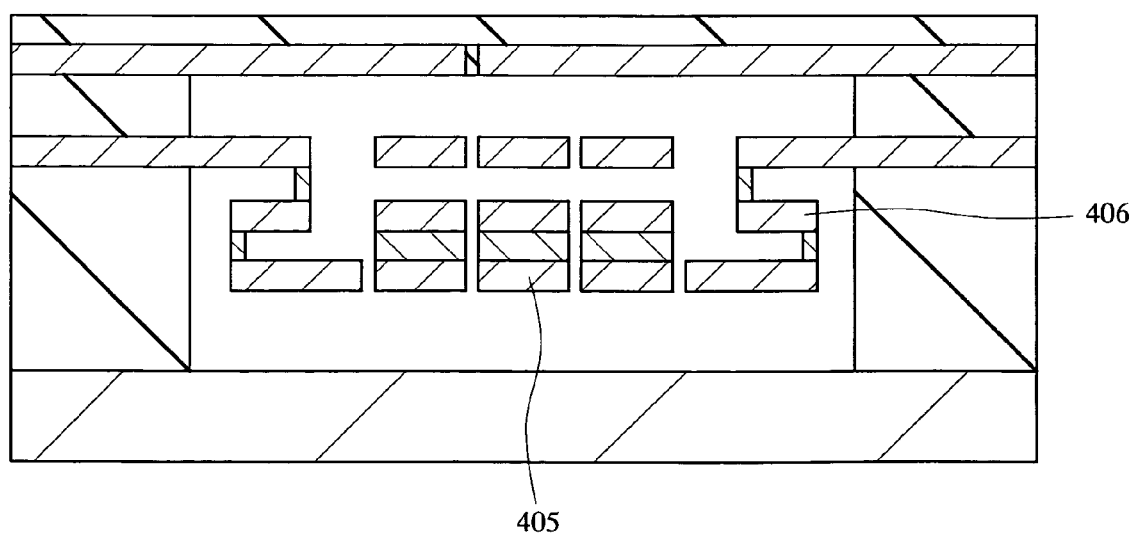

Note that the elastic beam 406 can be designed in various ways. In the fourth embodiment, the elastic beam 406 is formed of only the M1 layer. However, it is also possible to form it from all of the M1 layer, the first layer via hole 410, the M2 layer, the second layer via hole 414 and the M3 layer or the arbitrary combination thereof. For example, the elastic beam and the movable capacitor plate shown in the second embodiment can be formed by using all of them. Alternatively, three elastic beams 406 as shown in FIG. 27A can be formed from only the interconnect layers of the M1 layer, the M2 layer and the M3 layer. In this manner, the sensitivity (deformability) to the acceleration (force) in the longitudinal direction (z direction) is increased. In addition, as shown in FIG. 27B, it is also possible to form the elastic beam 406 so as to have the folded zigzag shape in the longitudinal direction. By doing so, the deformation in the longitudinal direction (z direction) is further facilitated. The shape, dimensions and film thickness of the movable mass 405 and the plastic beam 406 are designed from the viewpoint of the desired acceleration range to be detected and the impact resistance.

Furthermore, it is also possible to further increase the mass of the movable mass by additionally forming films made of other materials as the movable mass 405. More specifically, the material of the movable mass 405 in the fourth embodiment is not limited to the interconnect material of the integrated circuit, but the other inorganic or organic material is also available. However, it is necessary to use the material not removed by the etching of the interlayer dielectric. When an oxide film is used as the interlayer dielectric, various metal films such as a silicon-germanium film (SiGe film), a silicon nitride film (SiN film), a silicon oxide film, a single crystal silicon film, an amorphous silicon film, a polysilicon film and a polyimide film are also available. Further, a film other than oxide films can be used as the interlayer dielectric as described below.

The manufacturing process of a structure in which a thick film is additionally formed to the movable mass in the 3-axis acceleration sensor according to the fourth embodiment will be shown in FIG. 28 to FIG. 33.

Figure 28:
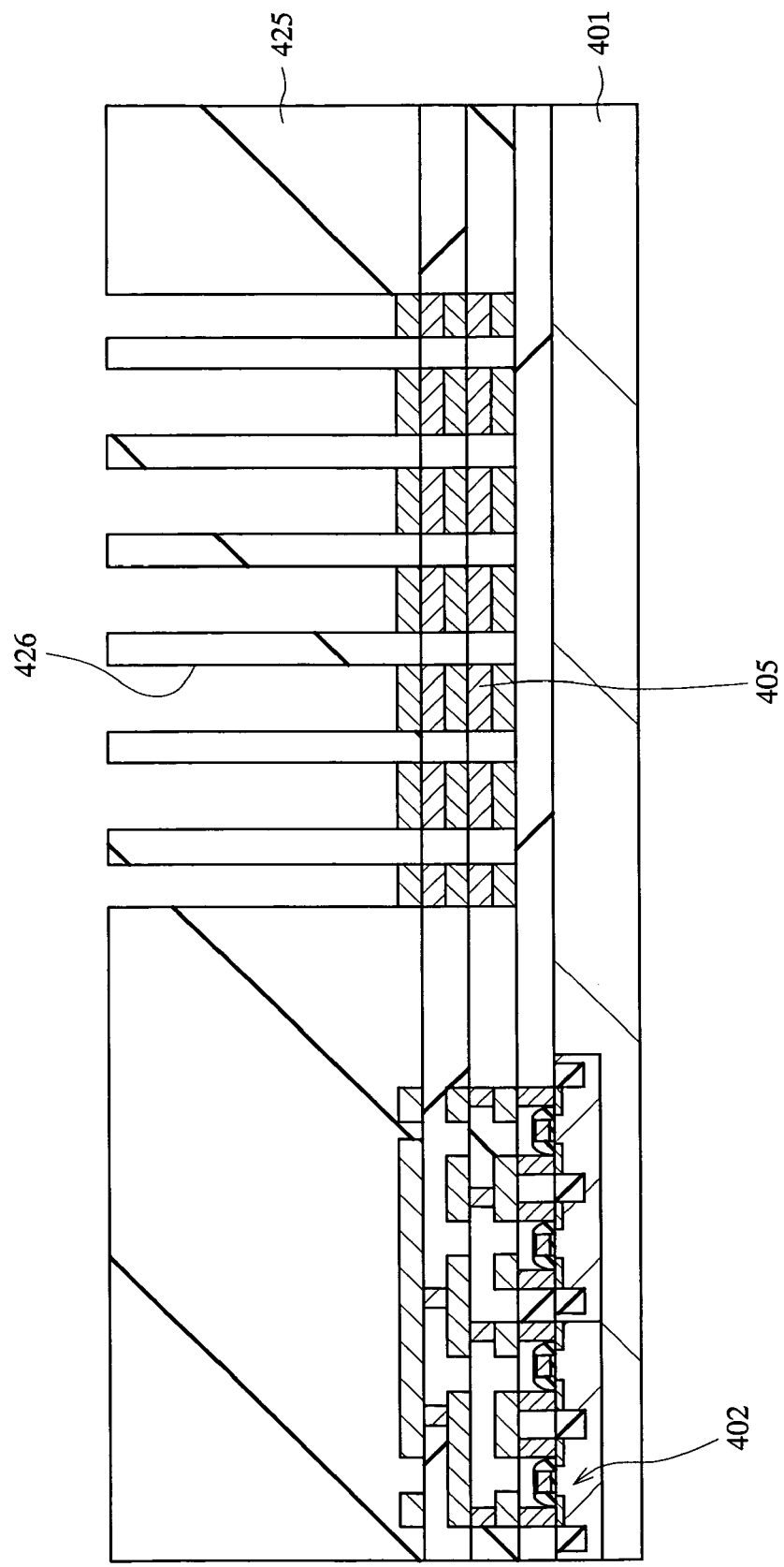
FIG. 28 is a schematic diagram showing the manufacturing process of an acceleration sensor according to the modification example of the fourth embodiment.
Figure 29:
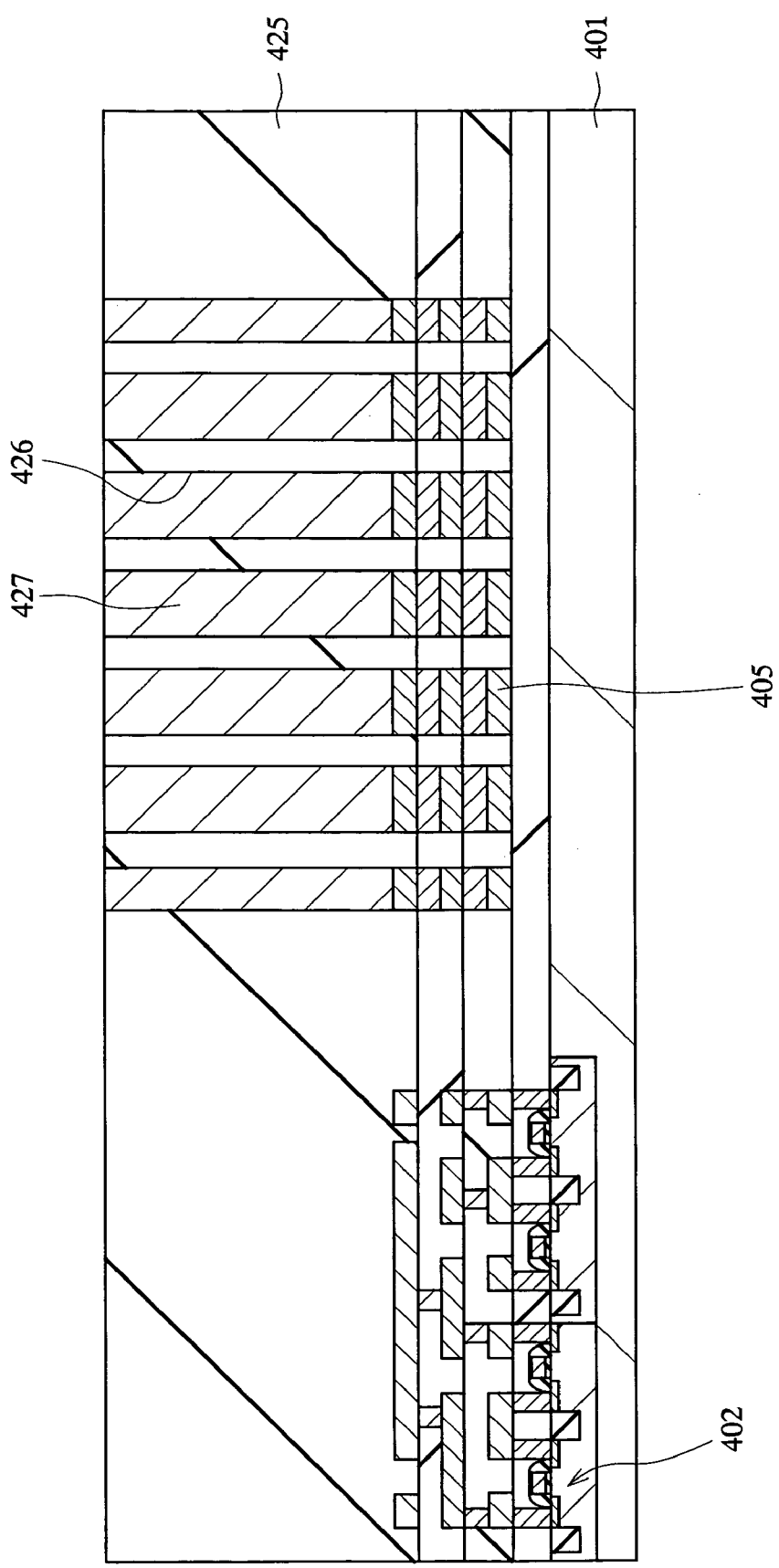
FIG. 29 is a schematic diagram showing the manufacturing process of the acceleration sensor subsequent to FIG. 28.

On the structure formed through the process similar to that shown in FIG. 18 to FIG. 23, a thick resist layer 425 is coated, and openings 426 are formed on the movable mass 405 formed from the M3 layer through the normal exposure and development process (FIG. 28). Next, a nickel (Ni) film 427 is formed in the openings 426 by the electroless plating (FIG. 29) (After forming the nickel film, the surface is polished if necessary).

Figure 30:
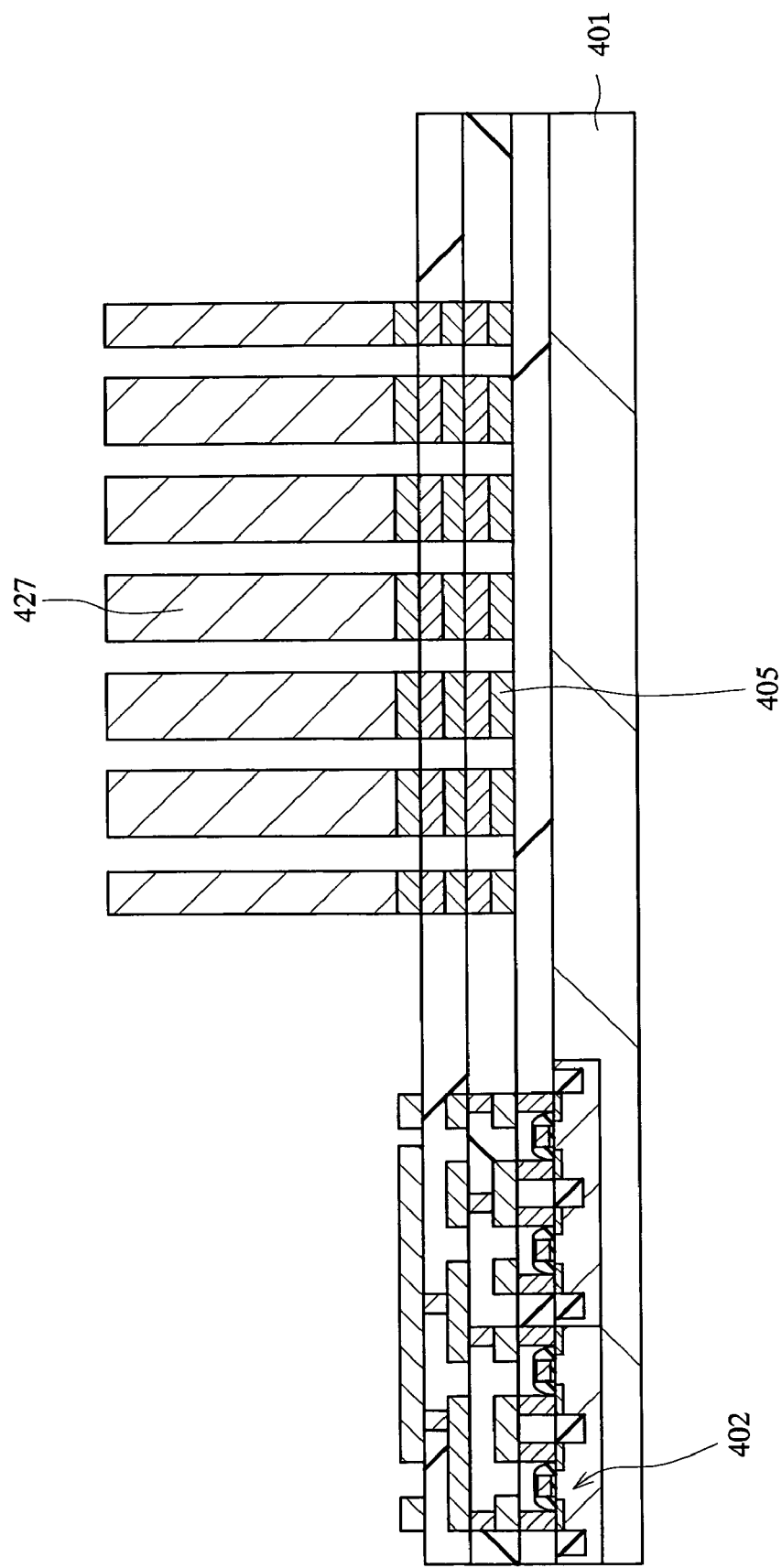
FIG. 30 is a schematic diagram showing the manufacturing process of the acceleration sensor subsequent to FIG. 29.
Figure 31:
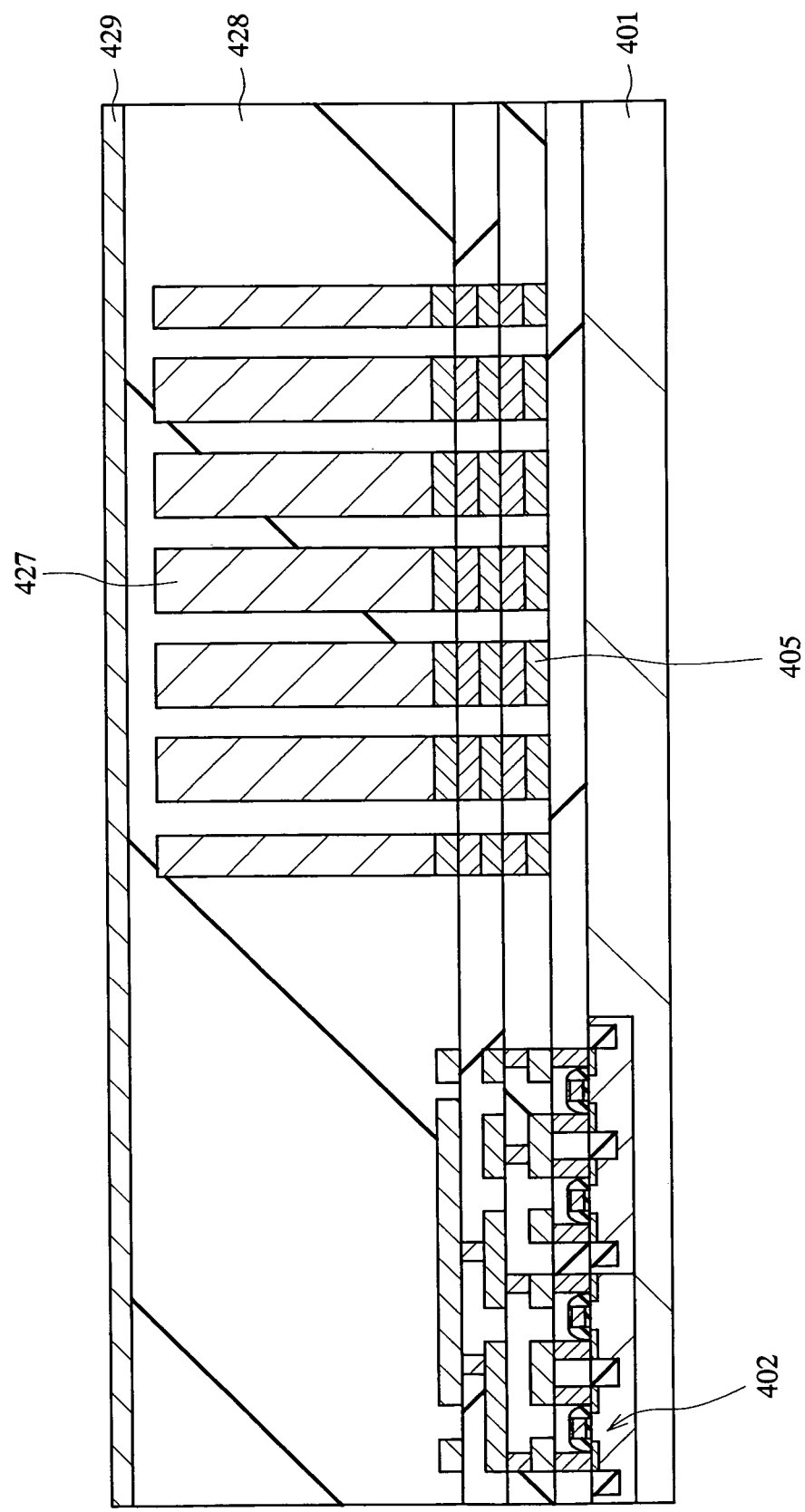
FIG. 31 is a schematic diagram showing the manufacturing process of the acceleration sensor subsequent to FIG. 30.

Thereafter, the thick resist layer 425 is removed to expose the nickel film 427 to be a thick movable mass structure on the movable mass 405 formed from the M3 layer (FIG. 30). Furthermore, a polyimide film 428 is coated so as to cover the nickel film 427 and the thermal treatment is performed. Thereafter, a tungsten (W) thin film is formed as a cavity cover film 429 by the sputtering (FIG. 31).

Figure 32:
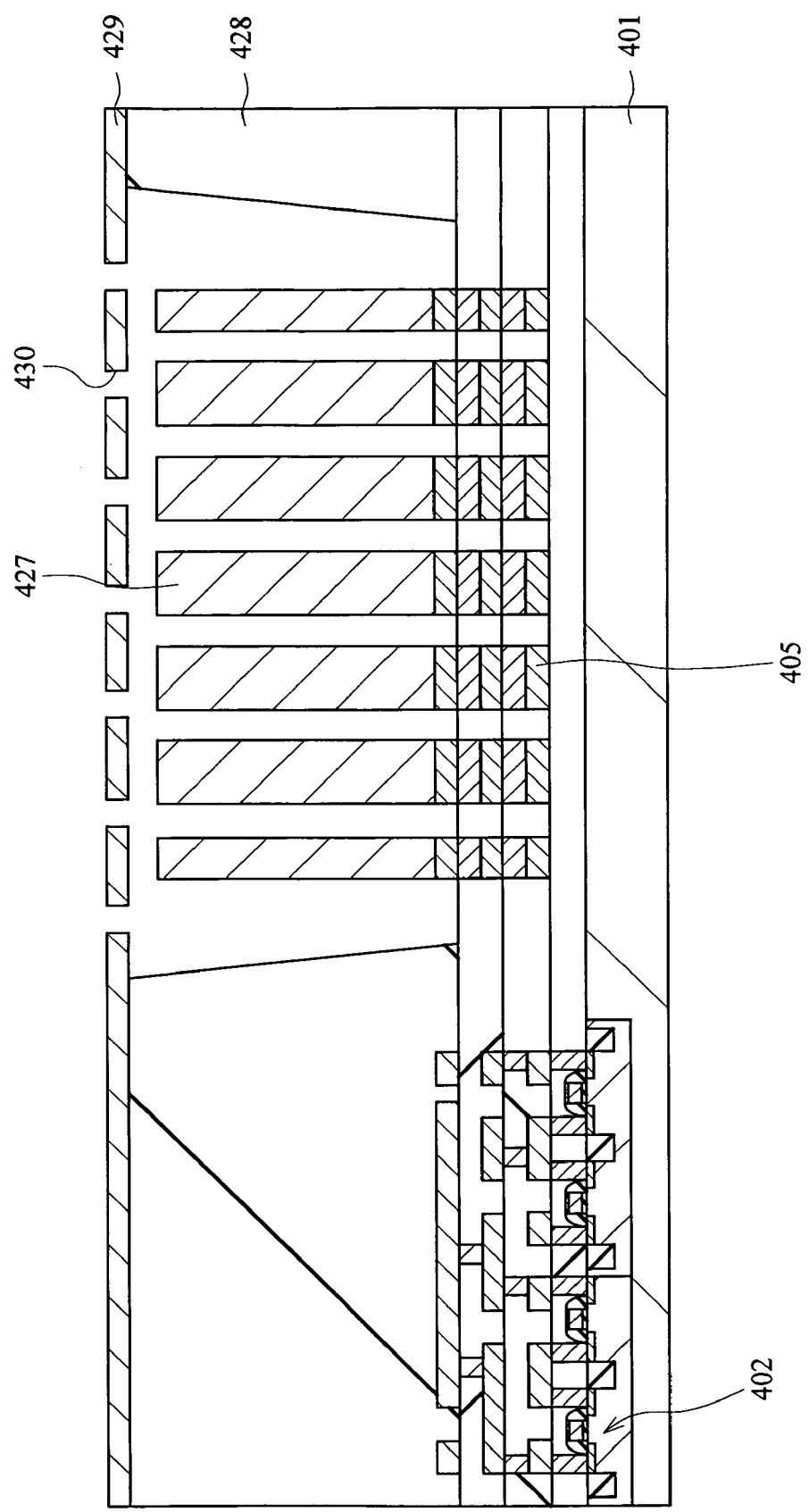
FIG. 32 is a schematic diagram showing the manufacturing process of the acceleration sensor subsequent to FIG. 31.
Figure 33:
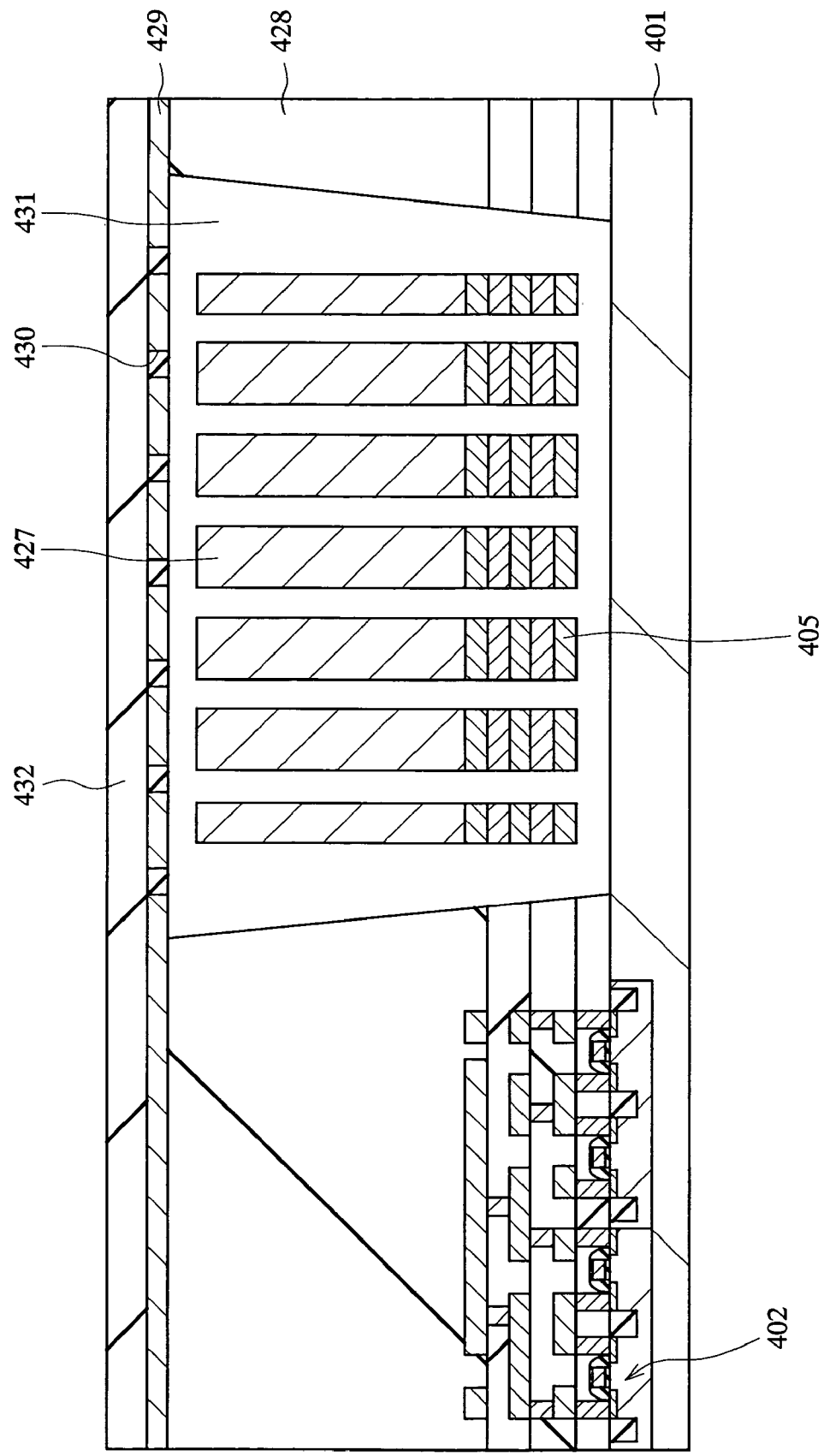
FIG. 33 is a schematic diagram showing the manufacturing process of the acceleration sensor subsequent to FIG. 32.

After forming fine holes 430 for etching through the normal exposure method in the tungsten thin film (cavity cover film 429), the polyimide film 428 around the nickel film 427 is etched and removed through the fine holes 430 (FIG. 32). Then, the interlayer dielectric around the movable structure formed from the underlying interconnect film is etched and removed to form a cavity 431. Thereafter, the fine holes 430 for etching are filled with a dielectric 432 to seal the cavity 431 (FIG. 33).

As described above, since it is possible to form the movable mass 405 including the nickel film 427, it is possible to further increase the mass of the movable mass 405. Therefore, the detection sensitivity of the 3-axis acceleration sensor can be further improved.

Note that, also in the fourth embodiment, the mechanical structure of the acceleration sensor can be formed and the cavity can be formed and sealed through the CMOS process. Therefore, the advantages similar to those of the first embodiment can be realized.

Fifth Embodiment

In this fifth embodiment, an example in which an integral structure composed of a plurality of multilayer interconnects is used will be described. In the structure according to the fifth embodiment, a movable part composed of multilayer interconnects and covered with a dielectric such as an oxide film is fixed to an interlayer film surrounding the cavity by an elastic beam similarly having the interconnect structure therein and covered with a dielectric such as an oxide film in the cavity formed in the interlayer dielectrics. In the embodiments described above, one movable part is composed of one type of contiguous conductors. Therefore, it has only one electrical function as one electrode or interconnect. However, in this fifth embodiment, since it is possible to introduce a plurality of independent interconnects in the structure, more complicated actuation of the movable part and the signal detection can be realized.

FIG. 34 to FIG. 39 are schematic diagrams for describing a manufacturing process of an angle rate sensor (vibration gyroscope) according to the fifth embodiment.

Figure 34:
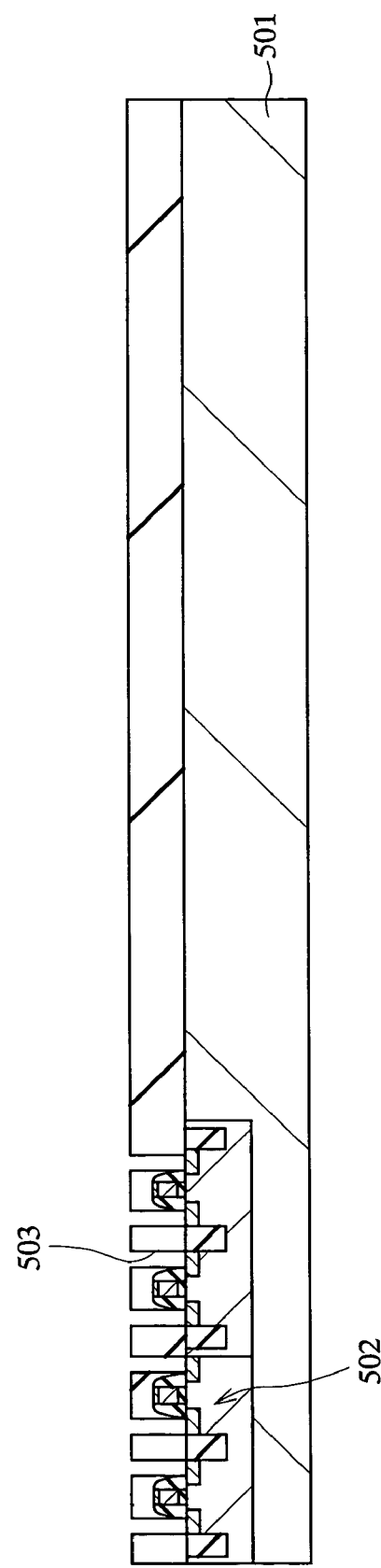
FIG. 34 is a schematic diagram showing the manufacturing process of an angle rate sensor (vibration gyroscope) according to the fifth embodiment.
Figure 35:
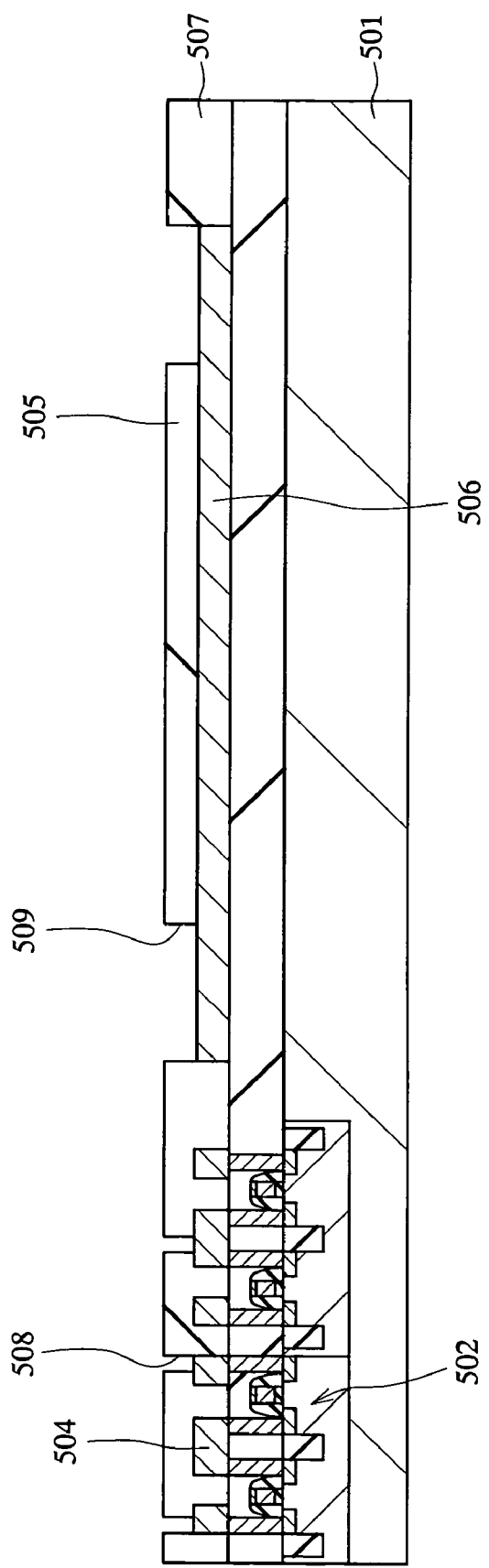
FIG. 35 is a schematic diagram showing the manufacturing process of the angle rate sensor subsequent to FIG. 34.

First, through the normal CMOS integrated circuit process, signal processing transistors 502 of the vibration gyroscope and contact holes 503 are formed on a silicon substrate 501 (FIG. 34). Next, by using the CMOS integrated circuit process, a first layer interconnect (M1 layer) 504 of the integrated circuit is formed, and a sacrificial layer 506 is formed in a region corresponding to the cavity below a movable mass 505 of the vibration gyroscope. Next, after depositing an interlayer dielectric 507, first layer via holes 508 of the integrated circuit are formed, and openings 509 are formed in the regions corresponding to the cavity surrounding the movable mass 505 of the vibration gyroscope (FIG. 35). Next, by using the normal CMOS integrated circuit process, metal (for example, tungsten in this case) is filled in the first layer via holes 508 and the openings 509, and the surface thereof is planarized by the CMP.

Figure 36:
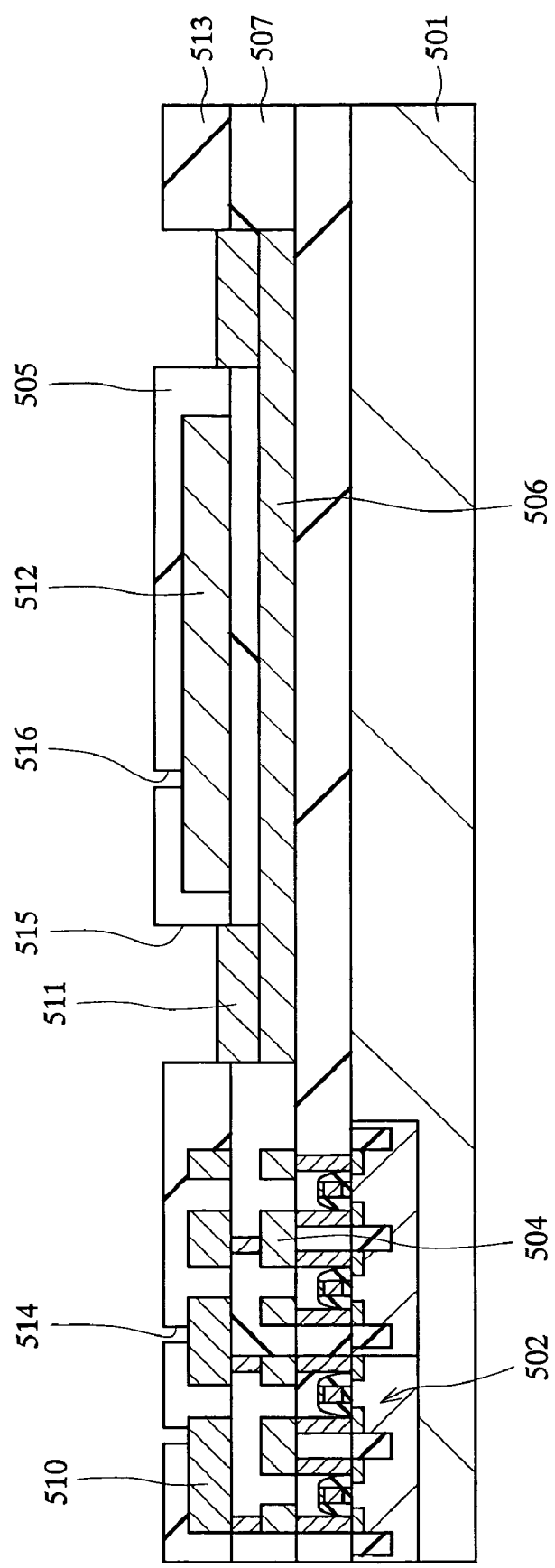
FIG. 36 is a schematic diagram showing the manufacturing process of the angle rate sensor subsequent to FIG. 35.

Subsequently, by using the normal CMOS integrated circuit process, second layer interconnects (M2 layer) 510 of the integrated circuit are formed, and a sacrificial layer 511 is formed in a region corresponding to the cavity surrounding the movable mass 505 and beams (not shown) of the vibration gyroscope. Also, an interconnect 512 is formed in the movable mass 505 and the beams. Subsequently, after depositing an interlayer dielectric 513, second layer via holes 514 of the integrated circuit are formed, and openings 515 are formed in the region corresponding to the cavity surrounding the movable mass 505 of the vibration gyroscope. Simultaneously, a via hole 516 for connecting the upper and lower interconnects in the movable mass 505 (and in the beams according to need) is formed (FIG. 36).

Next, by using the normal CMOS integrated circuit process, a third layer interconnect (M3 layer) 517 of the integrated circuit is formed, and a sacrificial layer 518 is formed in the region corresponding to the cavity surrounding the movable mass 505 and the beams of the vibration gyroscope.

Simultaneously, an interconnect 519 is formed in the movable mass 505 and the beams. At this time, a part of the interconnect 519 is not connected to the interconnect 512 and is formed as an independent interconnect. More specifically, a plurality of independent movable interconnects are formed in the movable mass 505.

Figure 37:
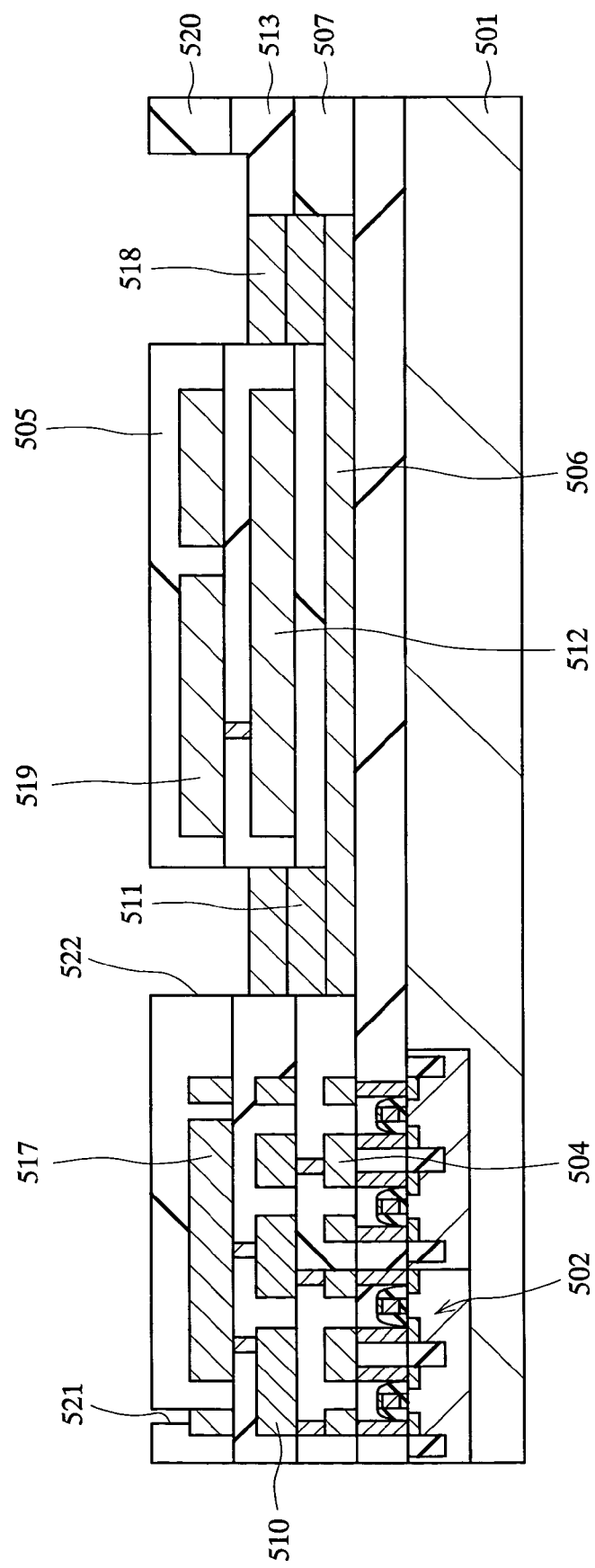
FIG. 37 is a schematic diagram showing the manufacturing process of the angle rate sensor subsequent to FIG. 36.
Figure 38:
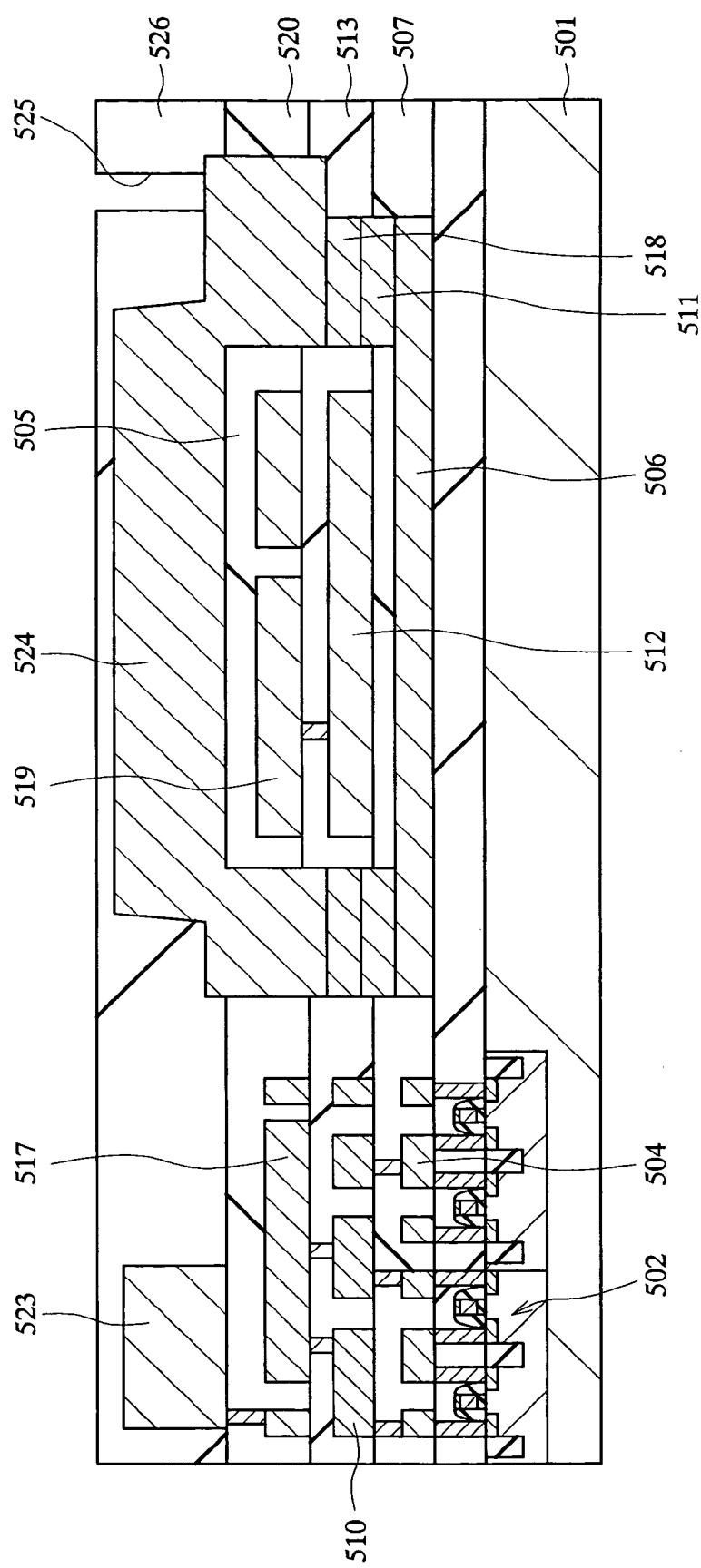
FIG. 38 is a schematic diagram showing the manufacturing process of the angle rate sensor subsequent to FIG. 37.

Similarly, after depositing an interlayer dielectric 520, third layer via holes 521 of the integrated circuit are formed, and an opening 522 is formed in the region corresponding to the cavity surrounding the movable mass 505 of the vibration gyroscope (FIG. 37). Next, by using the normal CMOS integrated circuit process, a fourth layer interconnect (M4 layer) 523 of the integrated circuit is formed, and a sacrificial layer 524 is formed in the region corresponding to the cavity on the movable mass 505 of the vibration gyroscope. Furthermore, after depositing a dielectric, an interlayer dielectric 526 having fine holes 525 for forming cavity is formed (FIG. 38).

Figure 39:
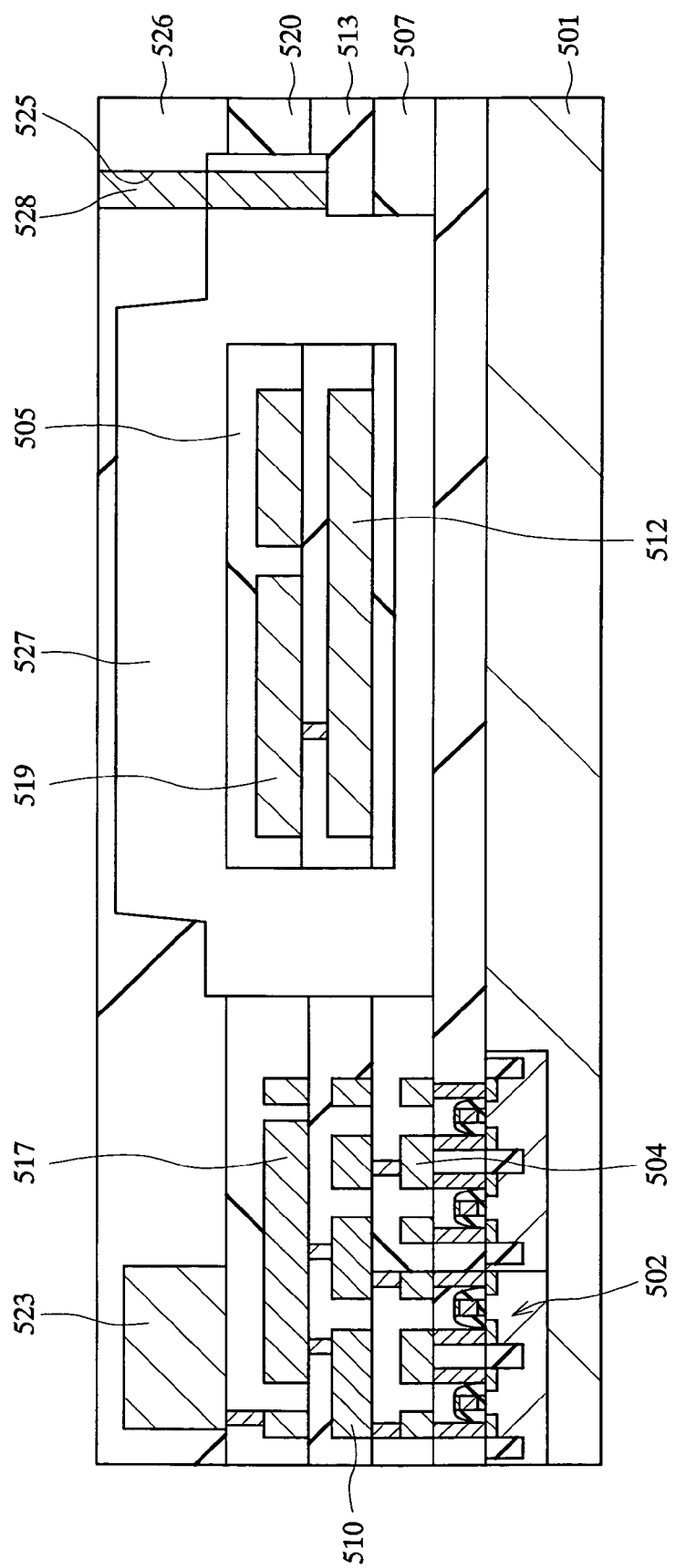
FIG. 39 is a schematic diagram showing the manufacturing process of the angle rate sensor subsequent to FIG. 38.

Thereafter, sacrificial layers 506, 511, 518 and 524 formed from the interconnect materials are etched and removed through the fine holes 525 to form the cavity 527. Finally, the fine holes 525 for etching are filled with a dielectric 528 to seal the cavity (FIG. 39). The interconnects and the sacrificial layers are formed of, for example, an aluminum film. However, a tungsten film is also available.

An Al etching solution used for the etching of the sacrificial layers has the high selectivity to the interconnects. Therefore, when etching the sacrificial layers, the removal rate of the dielectric (oxide film) on the surfaces of the movable mass 505 and the beams formed in the cavity 527 is extremely low. In this manner, the movable mass 505 in which a plurality of independent interconnects are formed can be formed.

Figure 40:
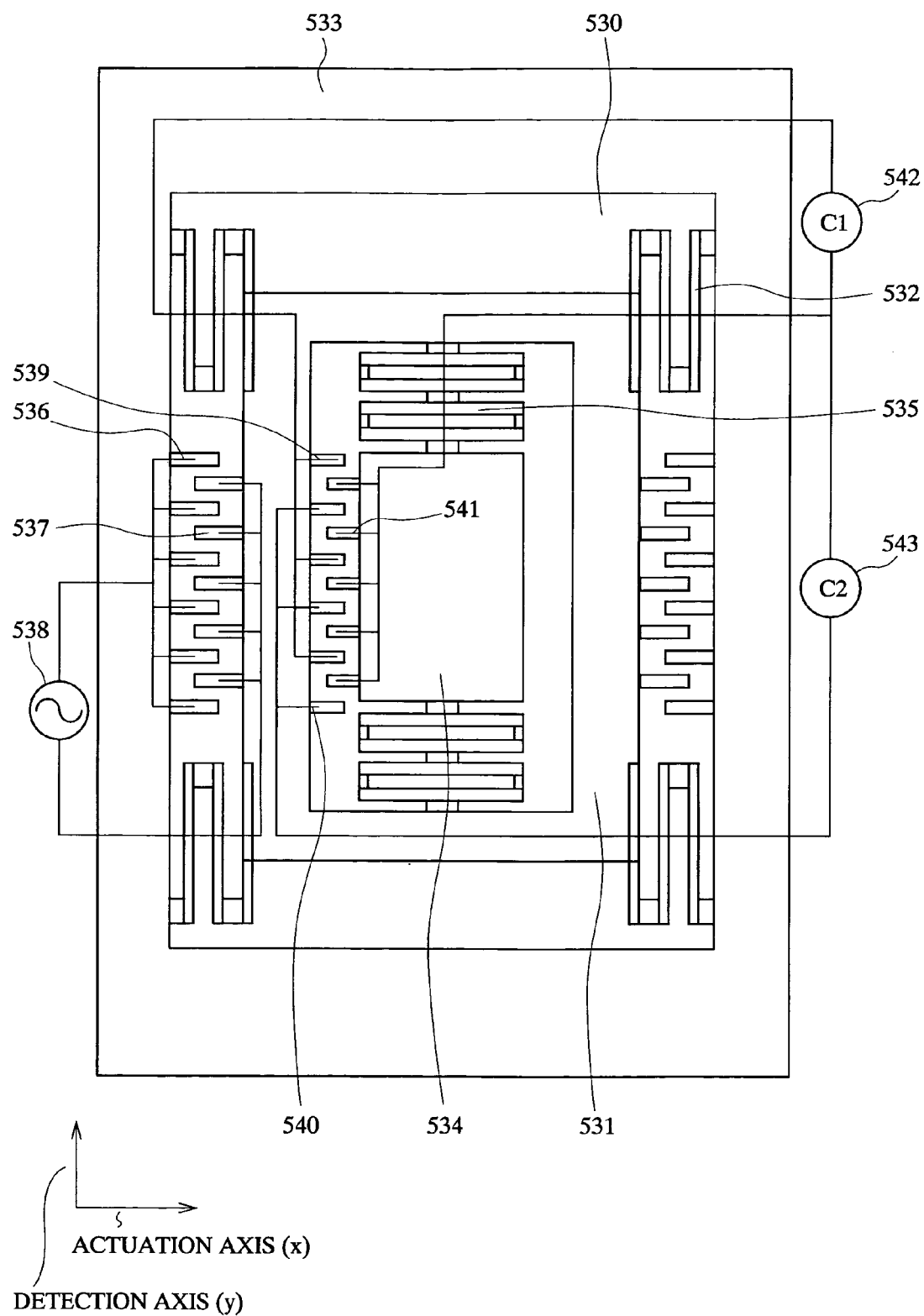
FIG. 40 is a schematic diagram showing the configuration of the angle rate sensor according to the fifth embodiment.

Next, the configuration of the angle rate sensor (vibration gyroscope) formed through the above-described manufacturing process will be described with reference to FIG. 40.

A frame structure 531 is formed in the cavity 530. This frame structure 531 is fixed to the interlayer dielectric 533 surrounding the cavity 530 via beams 532 with rigidity in a detection axis (y) direction extremely higher than that in an actuation axis (x) direction. More specifically, the frame structure 531 is easily vibrated in the actuation (x) direction but hardly vibrated in the detection (y) direction. Inside the frame structure 531, the movable mass 534 is fixed to the frame structure 531 via beams 535 with rigidity in an actuation axis (x) direction extremely higher than that in a detection axis (y) direction.

A comb-shaped first actuation electrode 536 fixed to the interlayer dielectric 533 surrounding the cavity 530 is connected to the predetermined LSI interconnect. A comb-shaped second actuation electrode 537 fixed to the frame structure 531 is connected to the predetermined LSI interconnect outside the cavity 530 via the interconnect in the beam 532. The alternating voltage is applied between the first actuation electrode 536 and the second actuation electrode 537 by an oscillator 538.

A comb-shaped first detection electrode 539 fixed to the frame structure 531 and a second detection electrode 540 electrically independent from the electrode 539 are connected to the predetermined LSI interconnect provided outside the cavity 530 via the interconnect in the beam 532.

A comb-shaped third detection electrode 541 fixed to the movable mass 534 is connected to the predetermined LSI interconnect provided outside the cavity 530 via the interconnect in the beam 535, the frame structure 531 and the interconnect in the beam 532. An electrostatic capacitance detecting circuit 542 is connected between the first detection electrode 539 and the third detection electrode 541, and an electrostatic capacitance detecting circuit 543 is connected between the second detection electrode 540 and the third detection electrode 541.

All of the electrodes described above are covered with a dielectric. Also, all of the electrode described above are formed from the stacked films of the M2 layer and the M3 layer. The interconnect connected to the second actuation electrode 537 is formed from the M3 layer and the other interconnects connected to the other electrodes are all formed from the M2 layer.

Figure 41A:
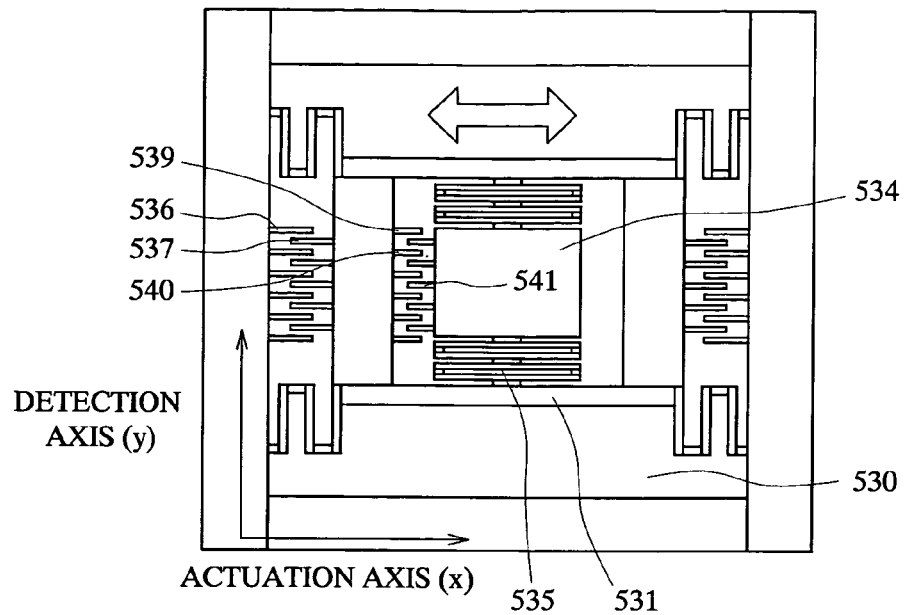
FIG. 41A and FIG. 41B are plan views showing the operation of the angle rate sensor according to the fifth embodiment, respectively.

Next, the operation of the vibration gyroscope according to the fifth embodiment will be described with reference to FIG. 41. Hereinafter, the actuation axis and the detection axis are considered as the coordinate system fixed to the cavity 530. First, by applying the alternating voltage between the first actuation electrode 536 and the second actuation electrode 537, the frame structure 531 is vibrated in the actuation axis direction. At this time, since the beam 535 connecting the frame structure 531 and the movable mass 534 has the high rigidity in the actuation direction, the movable mass 534 is also vibrated in the actuation axis direction together with the frame structure 531 (FIG. 41A).

Figure 41B:
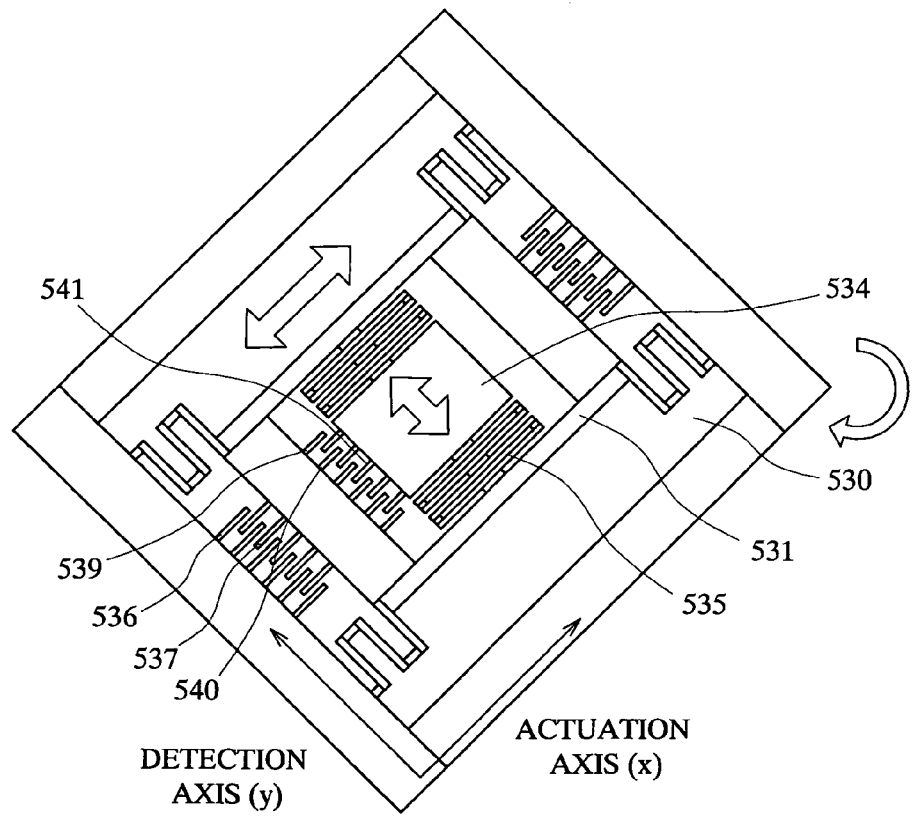

Next, when the rotation around the axis vertical to the actuation axis and the detection axis (axis vertical to the paper of FIG. 41) occurs, the movable mass 534 starts to vibrate in the detection axis direction due to the Coriolis force. At this time, since the beam 532 which fixes the frame structure 531 to the surrounding surface of the cavity 530 has the high rigidity in the detection axis direction, the frame structure 531 is not vibrated in the detection axis direction. Therefore, the third detection electrode 541 moves in the detection axis direction relative to the first detection electrode 539 and the second detection electrode 540, and the capacitance between the third detection electrode 541 and the first detection electrode 539 or the capacitance between the third detection electrode 541 and the second detection electrode 540 is changed. By detecting the change in capacitance, the Coriolis force is measured, and the angle rate is detected (FIG. 41B).

In the vibration gyroscope according to the fifth embodiment, since a plurality of independent interconnects can be formed in the structure, it is possible to connect independent circuits to the structure. Therefore, since it is unnecessary to perform the separation of the detected signals in the vibration direction, the extremely highly accurate detection of an angle rate can be realized and the signal processing can be greatly simplified. Note that, also in the fifth embodiment, the structure of the vibration gyroscope can be formed and the cavity can be formed and sealed through the CMOS process. Therefore, the advantages similar to those of the first embodiment can be realized.

Sixth Embodiment

In this sixth embodiment, an example in which a MEMS structure is formed through the process other than the interconnect process and a cavity is formed and sealed for the structure through the interconnect process will be described. As described in the foregoing embodiments, in the case where an interconnect material, that is, metal is used to form beams and a movable part, when the MEMS structure is applied and used as a vibration part, the vibration value Q is small due to the characteristics of the metal material. In this case, a material capable of obtaining the relatively large vibration value Q such as silicon (Si) or the like is suitable. In the sixth embodiment, an example in which the structure of the vibration gyroscope formed through the SOI (Silicon On Insulator) process is sealed through the interconnect process will be described.

Figure 42:
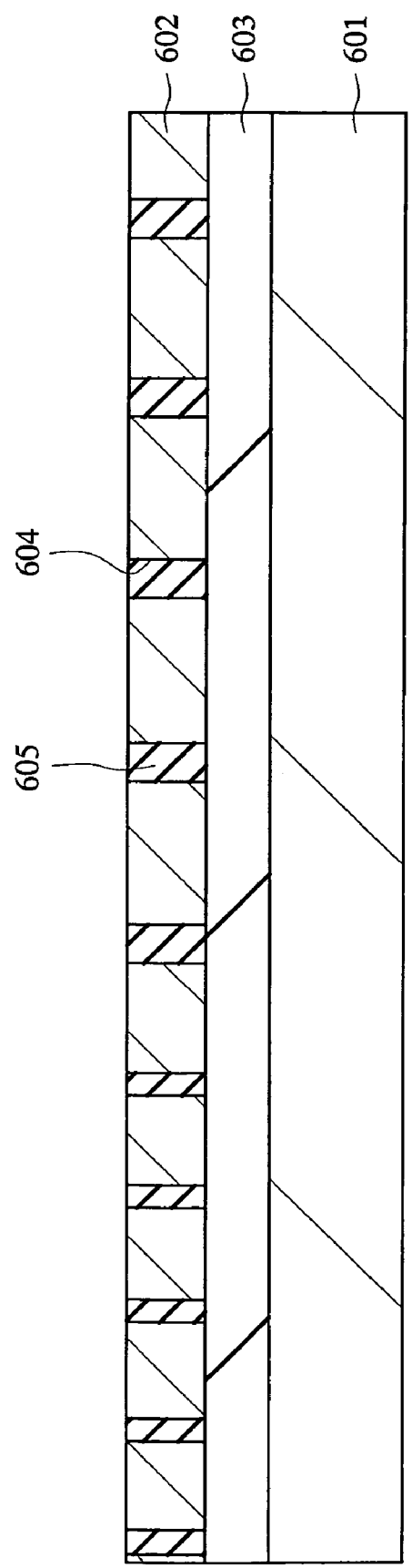
FIG. 42 is a schematic diagram showing the manufacturing process of an angle rate sensor according to the sixth embodiment.

FIG. 42 to FIG. 47 are schematic diagrams for describing the manufacturing process of the vibration gyroscope according to the sixth embodiment, and FIG. 48 is a schematic plan view showing the planar configuration of each layer of the structure constituting the vibration gyroscope. First, in order to form the vibration part on the SOI substrate 601, openings 604 extending from the surface of the SOI substrate 601 to the embedded dielectric 603 are formed in the SOI layer 602 around the patterns to be the vibration parts (mass and beam), and then, the openings 604 are filled with a CVD oxide film (HLD film) 605 (FIG. 42).

Figure 43:
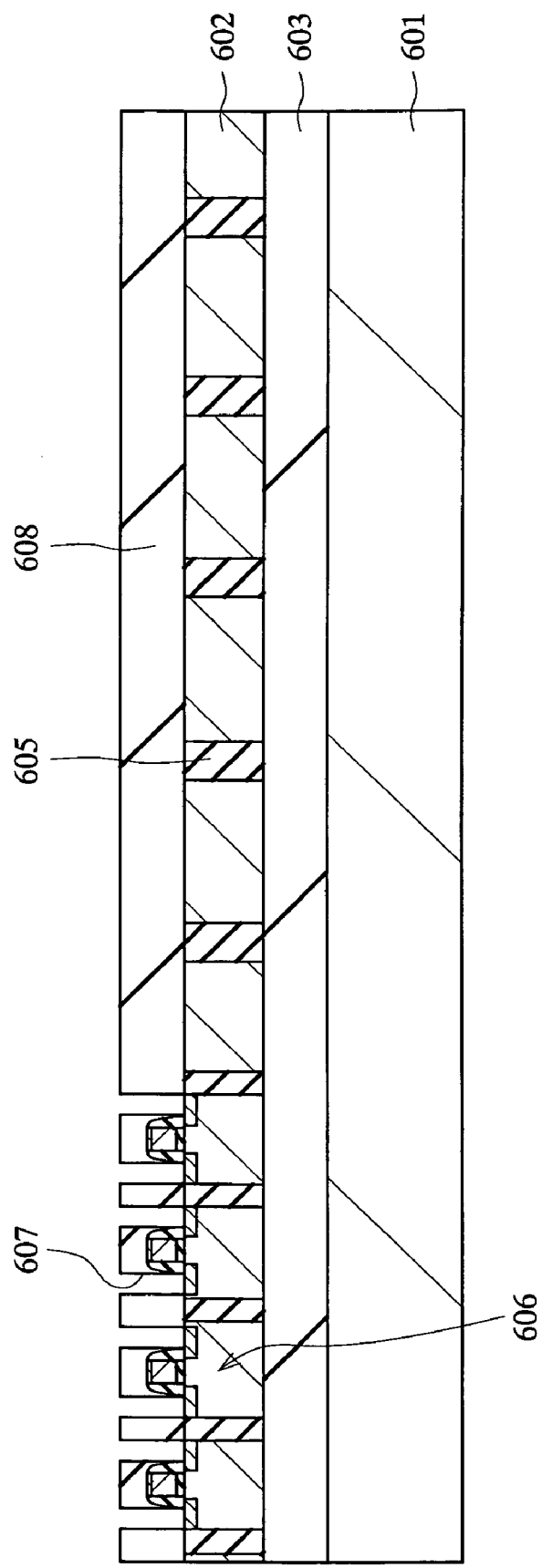
FIG. 43 is a schematic diagram showing the manufacturing process of the angle rate sensor subsequent to FIG. 42.

Next, through the normal CMOS integrated circuit process, transistors 606 for actuation and signal processing of the vibration gyroscope and contact holes 607 are formed on the SOI substrate 601 (FIG. 43). At this time, a field oxide film 608 is formed on the SOI layer 602 in the vibration part forming region and its adjacent region.

Figure 44:
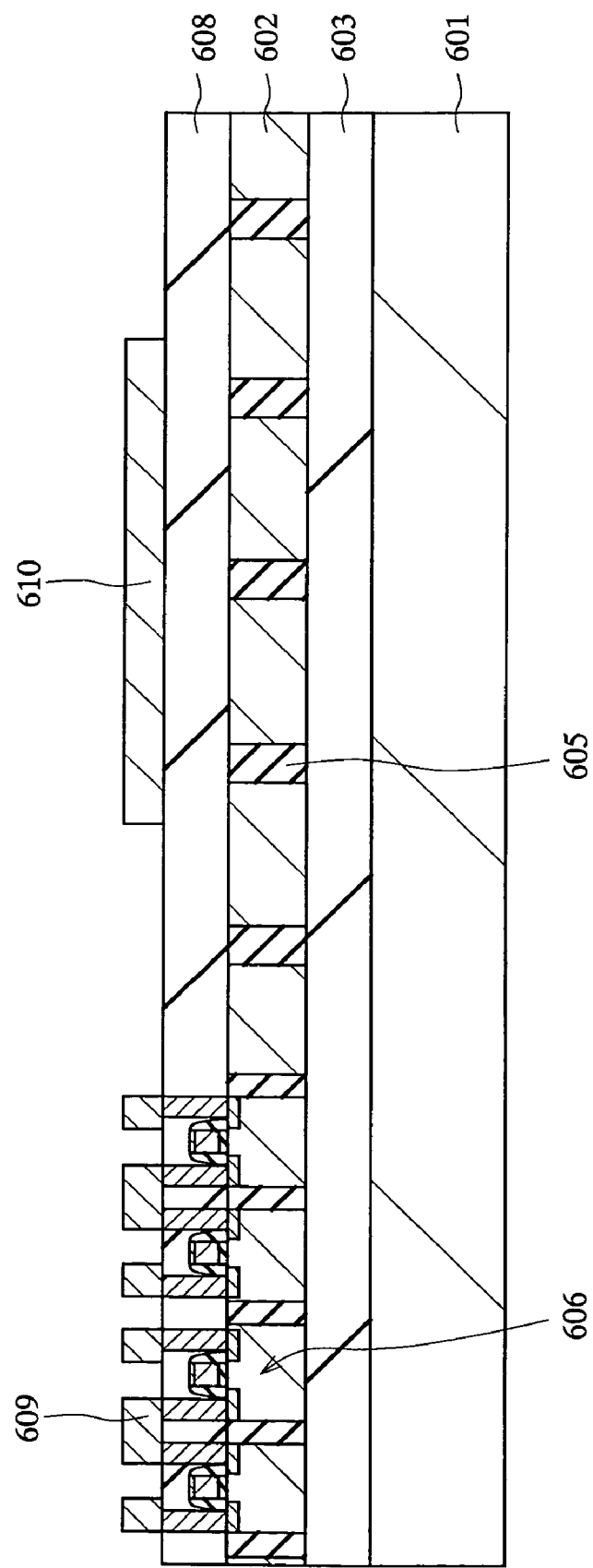
FIG. 44 is a schematic diagram showing the manufacturing process of the angle rate sensor subsequent to FIG. 43.
Figure 45:
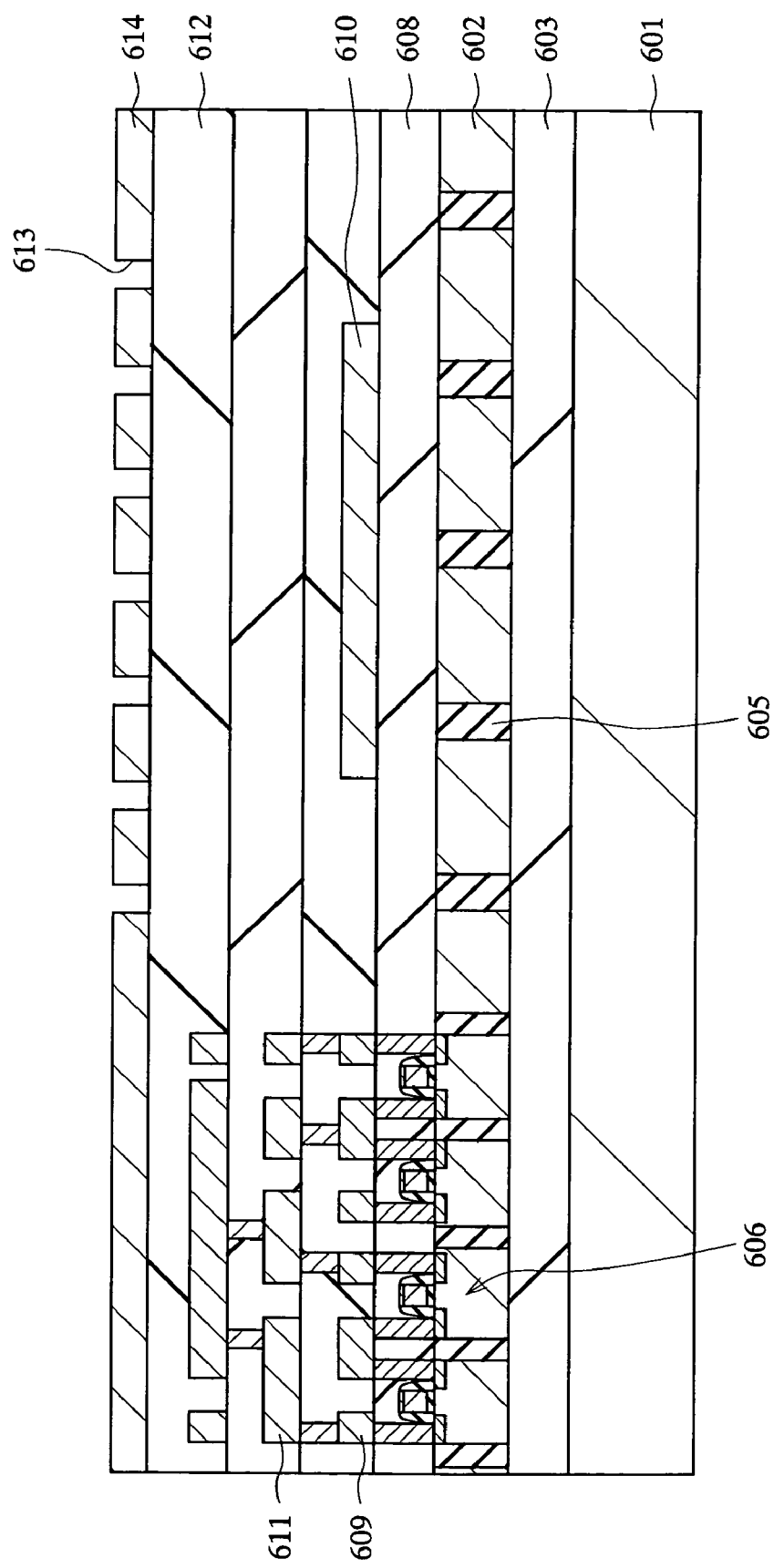
FIG. 45 is a schematic diagram showing the manufacturing process of the angle rate sensor subsequent to FIG. 44.

Subsequently, by using the normal CMOS integrated circuit process, a first layer interconnect (M1 layer) 609 of the integrated circuit is formed, and a detection electrode 610 is formed on the central part of the region for forming the vibration part of the vibration gyroscope (FIG. 44). Thereafter, a second layer interconnect (M2 layer) 611 and subsequent multilayer interconnects are formed through the normal CMOS integrated circuit process on the integrated circuit. At this time, only an interlayer dielectric is deposited on the vibration part forming region and its adjacent region. After forming the uppermost interconnect, an interlayer dielectric 612 is further deposited and its surface is planarized by the chemical mechanical polishing (CMP) according to need. Then, a cavity cover film 614 having fine holes 613 for etching is formed on the interlayer dielectric 612 (FIG. 45).

Figure 46:
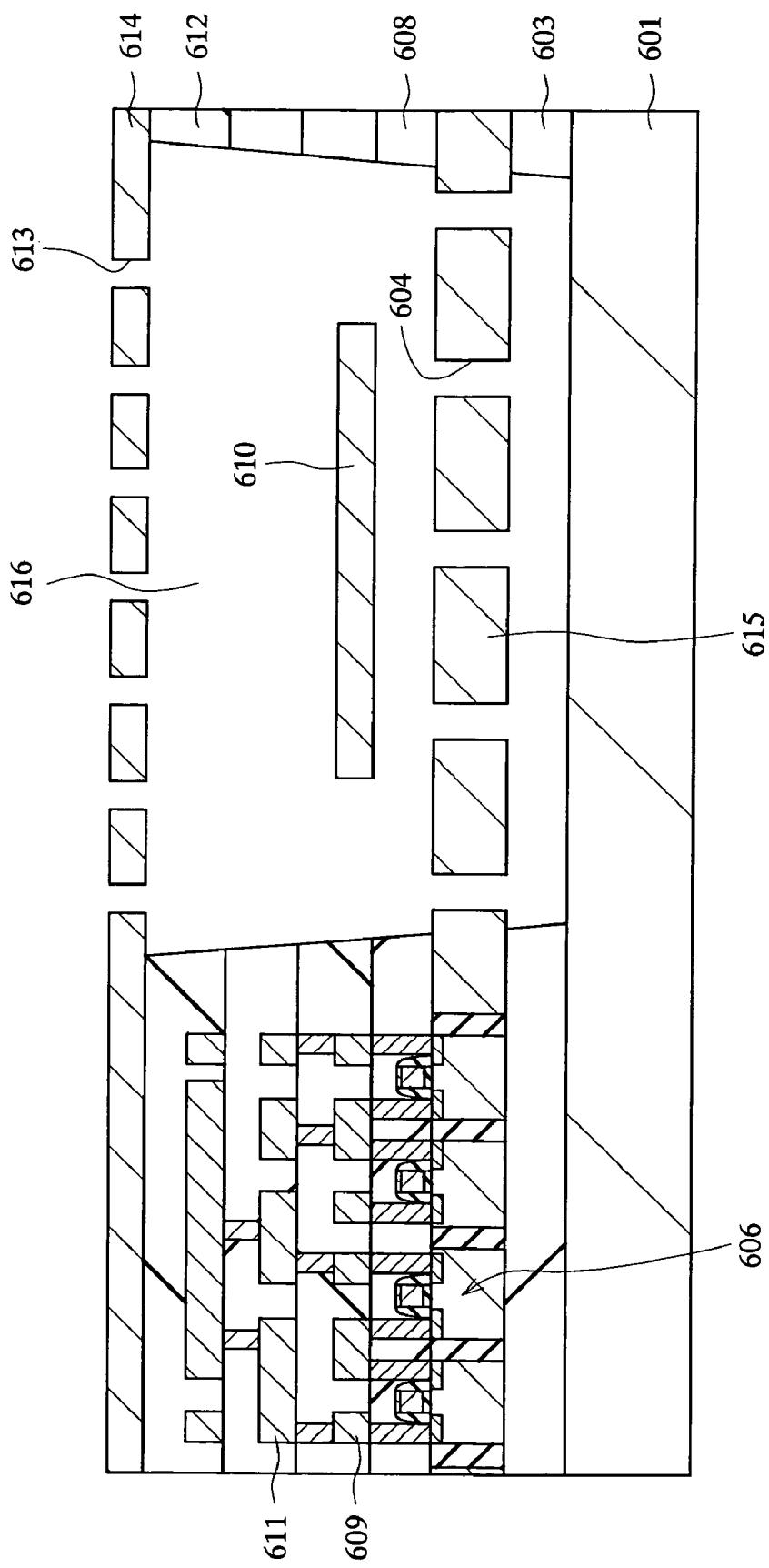
FIG. 46 is a schematic diagram showing the manufacturing process of the angle rate sensor subsequent to FIG. 45.
Figure 47:
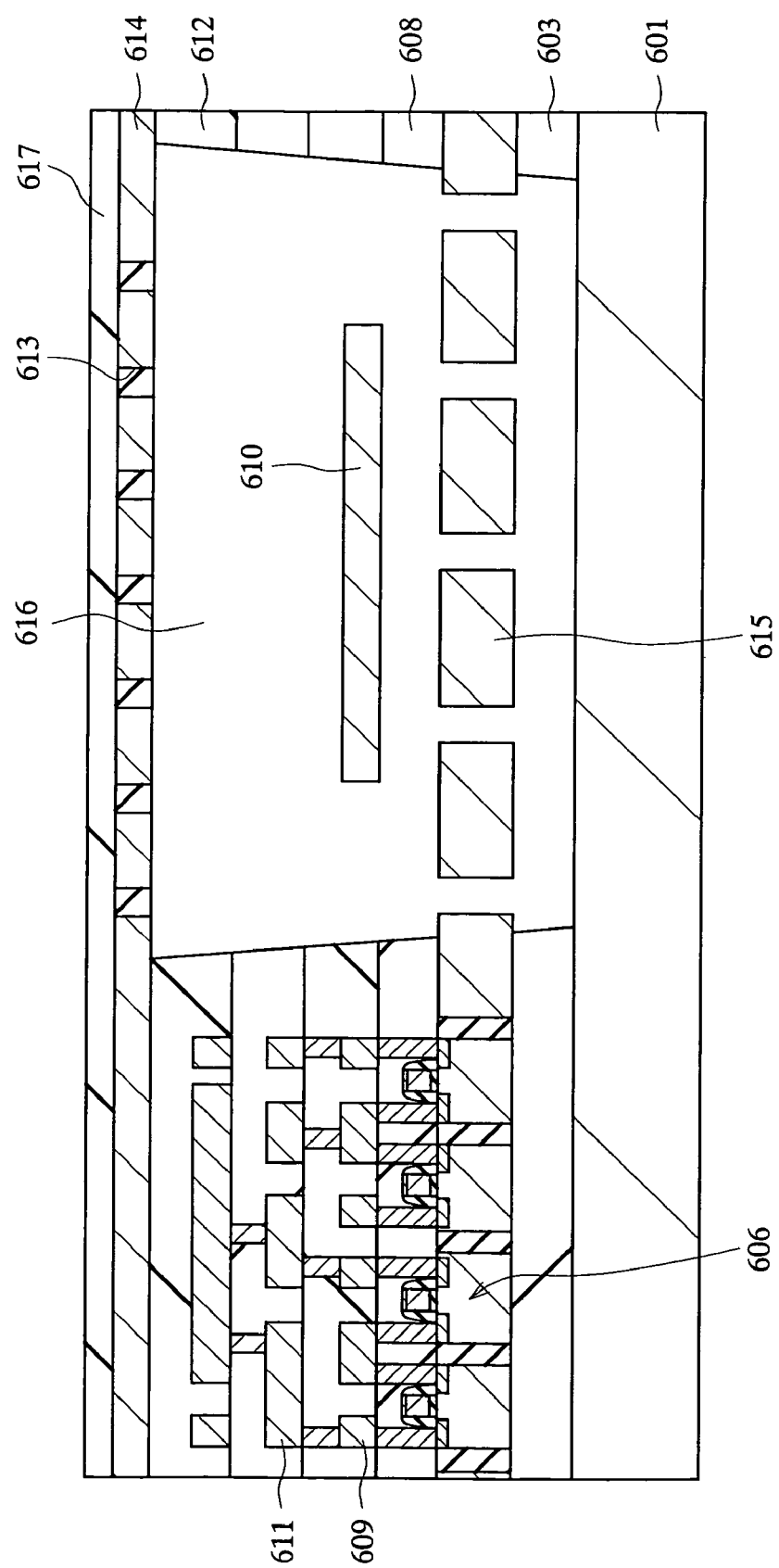
FIG. 47 is a schematic diagram showing the manufacturing process of the angle rate sensor subsequent to FIG. 46.

Thereafter, the interlayer dielectric on the vibration part 615, the CVD oxide film 605 embedded in the openings 604 and the embedded dielectric 603 of the SOI substrate 601 below the vibration part (mass and beam) 615 are etched and removed through the fine holes 613 to form the cavity 616 around the vibration part 615 (FIG. 46). The etching in the depth direction is stopped on the silicon substrate 601 below the embedded dielectric 603. Finally, the fine holes 613 for etching are filled with a dielectric 617 to seal the cavity 616 (FIG. 47).

In an application using the vibration characteristics of the mechanical structure (vibration part) like in the sixth embodiment, the influence of the gas resistance around the structure is not negligible. Therefore, the cavity 616 is desirably in a vacuum state. However, since the CVD film having the isotropic deposition characteristics is used to fill the fine holes 613, the gas pressure at the time of deposition is left in the cavity 616, and vacuum sealing is difficult. On the other hand, since the forming pressure of the anisotropic deposition film used to fill the larger hole shown in the third embodiment is close to a vacuum, it is possible to form a near-vacuum state. Therefore, similar to the third embodiment, at least two sizes of holes, that is, larger holes and fine holes are formed in the cavity cover film 614 also in the sixth embodiment. Then, the planar shape of the cavity 616 is defined through the fine holes, and the vacuum sealing of the cavity is performed through the larger holes. Note that, in the sixth embodiment, different from the third embodiment, the etching of the dielectric formed on the surface of the structure and the surface hydrophobic treatment are not always necessary before the sealing of the larger holes.

Figure 48A:
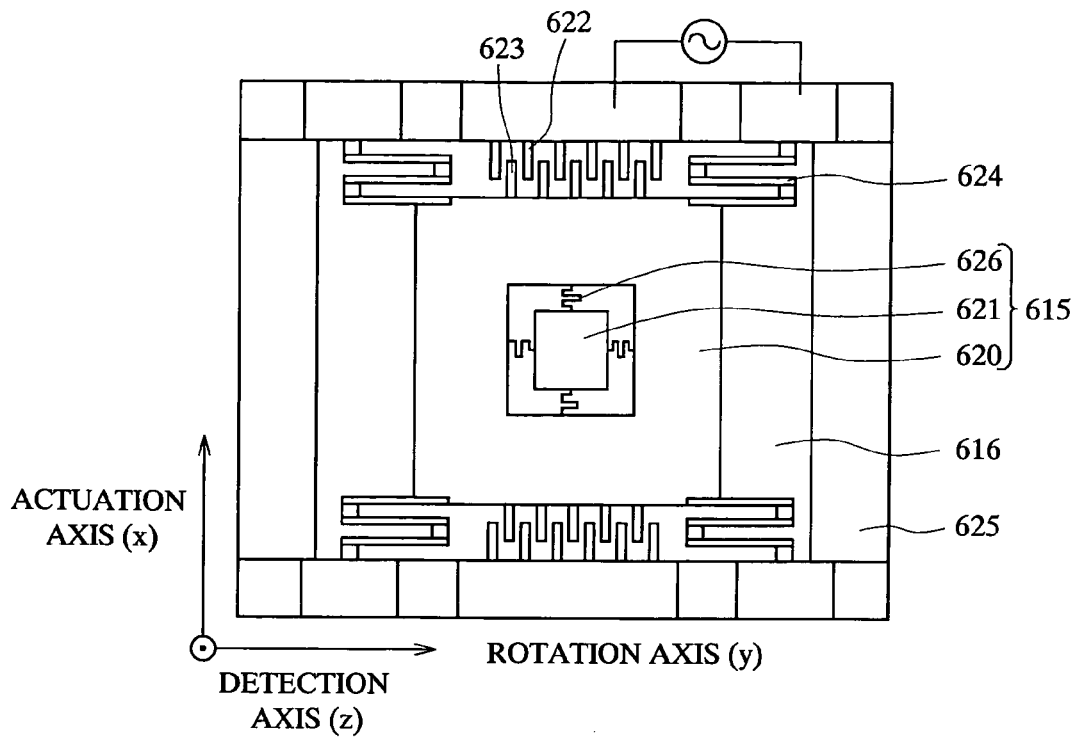
FIG. 48A and FIG. 48B are plan views showing the major layers constituting the angle rate sensor, respectively.

Next, the configuration of the angle rate sensor (vibration gyroscope) formed through the process described above will be described with reference to FIG. 48. FIG. 48A is a plan view showing the SOI layer, in which the vibration gyroscope includes the vibration part 615 having a frame structure 620 and a mass 621, first actuation electrodes 622 fixed to the surface of the cavity 616 and second actuation electrodes 623 fixed to the frame structure 620. In the cavity 616, the frame structure 620 formed from the SOI layer is fixed to the interlayer dielectric 625 surrounding the cavity 616 via beams 624 with rigidity in an actuation axis (x) direction lower than that in other directions. More specifically, the frame structure 620 is easily vibrated in the actuation axis (x) direction but hardly vibrated in the detection axis (direction vertical to the paper of FIG. 48) direction and in the rotation axis (y) direction.

Inside the frame structure 620, the mass 621 formed from the SOI layer is fixed to the frame structure 620 via beams 626 with rigidity in the actuation axis direction and rotation axis direction sufficiently higher than that in other directions. More specifically, the mass 621 is easily vibrated in the detection axis (z) direction but hardly vibrated in the other detections.

Two types of electrodes such as the first actuation electrodes 622 and the second actuation electrodes 623 are formed from a diffusion layer formed by the ion implantation and are connected to the integrated circuits for actuation and signal processing via the contact holes and the multilayer interconnects. The shape of these electrodes is defined by the etching when forming the openings 604. By applying alternating voltage between the first actuation electrode 622 and the second actuation electrode 623, the vibration part 615 is vibrated in the actuation axis direction of FIG. 48.

Figure 48B:
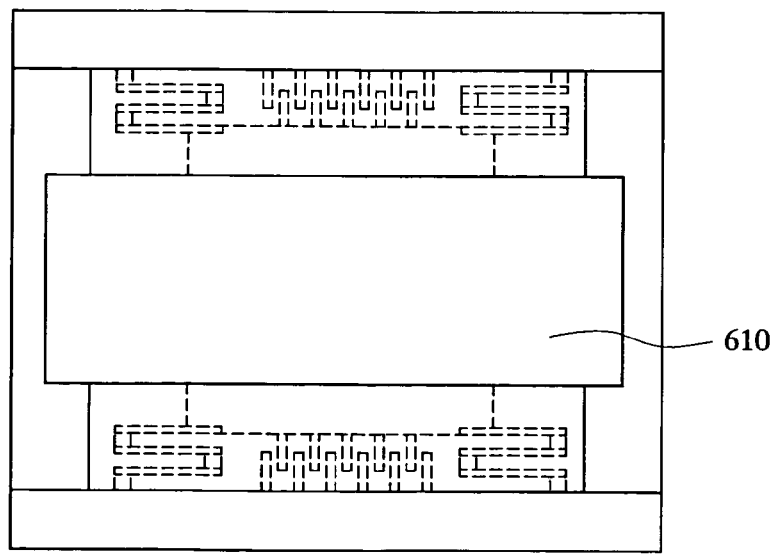

FIG. 48B is a plan view showing the detection electrode 610 formed from the M1 layer. By detecting electrostatic capacitance between the detection electrode 610 and the mass 621, the displacement of the vibration part in the detection axis direction (direction vertical to the paper of FIG. 48 or the substrate surface of the chip) is detected. The opposing area between the mass 621 and the detection electrode 610 is not changed even when the mass 622 is vibrated (moved) in the actuation axis direction. Therefore, the electrostatic capacitance between the mass 621 and the detection electrode 610 almost depends on only the space (distance) therebetween.

The shape of the beam 626 is designed so that a base part thereof is sufficiently thick and it is not displaced by the designed range of vibration. Therefore, since the mechanical characteristics are determined only by the planar shape and the thickness of the mass 621 exposed in the cavity 616 and do not depend on the dimensions and the shape of the cavity 616, it is very accurate.

Figure 49A:
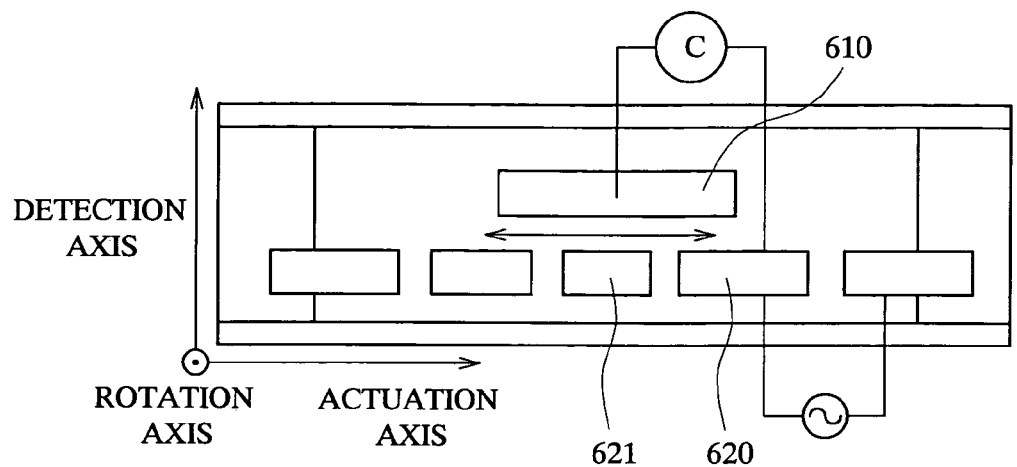
FIG. 49A and FIG. 49B are plan views showing the operation of the angle rate sensor according to the sixth embodiment, respectively.
Figure 49B:
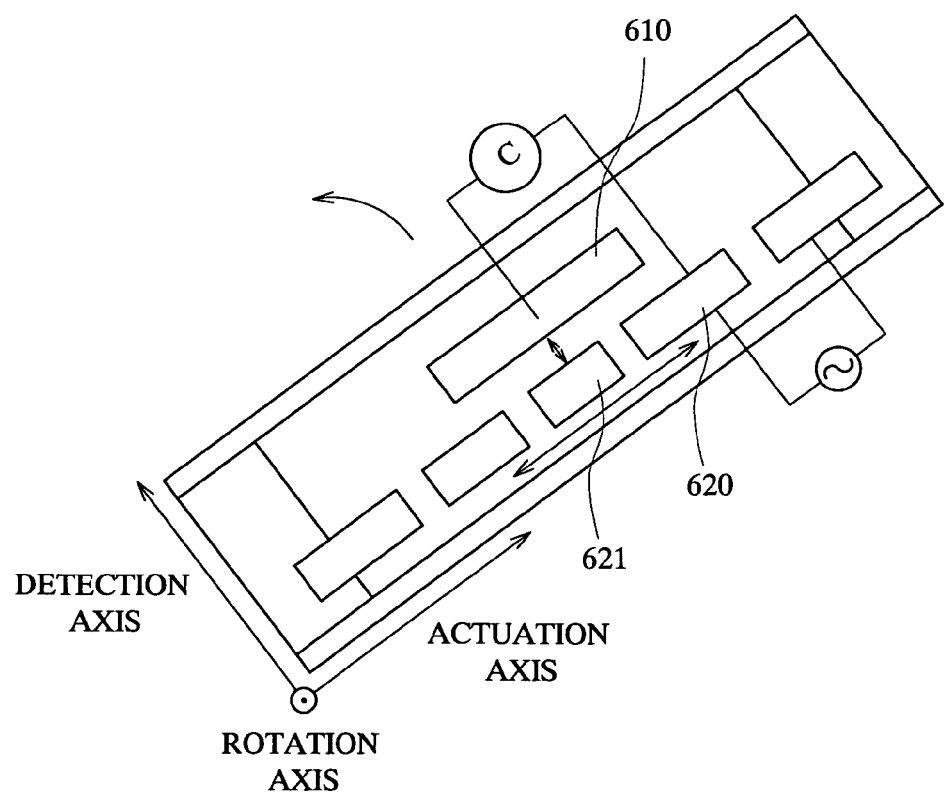

Next, the operation of the angle rate sensor according to the sixth embodiment will be described with reference to FIG. 49. By applying alternating voltage between the first actuation electrode and the second actuation electrode, the frame structure 620 is vibrated in the actuation axis direction. At this time, since the beam 626 connecting the frame structure 620 and the mass 621 has high rigidity in the actuation axis direction, the mass 621 is vibrated in the actuation axis direction together with the frame structure 620 (FIG. 49A). Next, when the rotation occurs around the rotation axis, the mass 621 starts to vibrate in the detection axis direction due to the Coriolis force. As a result, the electrostatic capacitance between the mass 621 and the detection electrode 610 is changed. By detecting the change in capacitance, the angle rate is monitored (FIG. 49B).

As described above, the mass 621 is formed from only the SOI layer in the sixth embodiment. However, it is also possible to further stack a contact layer and multilayer interconnects on the SOI layer as the mass 621 in order to increase the mass of the mass 621. The process will be described below in brief.

Figure 50:
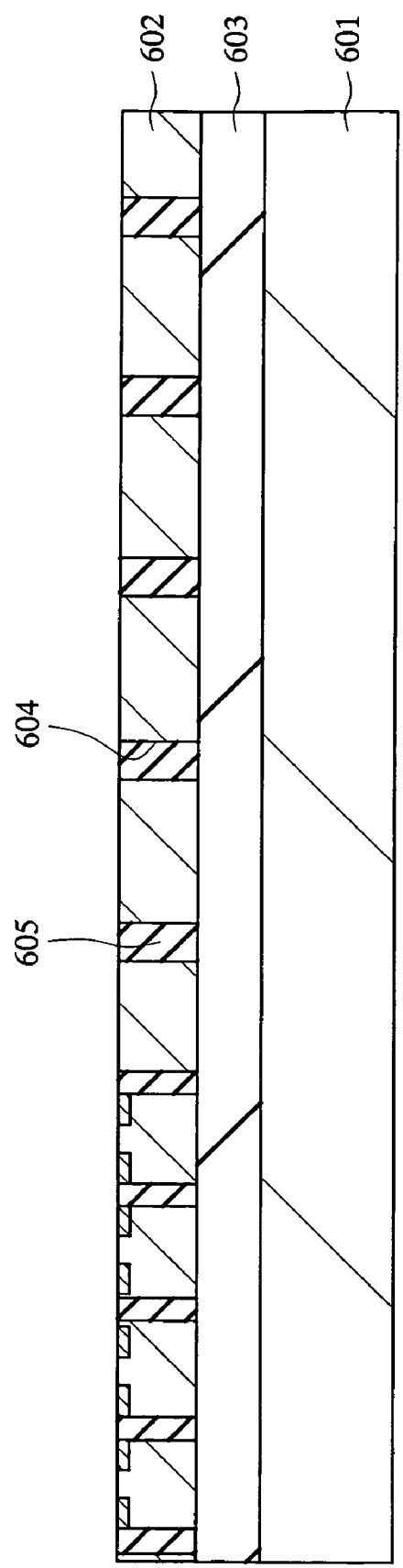
FIG. 50 is a schematic diagram showing the manufacturing process of an angle rate sensor according to the modification example of the sixth embodiment.

First, in order to form the vibration part on the SOI substrate 601, openings 604 extending from the surface of the SOI substrate 601 to the embedded dielectric 603 are formed in the SOI layer 602 around the patterns to be the vibration parts (mass and beam), and then, the openings 604 are filled with a CVD oxide film (HLD film) 605 (FIG. 50).

Figure 51:
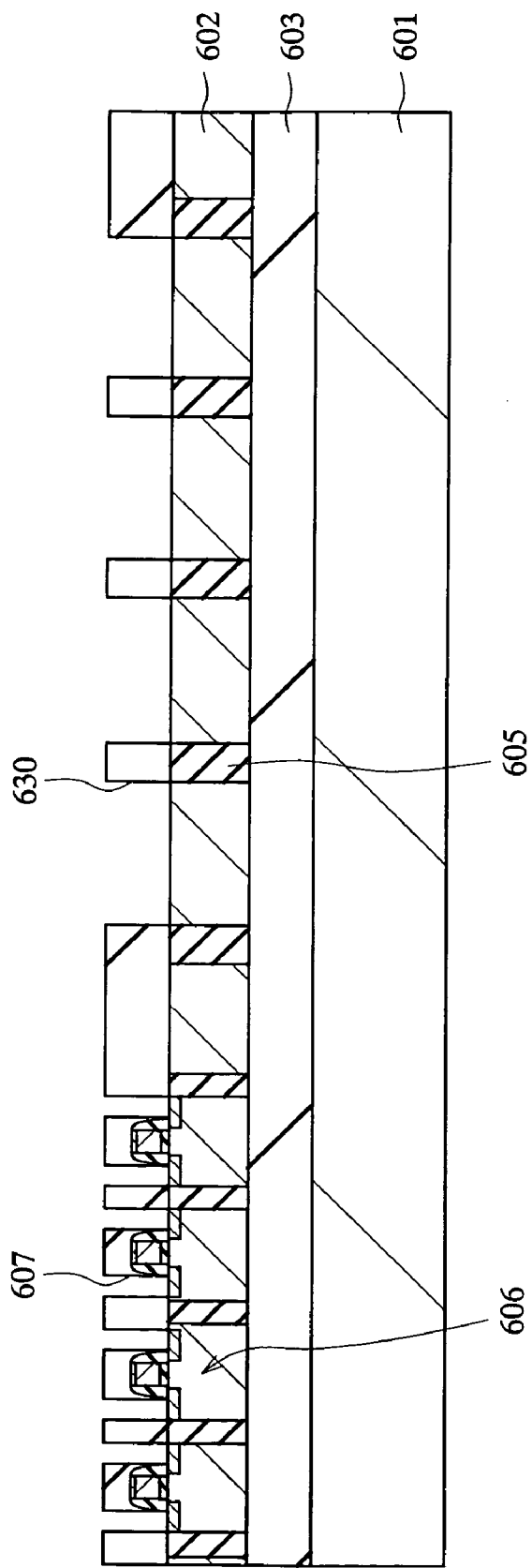
FIG. 51 is a schematic diagram showing the manufacturing process of the angle rate sensor subsequent to FIG. 50.

Next, through the normal CMOS integrated circuit process, transistors 606 for actuation and signal processing of the vibration gyroscope and contact holes 607 are formed on the SOI substrate 601 (FIG. 51). At this time, openings 630 are also formed on the SOI layer 602 in the vibration part forming region and its adjacent region.

Figure 52:
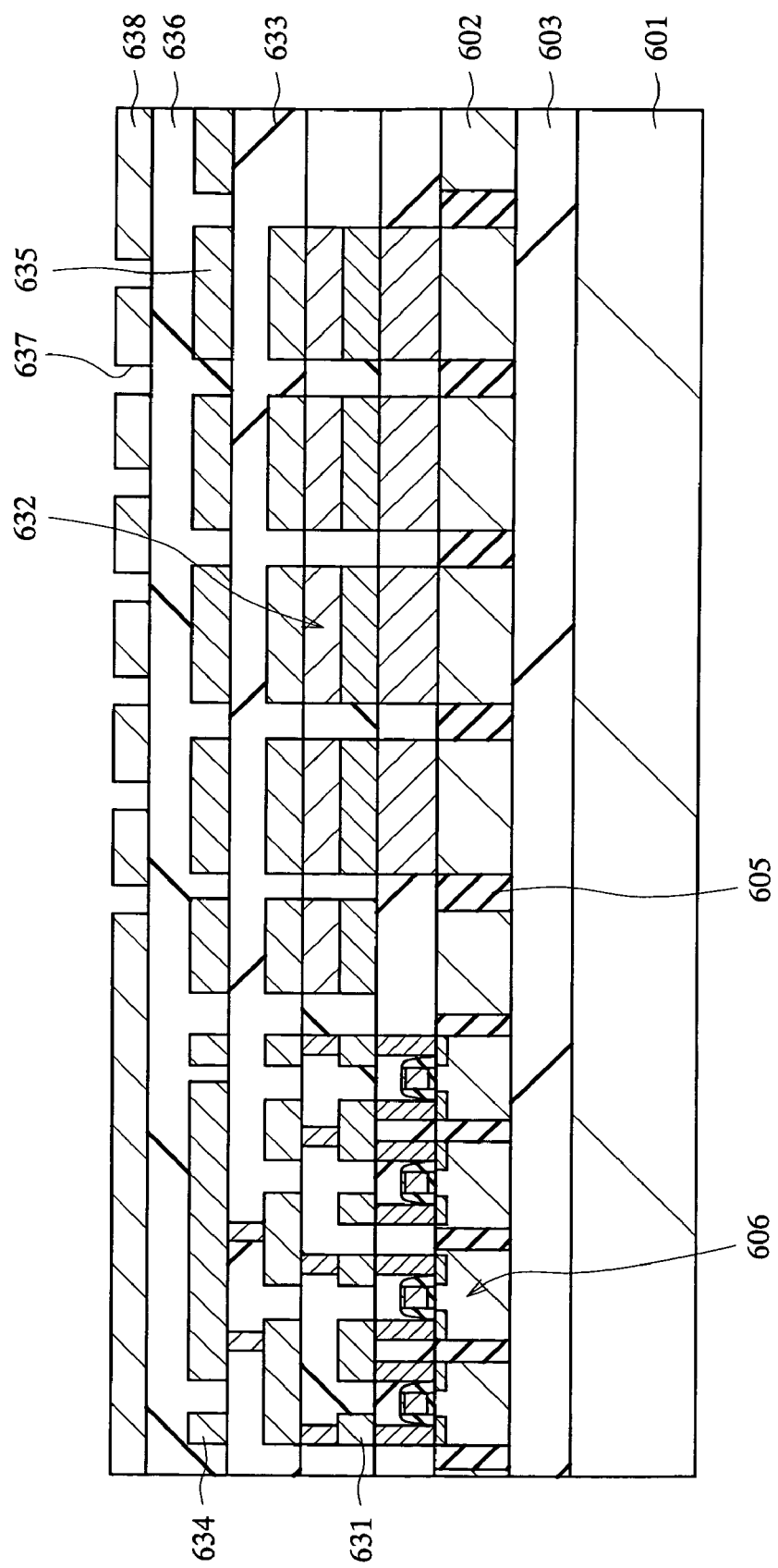
FIG. 52 is a schematic diagram showing the manufacturing process of the angle rate sensor subsequent to FIG. 51.

Subsequently, through the normal CMOS integrated circuit process, a first layer interconnect (M1 layer) 631 and subsequent multilayer interconnects are formed on the integrated circuit. At this time, the multilayer interconnects 632 constituting the vibration part are formed also on the openings 630. Then, after forming the interlayer dielectric 633, a third layer interconnect (M3 layer) 634 is formed on the integrated circuit, and detection electrodes 635 are formed on the region for forming the vibration part. In this embodiment, the detection electrode 635 is formed from the same layer as the M3 layer. However, it is also possible to form the detection electrode 635 from an appropriate layer in the multilayer interconnects. Next, after forming an interlayer dielectric 636 on the M3 layer and the detection electrodes 635, a cavity cover film 638 having fine holes 637 for etching is formed on the interlayer dielectric 636 (FIG. 52).

Figure 53:
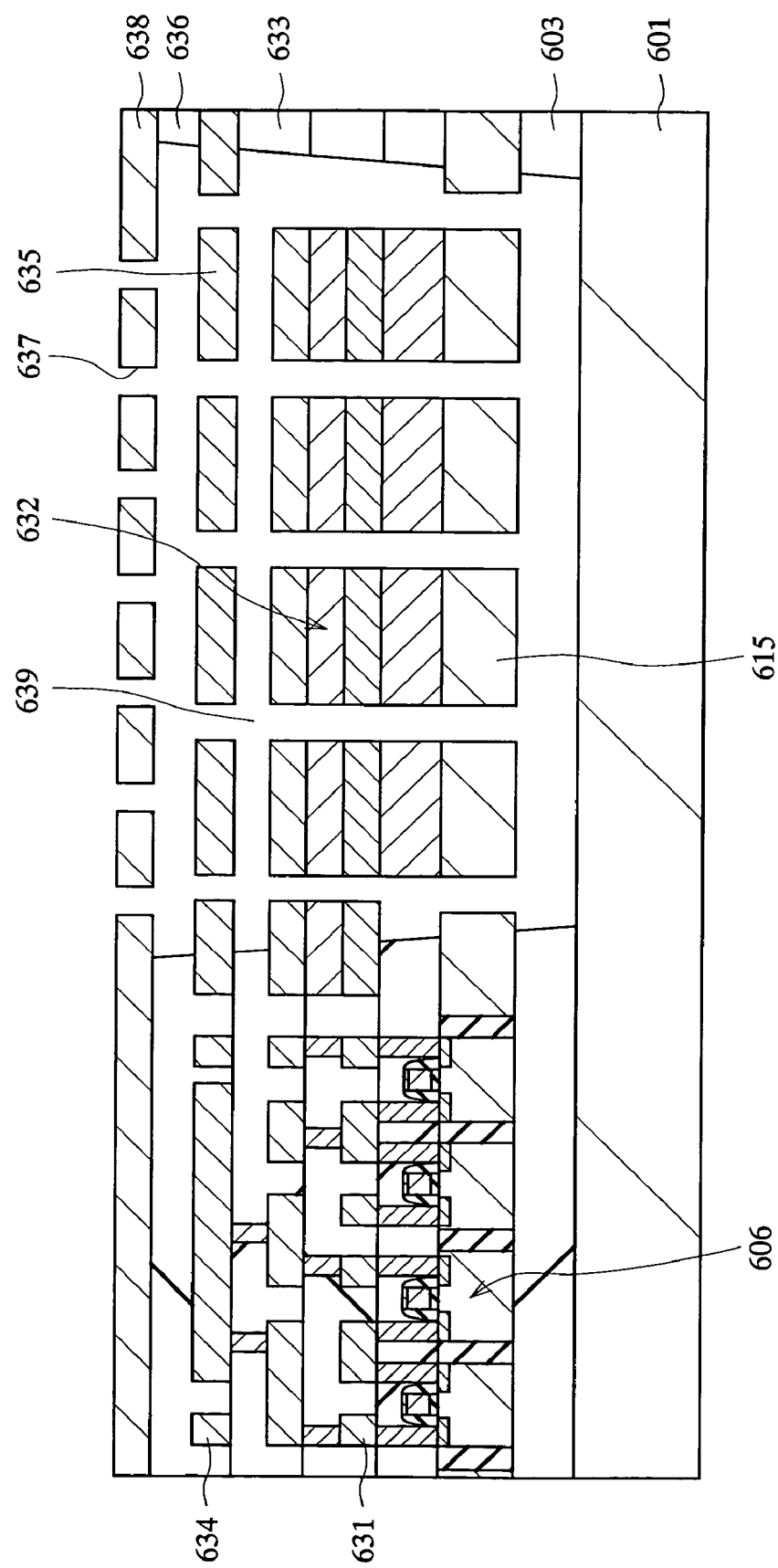
FIG. 53 is a schematic diagram showing the manufacturing process of the angle rate sensor subsequent to FIG. 52.
Figure 54:
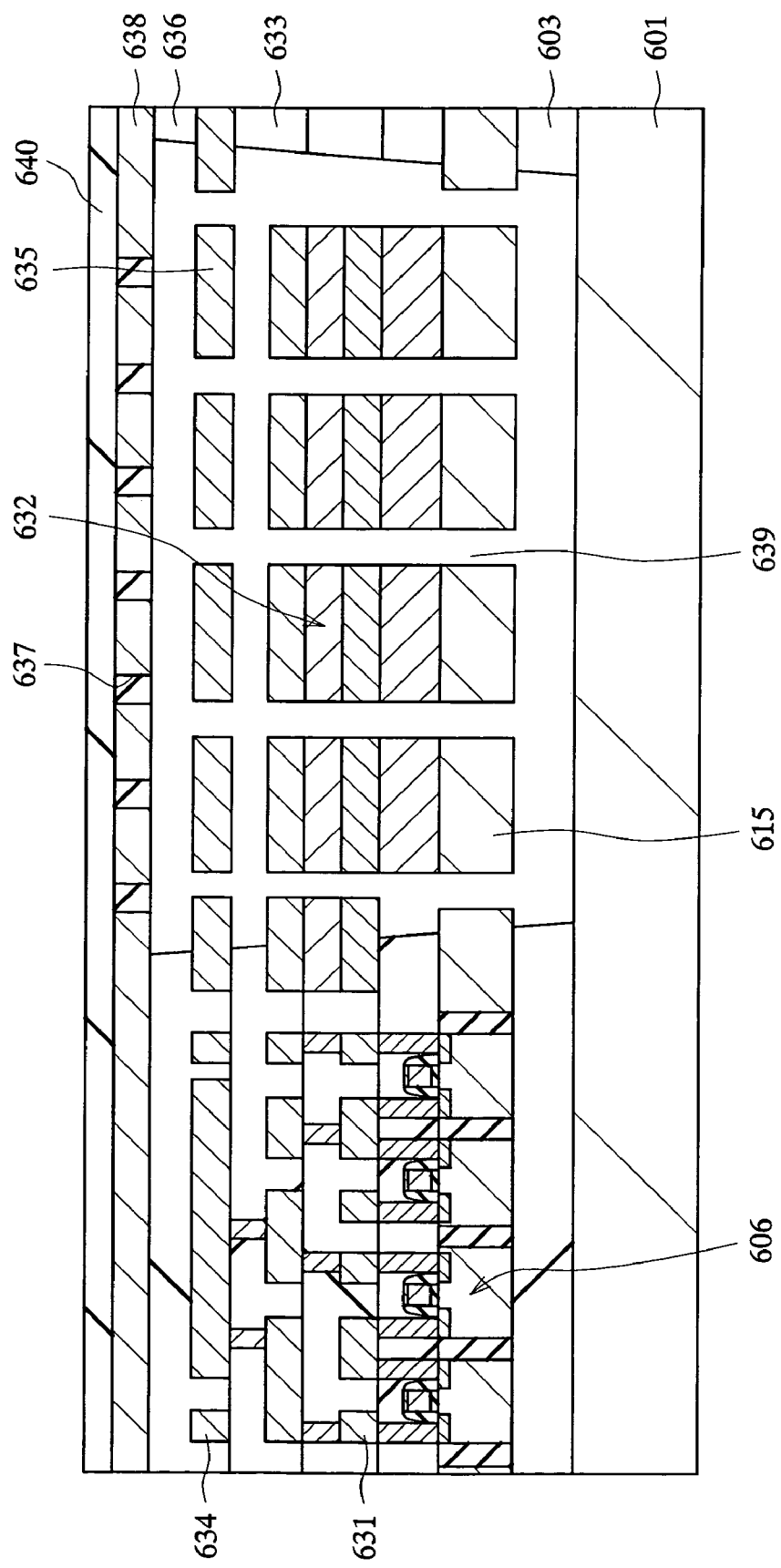
FIG. 54 is a schematic diagram showing the manufacturing process of the angle rate sensor subsequent to FIG. 53.

Thereafter, the interlayer dielectric on the vibration part 615, the CVD oxide film 605 embedded in the openings 604 and the embedded dielectric 603 of the SOI substrate 601 below the vibration part (mass and beam) 615 are etched and removed through the fine holes 637 to form the cavity 639 around the vibration part 615 (FIG. 53). The etching in the depth direction is stopped on the silicon substrate 601 below the embedded dielectric 603. Finally, the fine holes 637 for etching are filled with a dielectric 640 to seal the cavity 639 (FIG. 54).

As described above, since the multilayer interconnects are used to form the vibration part 615 in addition to the SOI layer, it is possible to increase the mass of the vibration part 615, and the detection sensitivity of the vibration gyroscope can be improved.

It is also possible to use a thick polysilicon film to form the vibration part instead of the SOI layer. In this case, by using the substrate formed by sequentially stacking an oxide film and a polysilicon film with a predetermined thickness on a silicon substrate instead of the SOI substrate, the sixth embodiment can be applied without modification.

The patterning of the vibration part composed of an SOI layer or a thick polysilicon film, that is, the definition of the planar shape of the vibration part and its peripheral part by the etching and the embedding of the oxide film (sacrificial film) to the etched part can be performed either before or after forming the transistors of the integrated circuit.

The first point of the sixth embodiment is that the vibration part formed from a SOI layer or formed by stacking a SOI layer and multilayer interconnects and the detection electrodes formed from the multilayer interconnects are combined to constitute the angle rate sensor. Also, the second point thereof is that the vibration part of the angle rate sensor is placed in the cavity formed and sealed in the interlayer dielectric, which does not define the design characteristics of the angle rate sensor. Therefore, the planar shape and the arrangement described above are mere schematic examples, and the modification and the design optimization can be made appropriately.

Note that, also in the sixth embodiment, the formation of the mechanical structure of the vibration gyroscope and the formation and sealing of the cavity can be performed through the normal CMOS process. Therefore, the advantages similar to those of the first embodiment can be realized.

Next, the application examples of the MEMS described in the above-described embodiments will be described in the following seventh to ninth embodiments.

Seventh Embodiment

Figure 55:
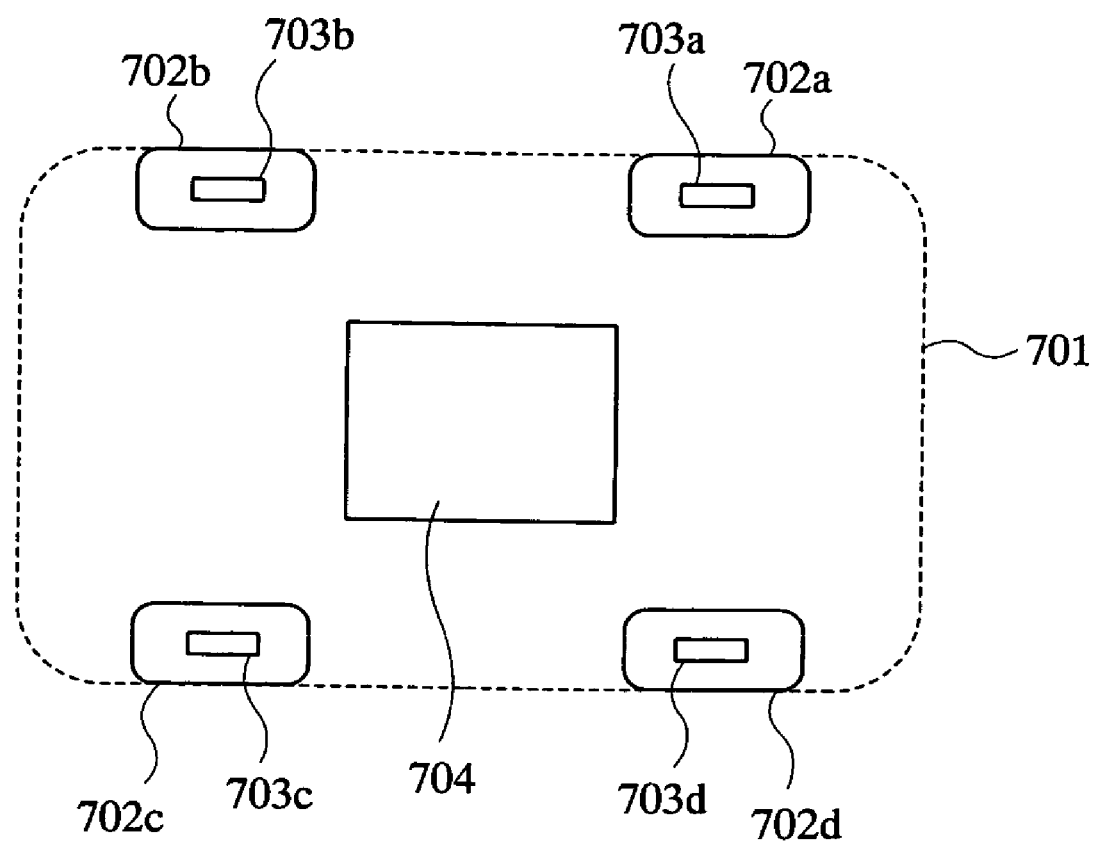
FIG. 55 is a diagram showing the configuration of the gas pressure monitoring system for tire seen from the bottom surface of an automobile.

The entire configuration of a gas pressure monitoring system for tire using the MEMS will be described with reference to FIG. 55 to FIG. 57. FIG. 55 is a diagram showing the configuration of the gas pressure monitoring system for tire seen from the bottom surface of an automobile, and it is comprised of a vehicle 701, tires 702a to 702d provided on left front, right front, left rear and right rear of the vehicle, tire pressure measurement modules 703a to 703d provided to each of the tires 702a to 702d, and an in-vehicle unit 704. Also, FIG. 56 and FIG. 57 are block diagrams of the tire pressure measurement module 703 (703a to 703d) and the in-vehicle unit 704, respectively.

Figure 56:
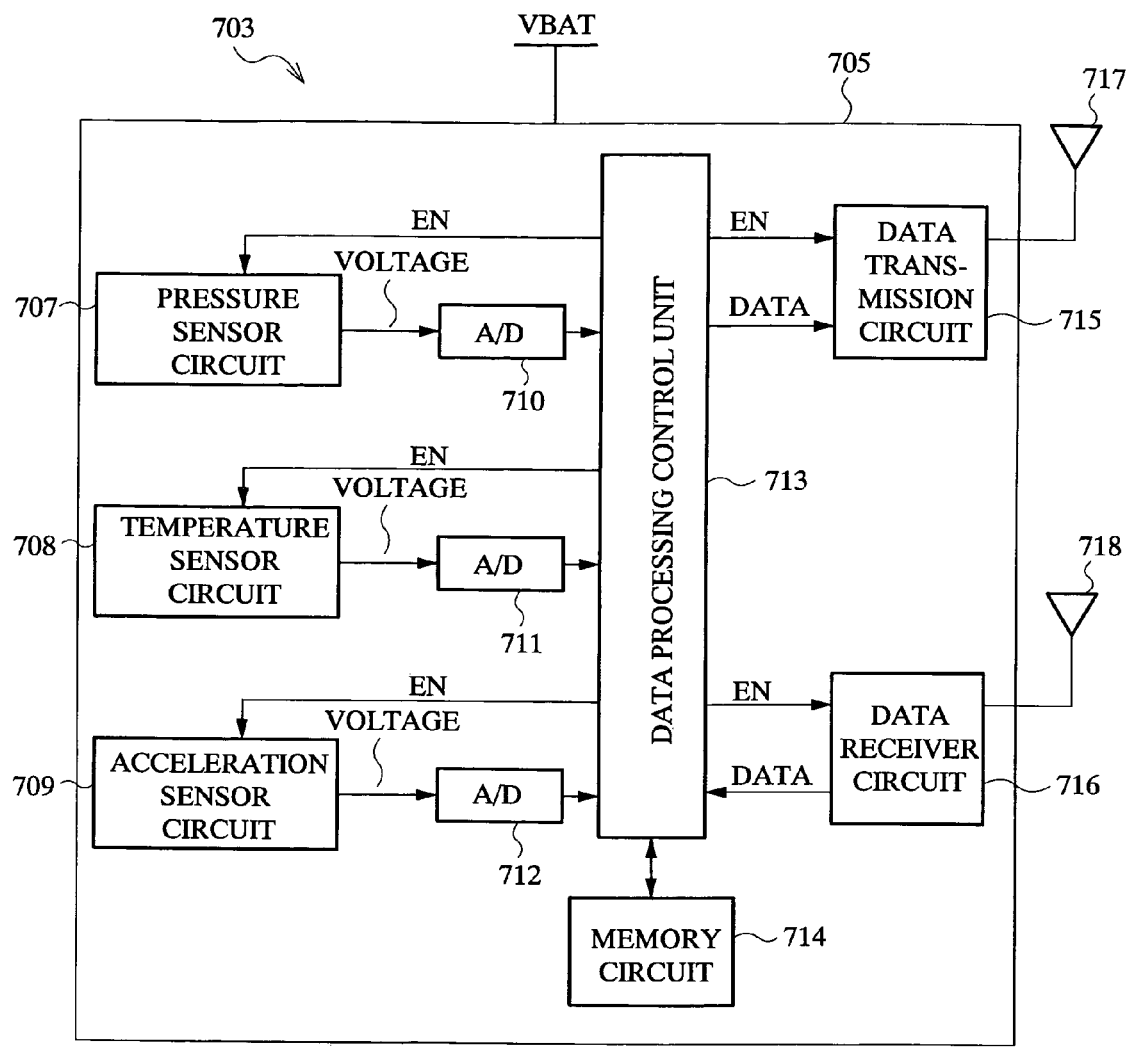
FIG. 56 is a block diagram of a tire pressure measurement module.
Figure 56:
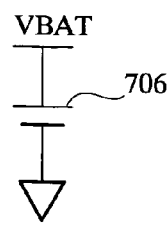
Figure 57:
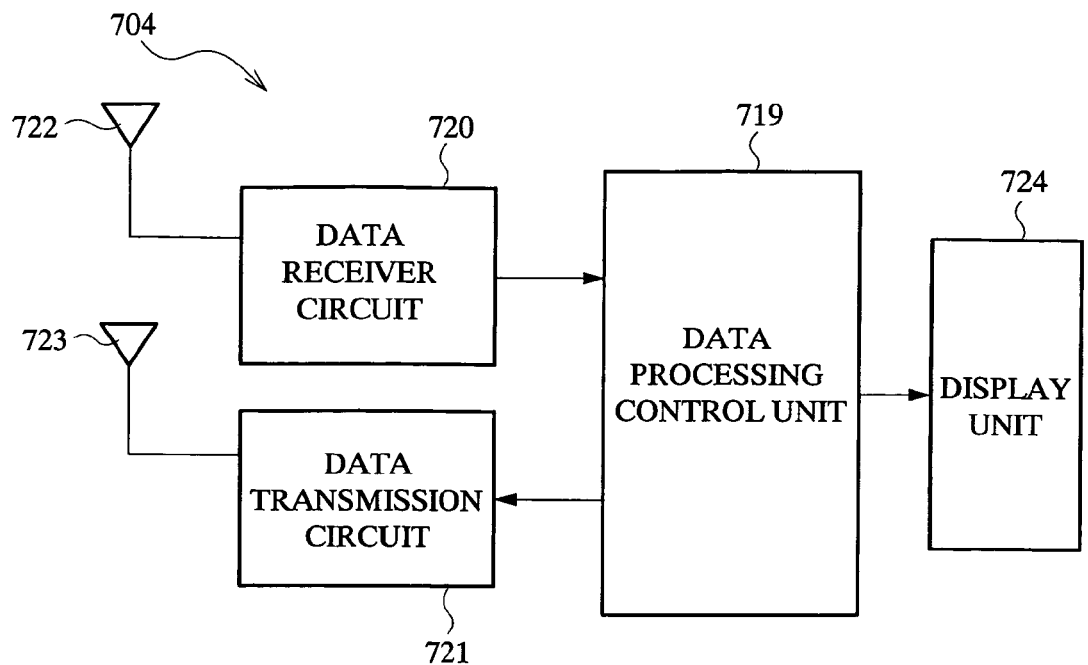
FIG. 57 is a block diagram of a in-vehicle unit.

FIG. 56 is a block diagram of the tire pressure measurement module 703, and is comprised of one IC chip 705 and a battery 706 with the voltage of VBAT for supplying the power to the IC chip 705. The IC chip 705 includes a pressure sensor circuit 707, a temperature sensor circuit 708, an acceleration sensor circuit 709, analog-digital (A/D) conversion circuits 710, 711 and 712, a data processing control unit 713, a memory circuit 714, a data transmission circuit 715 and a data receiver circuit 716. In this case, the pressure sensor circuit 707 and the temperature sensor circuit 708 are the circuits for measuring the gas pressure and the temperature of the tires, respectively. Also, the acceleration sensor circuit 709 is the circuit for determining whether the tires are rotated. In the pressure sensor circuit 707 and the acceleration sensor circuit 709, the MEMS (micro machine) constituting the pressure sensor and the acceleration sensor are formed. More specifically, in the IC chip 705, in addition to the integrated circuit, the MEMS to be the pressure sensor and the acceleration sensor are formed. As the pressure sensor formed in the pressure sensor circuit 707 and the acceleration sensor formed in the acceleration sensor circuit 709 according to the seventh embodiment, for example, the pressure sensor and the acceleration sensor described in the first, second and fourth embodiments are used.

In the MEMS formed in the IC chip 705, as described in the foregoing embodiments, the cavity can be formed and sealed through the normal CMOS process. Therefore, the special process for forming and sealing the cavity (packaging process particular to MEMS) which is the major cause of the yield decrease and the manufacturing cost increase in the conventional MEMS manufacturing process becomes unnecessary. As a result, in the seventh embodiment, it is possible to improve the yield, reduce the manufacturing (packaging) cost and improve the reliability of the IC chip 705. In addition, since the structure of the MEMS can be formed simultaneously with the formation of the interconnect of the LSI, the integration with the LSI can be facilitated.

The analog-digital conversion circuits 710, 711 and 712 are the circuits for converting the analog voltage value outputted from the pressure sensor circuit 707, the temperature sensor circuit 708 and the acceleration sensor circuit 709 into the digital voltage value.

The data processing control unit 713 (1) inputs the digital voltage value converted in the analog-digital conversion circuits 710, 711 and 712, (2) performs the correction computing to correct the pressure measurement value measured in the pressure sensor circuit 707, (3) changes the control state in accordance with the output from the acceleration sensor circuit 709, (4) outputs the data to the data transmission circuit 715, (5) receives the data from the data receiver circuit 716, and (6) controls the ON/OFF of the individual power supplies of the pressure sensor circuit 707, the temperature sensor circuit 708, the acceleration sensor circuit 709, the data transmission circuit 715 and the data receiver circuit 716 in response to the EN signals.

The memory circuit 714 is the circuit for registering the correction value for correcting the pressure measurement value measured in the pressure sensor circuit 707 and the ID of the tire pressure measurement module 703. Note that the ID number (for example, 32 bits) is used to confirm the tires of one's own car from those of others and the positions of the tires.

The data transmission circuit 715 is the circuit for performing the RF transmission of data such as the measurement value corrected by the computing in the data processing control unit 713 to the in-vehicle unit 704 shown in FIG. 55. The frequency of the carrier wave used in this RF transmission is UHF band, for example, 315 MHz. In this data transmission, the carrier wave which is ASK modulated or FSK modulated by the transmitted data is transmitted.

On the other hand, the data receiver circuit 716 is the circuit for performing the RF reception of data such as the control signal from the in-vehicle unit 704 and it transmits the data to the data processing control unit 713. The frequency of the carrier wave received in the data receiver circuit 716 is LF band, for example, 125 kHz, and the carrier wave which is ASK modulated by the transmitted data is transmitted.

Antennas 717 and 718 are connected to the data transmission circuit 715 and the data receiver circuit 716, respectively. Also, as the battery 706 for supplying power to the IC chip 705, a coin type lithium battery (voltage 3 V) is used.

Next, FIG. 57 is a block diagram of the in-vehicle unit 704. As shown in FIG. 57, the in-vehicle 704 is provided with a data processing control unit 719 for performing the data input/output and calculation of the data, a data receiver circuit 720, a data transmission circuit 721, an antenna 722 connected to the data receiver circuit 720, an antenna 723 connected to the data transmission circuit 721 and a display unit 724 for displaying the measurement values and cautions.

The data processing control unit 719 receives the data which is RF transmitted from the tire pressure measurement module 703 (703a to 703d) shown in FIG. 55 via the data receiver circuit 720, and it displays the pressure measurement values and the caution and the warning of the pressure decrease on the display unit 724. Further, the data processing control unit 719 transmits the control data to the tire pressure measurement module 703 (703a to 703d) via the data transmission circuit 721. Note that the power required in the in-vehicle unit 704 is supplied from the battery (not shown) mounted in the vehicle.

According to the seventh embodiment, since the MEMS formed by using the standard CMOS process is used to constitute the tire pressure measurement module 703 (703a to 703d), it is possible to improve the yield and the reliability of the tire pressure measurement module 703 (703a to 703d).

Therefore, it is possible to improve the reliability of the gas pressure monitoring system for tire.

Eighth Embodiment

Figure 58:
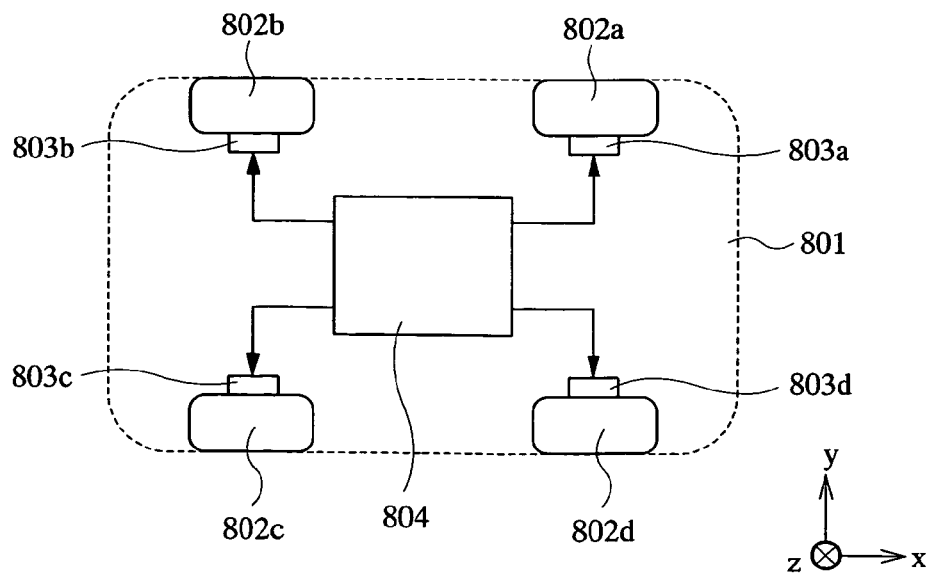
FIG. 58 is a diagram showing the configuration of an anti-skid device for a vehicle seen from the bottom surface of an automobile.
Figure 59:
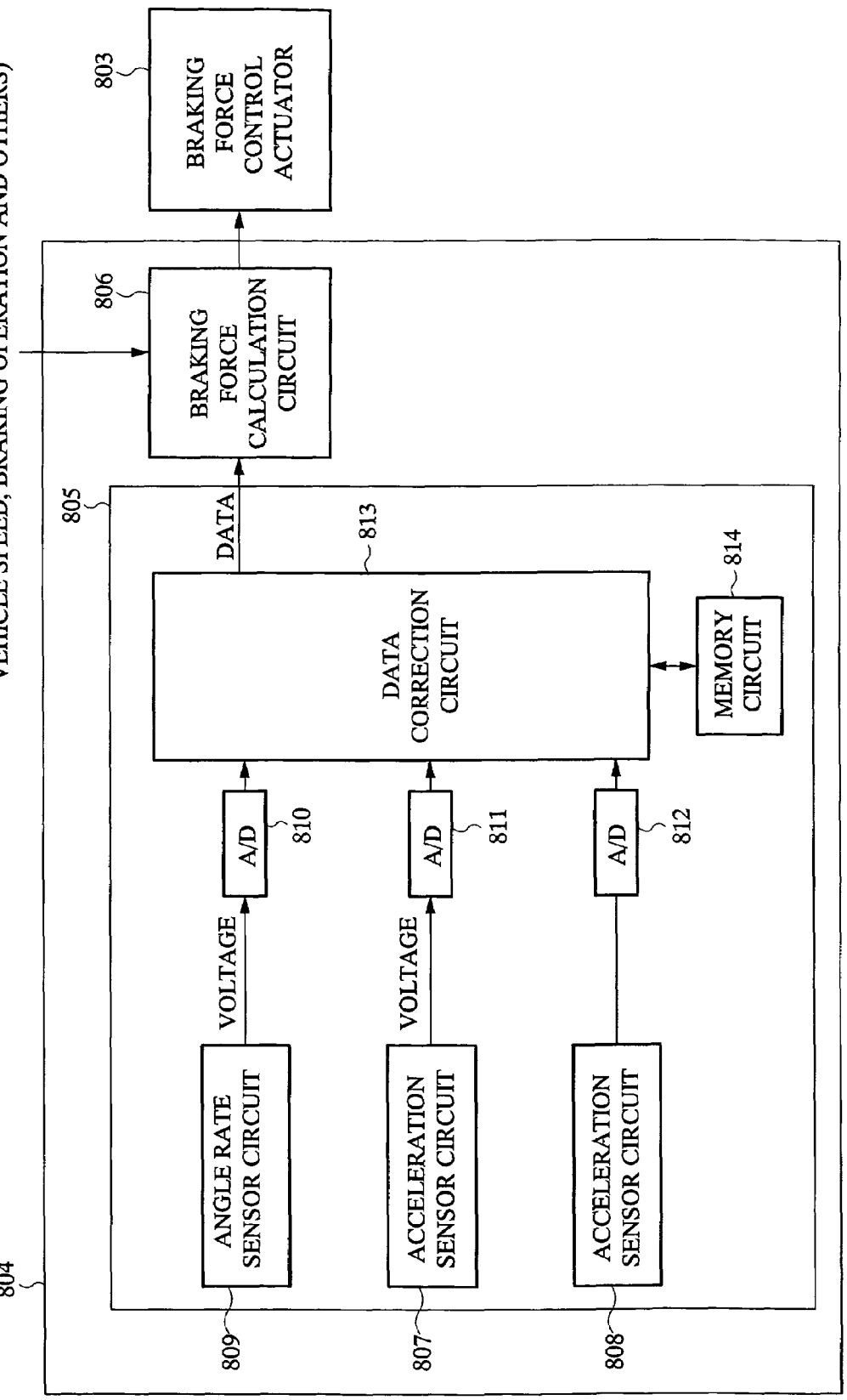
FIG. 59 is a block diagram of an anti-skid control circuit.

The entire configuration of an anti-skid device for a vehicle using the MEMS will be described with reference to FIG. 58 and FIG. 59. In this case, FIG. 58 is a diagram showing the anti-skid device for a vehicle seen from the bottom surface of an automobile, and it is comprised of a vehicle 801, tires 802a to 802d provided on left front, right front, left rear and right rear of the vehicle, braking force control actuators 803a to 803d which control the brake provided to each of the tires 802a to 802d, and an anti-skid control circuit 804 for controlling the braking force control actuators 803a to 803d. Also, FIG. 59 is a block diagram of the anti-skid control circuit 804, and the anti-skid control circuit 804 has one IC chip 805 and a braking force calculation circuit 806.

The IC chip 805 has acceleration sensor circuits 807 and 808 for detecting the acceleration in the x and y directions of the coordinate axis shown in FIG. 58 and an angle rate sensor circuit 809 for detecting the rotation angle rate around the coordinate axis z. The MEMS for constituting the angle rate sensor and the acceleration sensor are formed in these angle rate sensor circuit 809 and the acceleration sensor circuits 807 and 808. More specifically, in the IC chip 805, the MEMS to be the angle rate sensor and the acceleration sensor are formed in addition to the integrated circuit. As the angle rate sensor formed in the angle rate sensor circuit 809 and the acceleration sensor formed in the acceleration sensor circuits 807 and 808 according to the eighth embodiment, for example, the acceleration sensor described in the first and second embodiments and the angle rate sensor described in the fifth and sixth embodiments are used.

In the MEMS formed in the IC chip 805, as described in the foregoing embodiments, the cavity can be formed and sealed through the normal CMOS process. Therefore, the special process for forming and sealing the cavity (packaging process particular to MEMS) which is the major cause of the yield decrease and the manufacturing cost increase in the conventional MEMS manufacturing process becomes unnecessary. As a result, in the eighth embodiment, it is possible to improve the yield, reduce the manufacturing (packaging) cost and improve the reliability of the IC chip 805. In addition, since the structure of the MEMS can be formed simultaneously with the formation of the interconnect of the LSI, the integration with the LSI can be facilitated.

Furthermore, the IC chip 805 has analog-digital (A/D) conversion circuits 810, 811 and 812, a data correction circuit 813 and a memory circuit 814. The analog-digital (A/D) conversion circuits 810, 811 and 812 are the circuits for converting the analog voltage value outputted from the angle rate sensor circuit 809 and the acceleration sensor circuits 807 and 808 into the digital voltage value. The data correction circuit 813 is the circuit for correcting the difference from the ideal output characteristics of the angle rate sensor circuit 809 and the acceleration sensor circuits 807 and 808, and the coefficient of the correction value is registered in the memory circuit 814 in advance.

The configuration of the anti-skid device according to the eighth embodiment has been described above. Next, the operation thereof will be described below in brief. First, the angle rate sensor circuit 809 and the acceleration sensor circuits 807 and 808 formed on the IC chip 805 detect the angle rate and the acceleration applied to the vehicle. In addition, a handling angle (steering angle) is also detected. Furthermore, the vehicle speed and the brake operation amount are also detected from outside. Then, when information such as the angle rate, the acceleration, the handling angle, the vehicle speed and the brake operation amount is inputted to the anti-skid control circuit 804, the control signals are outputted from the anti-skid control circuit 804 to the braking force control actuator 803 (803*a* to 803*d*) so as to prevent the skid of the vehicle. Then, the braking force of the tires 802*a* to 802*d* is controlled by the braking force control actuator 803 (803*a* to 803*d*). In this manner, it is possible to prevent the skid of the vehicle.

According to the eighth embodiment, since the MEMS formed by using the standard CMOS process is used to form the IC chip 805, it is possible to improve the yield and the reliability of the IC chip 805. Therefore, it is possible to improve the reliability of the anti-skid device for vehicle.

Ninth Embodiment

Figure 60:
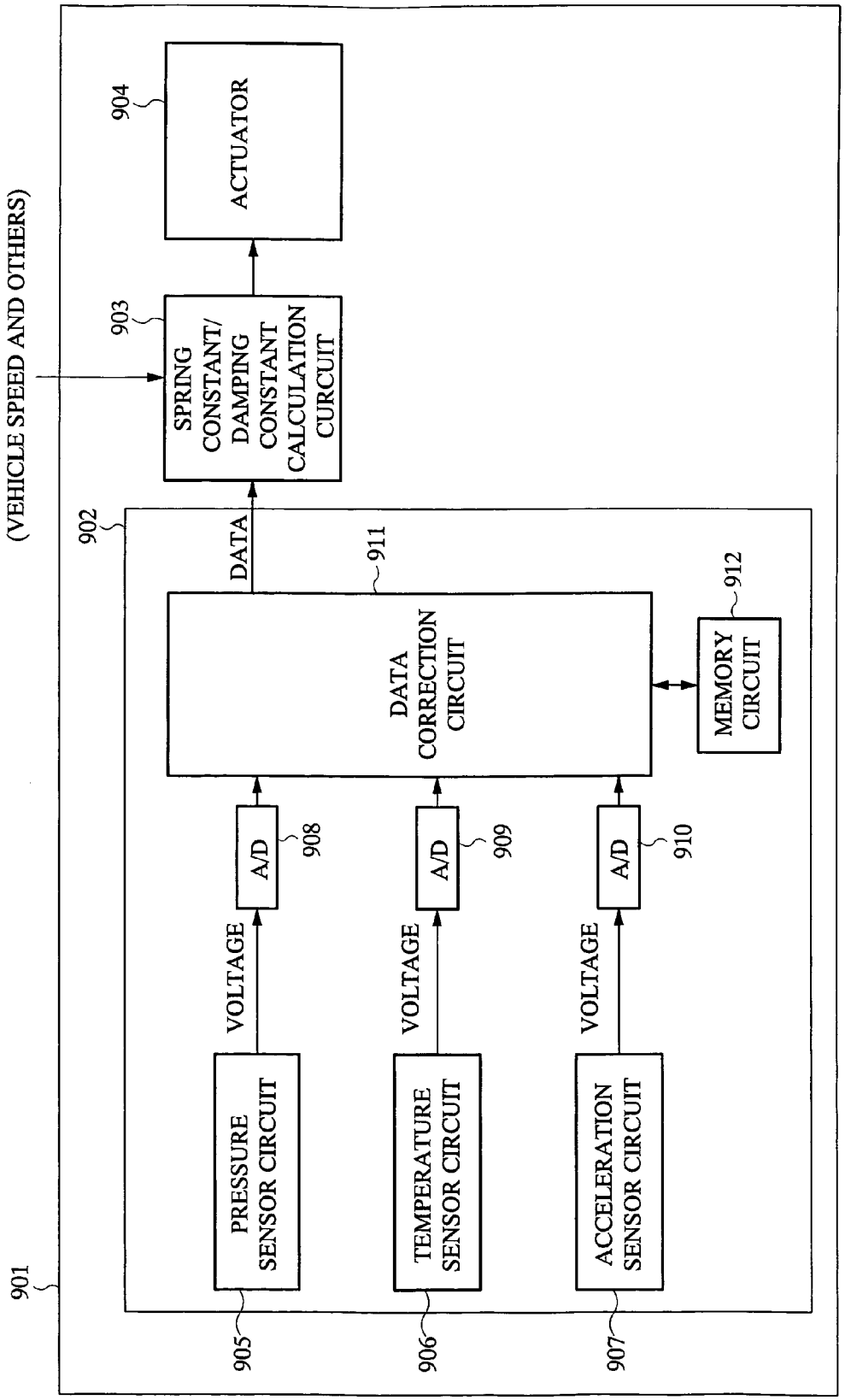
FIG. 60 is a block diagram showing an air suspension control unit.

The entire configuration of an air suspension control unit for vehicle will be described with reference to FIG. 60 and 61. In this case, FIG. 60 is a block diagram showing the air suspension control unit 901, and it is comprised of one IC chip 902, a spring constant/damping constant calculation circuit 903 and an actuator for controlling the inner pressure of the air suspension. The IC chip 902 has a pressure sensor circuit 905, a temperature sensor circuit 906, an acceleration sensor circuit 907, analog-digital (A/D) conversion circuits 908, 909 and 910, a data correction circuit 911 and a memory circuit 912. In this case, the pressure sensor circuit 905 and the temperature sensor circuit 906 are the circuit for measuring the gas pressure and the temperature in the air suspension, respectively. Also, the acceleration sensor circuit 907 is the circuit for detecting the acceleration in the vertical direction from the vehicle so as to detect the movement in the vertical direction of the vehicle mainly due to the bumps on the road. In the pressure sensor circuit 905 and the acceleration sensor circuit 907, the MEMS constituting the pressure sensor and the acceleration sensor are formed. More specifically, in the IC chip 902, in addition to the integrated circuit, the MEMS to be the pressure sensor and the acceleration sensor are formed. As the pressure sensor formed in the pressure sensor circuit 905 and the acceleration sensor formed in the acceleration sensor circuit 907 according to the ninth embodiment, for example, the pressure sensor and the acceleration sensor described in the first, second and fourth embodiments are used.

In the MEMS formed in the IC chip 902, as described in the foregoing embodiments, the cavity can be formed and sealed through the normal CMOS process. Therefore, the special process for forming and sealing the cavity (packaging process particular to MEMS) which is the major cause of the yield decrease and the manufacturing cost increase in the conventional MEMS manufacturing process becomes unnecessary. As a result, in the ninth embodiment, it is possible to improve the yield, reduce the manufacturing (packaging) cost and improve the reliability of the IC chip 902. In addition, since the structure of the MEMS can be formed simultaneously with the formation of the interconnect of the LSI, the integration with the LSI can be facilitated.

The analog-digital conversion circuits 908, 909 and 910 are the circuits for converting the analog voltage value outputted from the pressure sensor circuit 905, the temperature sensor circuit 906 and the acceleration sensor circuit 907 into the digital voltage value. The data correction circuit 911 is the circuit for correcting the difference from the ideal output characteristics of the pressure sensor circuit 905 and the acceleration sensor circuit 907, and the coefficient of the correction value is registered in the memory circuit 912 in advance.

Figure 61:
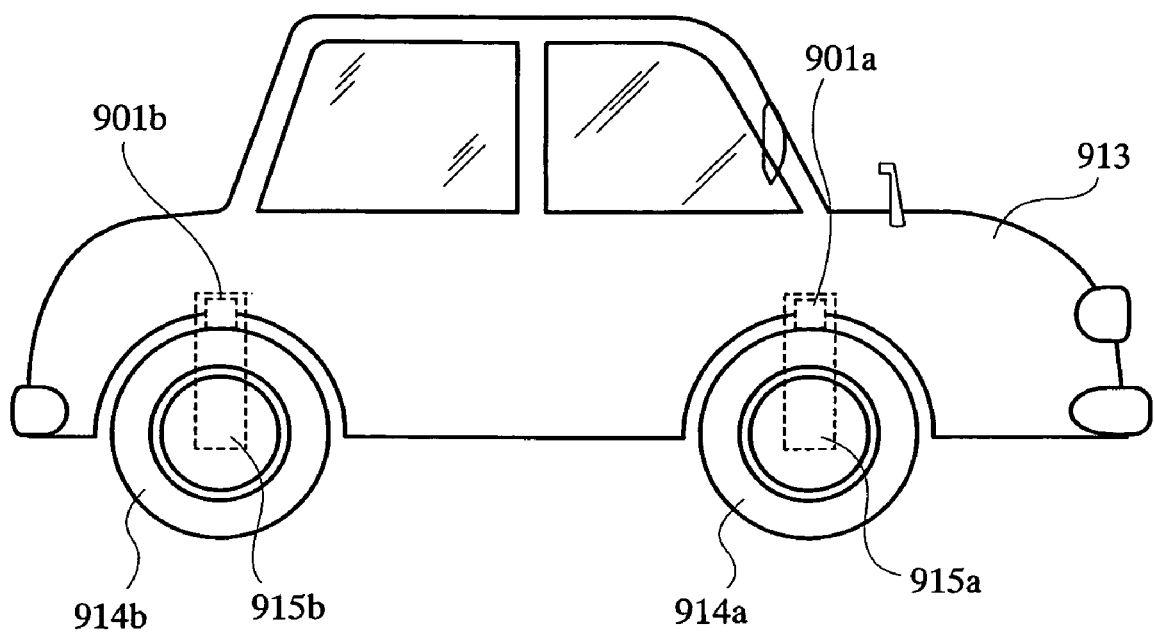
FIG. 61 is a side view of the vehicle showing the configuration of an air suspension control unit seen from the side of an automobile.

FIG. 61 is a side view of the vehicle, which shows the configuration of an automobile in which the air suspension is mounted. In FIG. 61, the automobile is provided with a vehicle body 913, tires 914*a* and 914*b* provided on right front and right rear of the vehicle (only one side is shown here) and air suspensions 915*a* and 915*b* in which the air suspension control unit 901 (901*a* and 901*b*) is mounted and air springs for suspending the vehicle body 913 on the tires 914*a* and 914*b* are used.

The air suspension control unit 901 has the configuration as described above, and the operation thereof will be described below in brief.

First, the pressure and the acceleration applied to the vehicle are detected by the pressure sensor circuit 905 and the acceleration sensor circuit 907 formed on the IC chip 902. Then, the vehicle speed and the like are detected from outside. Thereafter, when the air suspension control unit 901 receives information such as the pressure, the acceleration and the vehicle speed, the control signal is outputted to the actuator 904 so as to prevent the vibration of the vehicle in the vertical direction. As a result, the spring constant and the damping constant of the respective air suspensions 915*a* and 915*b* are controlled to reduce the vibration of the vehicle in the vertical direction.

According to the ninth embodiment, since the MEMS formed by using the standard CMOS process is used to form the IC chip 902, it is possible to improve the yield and the reliability of the IC chip 902. Therefore, it is possible to improve the reliability of the anti-skid device for vehicle.

In the foregoing, the invention made by the inventors of the present invention has been concretely described based on the embodiments. However, it is needless to say that the present invention is not limited to the foregoing embodiments and various modifications and alterations can be made within the scope of the present invention.

It is also possible to form the structure of MEMS described in the foregoing embodiments so as to contain any one of a metal film, a silicon-germanium film, a silicon nitride film, a silicon oxide film, a single crystal silicon film, a polysilicon film, an amorphous silicon film and a polyimide film.

The integrated MEMS according to the present invention can be utilized in, for example, an automobile, a mobile device, an amusement machine, a wireless device, an information appliance, a computer and the like.

What is claimed is:

1. A manufacturing method of an integrated micro electro-mechanical system, in which a micro machine formed by using a manufacturing technology of a semiconductor integrated circuit and a semiconductor integrated circuit are formed on a semiconductor substrate, said method comprising the steps of:

(a) forming a mechanical structure which is a part of said micro machine, said mechanical structure including a fixed part which is elastically un-deformable and fixed to an interlayer dielectric layer, a movable part which is movable in a cavity, and an elastically deformable part which connects said fixed part with said movable part, a width of said fixed part is wider than a width of said elastically deformable part in plan view;

(b) forming the interlayer dielectric layer covering said mechanical structure, said interlayer dielectric layer being formed as a part of an interconnect of said semiconductor integrated circuit;

(c) forming said cavity in which said mechanical structure is placed by forming a film having holes on said interlayer dielectric layer which covers said mechanical structure and etching said interlayer dielectric layer around said mechanical structure through said holes to form said cavity; and (d) sealing said cavity by sealing only said holes, wherein said step (a), said step (b), said step (c) and said step (d) are performed by using a technology for forming an interconnect of said semiconductor integrated circuit.

2. The manufacturing method of an integrated micro electro-mechanical system according to claim 1,
wherein, in said step (a), said mechanical structure is formed from the same layer as the interconnect which constitutes said semiconductor integrated circuit.

3. The manufacturing method of an integrated micro electro-mechanical system according to claim 1,
wherein, in said step (a), said movable part of said mechanical structure is formed from plural interconnect layers which constitute said semiconductor integrated circuit.

4. A manufacturing method of an integrated micro electro-mechanical system in which a micro machine formed by using a manufacturing technology of a semiconductor integrated circuit and a semiconductor integrated circuit are formed on a semiconductor substrate, said method comprising:

(a) forming a mechanical structure which is a part of said micro machine;

(b) forming an interlayer dielectric layer which covers said mechanical structure, said interlayer dielectric being formed between interconnects of said semiconductor integrated circuit;

(c) forming a cavity in which said mechanical structure by forming a film having holes on said interlayer dielectric layer which covers said mechanical structure and etching said interlayer dielectric layer around said mechanical structure through said holes to form said cavity; and (d) sealing said cavity by sealing said holes,
wherein said step (a), said step (b), said step (c) and said step (d) are performed by using a technology for forming an interconnect of a MOSFET,
wherein said step (c) includes the steps of:

(c1) forming a film having first holes and a second hole larger than said first holes therein on said interlayer dielectric;

(c2) forming said cavity by etching said interlayer dielectric around said mechanical structure through said first holes and said second hole;

(c3) filling said first holes with a dielectric while keeping said second hole open; and (c4) removing said dielectric formed by said step (c3) on said mechanical structure,
wherein, in said step (d), said second hole is sealed.

5. The manufacturing method of an integrated micro electro-mechanical system according to claim 1,
wherein said micro machine is formed and stacked above a MOSFET which constitutes said semiconductor integrated circuit.

6. The manufacturing method of an integrated micro electro-mechanical system according to claim 1,
wherein said step (c) includes the steps of:

(c1) forming a film having first holes and a second hole larger than said first holes therein on said interlayer dielectric;

(c2) forming said cavity by etching said interlayer dielectric around said mechanical structure through said first holes and said second hole;

(c3) filling said first holes with a dielectric while keeping said second hole open; and (c4) removing said dielectric formed by said step (c3) on said mechanical structure,
wherein, in said step (d), said second hole is sealed.

7. The manufacturing method of an integrated micro electro-mechanical system according to claim 1,
wherein, in said step (a), said fixed part, said elastically deformable part and said moveable part are formed on an identical level and identically thick.

8. The manufacturing method of an integrated micro electro-mechanical system according to claim 1,
wherein, in said steps (b)-(d), said fixed part, said elastically deformable part and said moveable part remain on an identical level and identically thick.

9. The manufacturing method of an integrated micro electro-mechanical system according to claim 1,
wherein, in said step (a), said movable part is formed to directly connect only with said elastically deformable part to provide a free end which dangles freely in said cavity.

10. The manufacturing method of an integrated micro electro-mechanical system according to claim 1,
wherein, in said step (a), said elastically deformable part is formed narrower than said fixed part and said moveable part, and shaped spiral to position the fixed part on an edge of said mechanical structure and the moveable part at a center of said mechanical structure.

* * * * *